(12) United States Patent
Yilmaz et al.

(10) Patent No.: US 10,686,035 B2
(45) Date of Patent: *Jun. 16, 2020

(54) NANO-TUBE MOSFET TECHNOLOGY AND DEVICES

(71) Applicant: Alpha and Omega Semiconductor Incorporated, Sunnyvale, CA (US)

(72) Inventors: Hamza Yilmaz, Saratoga, CA (US); Daniel Ng, Campbell, CA (US); Lingping Guan, Santa Clara, CA (US); Anup Bhalla, Santa Clara, CA (US); Wilson Ma, Sunnyvale, CA (US); Moses Ho, Campbell, CA (US); John Chen, Los Altos Hills, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 4 days.

This patent is subject to a terminal disclaimer.

(21) Appl. No.: 16/155,066

(22) Filed: Oct. 9, 2018

(65) Prior Publication Data

US 2019/0115427 A1 Apr. 18, 2019

Related U.S. Application Data

(60) Continuation of application No. 14/702,592, filed on May 1, 2015, now Pat. No. 10,121,857, which is a
(Continued)

(51) Int. Cl.
*H01L 29/06* (2006.01)
*H01L 29/66* (2006.01)
(Continued)

(52) U.S. Cl.
CPC .... *H01L 29/0676* (2013.01); *H01L 21/30625* (2013.01); *H01L 29/0634* (2013.01);
(Continued)

(58) Field of Classification Search
CPC ......... H01L 29/78696; H01L 29/78687; H01L 29/7853–2029/7858; H01L 29/66469;
(Continued)

(56) References Cited

U.S. PATENT DOCUMENTS

| | | | |
|---|---|---|---|
| 6,621,132 B2 * | 9/2003 | Onishi | H01L 29/0634 257/409 |
| 6,982,459 B2 * | 1/2006 | Suzuki | H01L 29/0634 257/329 |

(Continued)

*Primary Examiner* — Jarrett J Stark
(74) *Attorney, Agent, or Firm* — Bo-In Lin

(57) ABSTRACT

This invention discloses a semiconductor power device disposed in a semiconductor substrate and the semiconductor substrate has a plurality of trenches. Each of the trenches is filled with a plurality of epitaxial layers of alternating conductivity types constituting nano tubes functioning as conducting channels stacked as layers extending along a sidewall direction with a "Gap Filler" layer filling a merging-gap between the nano tubes disposed substantially at a center of each of the trenches. The "Gap Filler" layer can be very lightly doped Silicon or grown and deposited dielectric layer. In an exemplary embodiment, the plurality of trenches are separated by pillar columns each having a width approximately half to one-third of a width of the trenches.

20 Claims, 54 Drawing Sheets

Related U.S. Application Data division of application No. 13/594,837, filed on Aug. 26, 2012, now Pat. No. 9,024,375, which is a continuation of application No. 13/065,880, filed on Mar. 31, 2011, now Pat. No. 8,263,482, which is a continuation of application No. 12/319,164, filed on Dec. 31, 2008, now Pat. No. 7,943,989.

(51) Int. Cl.

| | |
|---|---|
| *H01L 29/08* | (2006.01) |
| *H01L 29/737* | (2006.01) |
| *H01L 29/808* | (2006.01) |
| *H01L 29/861* | (2006.01) |
| *H01L 29/872* | (2006.01) |
| *H01L 29/739* | (2006.01) |
| *H01L 21/306* | (2006.01) |
| *H01L 29/10* | (2006.01) |
| *H01L 29/78* | (2006.01) |

(52) U.S. Cl.
CPC ...... *H01L 29/0649* (2013.01); *H01L 29/0696* (2013.01); *H01L 29/0821* (2013.01); *H01L 29/0865* (2013.01); *H01L 29/0878* (2013.01); *H01L 29/0882* (2013.01); *H01L 29/1095* (2013.01); *H01L 29/66712* (2013.01); *H01L 29/66734* (2013.01); *H01L 29/7371* (2013.01); *H01L 29/7395* (2013.01); *H01L 29/7397* (2013.01); *H01L 29/8083* (2013.01); *H01L 29/861* (2013.01); *H01L 29/872* (2013.01); *H01L 29/66893* (2013.01); *H01L 29/7802* (2013.01); *H01L 29/7811* (2013.01); *H01L 29/7813* (2013.01)

(58) Field of Classification Search
CPC ..... H01L 29/66439; H01L 2924/13061; H01L 29/0665; H01L 29/0669–068; H01L 21/823412; H01L 21/823807; H01L 21/823885; H01L 21/823487; H01L 29/7827; H01L 27/2454; Y10S 977/938
See application file for complete search history.

(56) References Cited

U.S. PATENT DOCUMENTS

| | | | | |
|---|---|---|---|---|
| 7,345,296 | B2* | 3/2008 | Tombler, Jr. | B82Y 10/00 257/142 |
| 7,892,924 | B1* | 2/2011 | Lee | H01L 29/0634 438/268 |
| 2004/0142501 | A1* | 7/2004 | Nakai | H01L 27/14625 438/22 |
| 2007/0134474 | A1* | 6/2007 | Ahn | G02B 5/22 428/212 |
| 2008/0048280 | A1* | 2/2008 | Tsukamoto | H01L 27/1462 257/432 |
| 2008/0050877 | A1* | 2/2008 | de Fresart | H01L 29/0634 438/270 |
| 2008/0225142 | A1* | 9/2008 | Goto | H01L 27/14621 348/272 |
| 2009/0079002 | A1* | 3/2009 | Lee | H01L 29/0634 257/355 |
| 2009/0085149 | A1* | 4/2009 | Ishida | H01L 21/02381 257/499 |
| 2010/0006927 | A1* | 1/2010 | Kocon | H01L 29/0634 257/328 |
| 2010/0163846 | A1* | 7/2010 | Yilmaz | H01L 29/7827 257/24 |
| 2010/0176280 | A1* | 7/2010 | Yokogawa | G02B 5/201 250/226 |

\* cited by examiner

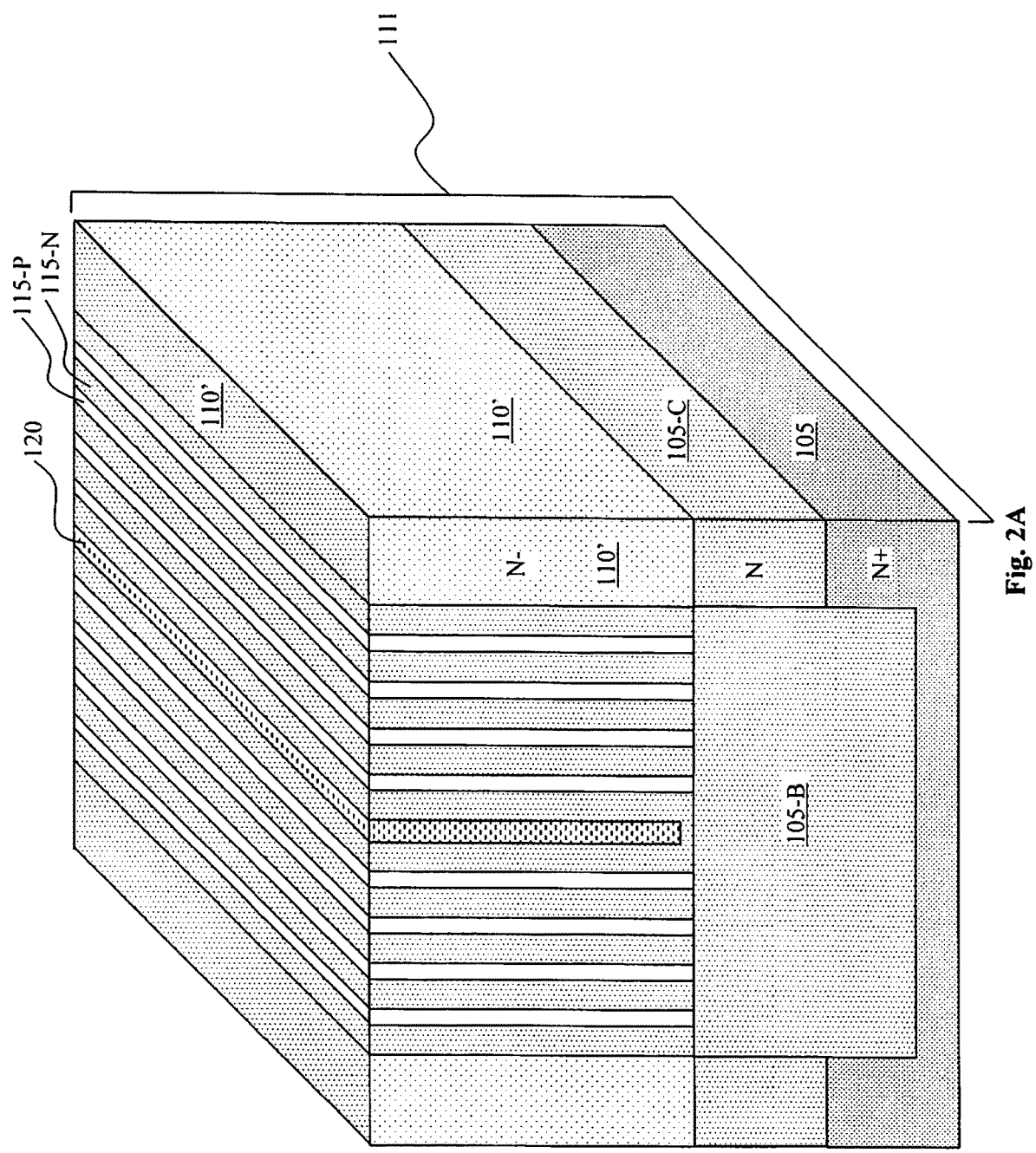

NANO-TUBE MOSFET TECHNOLOGY AND DEVICES

This patent application is a Continuation application of a co-pending application Ser. No. 14/702,592 filed on May 1, 2015 and application Ser. No. 14/702,592 is a Divisional application of a another application Ser. No. 13/594,837 filed on Aug. 26, 2012 now issued into U.S. Pat. No. 9,024,315 on May 5, 2015. Application Ser. No. 13/594,837 is a Continuation application of another application Ser. No. 13/065,880 filed on Mar. 31, 2011 now issued into U.S. Pat. No. 8,263,482 on Sep. 11, 2012. Application Ser. No. 13/065,880 is a Divisional application of another application Ser. No. 12/319,164 filed on Dec. 31, 2008 now issued into U.S. Pat. No. 7,943,989 on May 17, 2011.

BACKGROUND OF THE INVENTION

1. Field of the Invention

The invention relates generally to the semiconductor power devices. More particularly, this invention relates to configurations and methods implemented with alternating doped nano-tubes for manufacturing flexibly scalable charge balanced semiconductor power devices with simple manufacturing processes with improved breakdown voltage and significantly reduced resistance.

2. Description of the Prior Art

Semiconductor devices including metal oxide semiconductor field effect transistor (MOSFET) devices configured with vertical super junction structure and electrical characteristics are known and have been disclosed in many patented disclosures. The patented disclosures include U.S. Pat. Nos. 5,438,215, 5,216,275, 4,754,310, 6,828,631. Fujihira further discloses configurations of the vertical super junction devices in the publication "Theory of Semiconductor Super Junction Devices" (Japan Journal of Applied Physics Vol. 36, October 1979 PP 238-241). Specifically, FIG. 1C shows a vertical trench MOSFET super junction device published by Fujihira (FIG. 2A in Fujihira's paper). Fujihira also disclosed in U.S. Pat. No. 6,097,063 a vertical semiconductor device has a drift region in which a drift current flows if it is in the ON mode and which is depleted if it is in the OFF mode. The drift region is formed as a structure having a plurality of first conductive type divided drift regions and a plurality of second conductive type compartment regions in which each of the compartment regions is positioned among the adjacent drift regions in parallel to make p-n junctions, respectively. In U.S. Pat. No. 6,608,350 discloses a vertical super junction device implemented with layers of a dielectric material to fill in the trenches. However, as further discussed below, the configurations and operational characteristics of these super junction devices as disclosed still encounter technical limitations thus restricting the practical usefulness of these devices.

Specifically, conventional manufacturing technologies and device configuration to further increase the breakdown voltage with reduced series resistance, including the devices implemented with super junction structures, are still confronted with manufacturability difficulties. The practical applications and usefulness of the high voltage semiconductor power devices are limited due to the facts that the conventional high power devices generally have structural features that require numerous time-consuming, complex, and expensive manufacturing processes. More particularly, some of the processes for manufacturing the high voltage power devices are complicated thus having low throughput and low yields.

In comparison to conventional technologies, the super-junction technologies have advantages to achieve higher breakdown voltage (BV) without unduly increasing the drain-to-source resistance, Rdson. For standard power transistor cells, breakdown voltage is supported largely on the low-doped drift layer. Therefore, the drift layer is made with greater thickness and with relatively low doping concentration to achieve higher voltage ratings. However this also has the effect of greatly increasing the Rdson resistance. In the conventional power devices, the resistance Rdson has approximately a functional relationship represented by:

Rdson $\alpha$ $BV^{2.5}$

In contrast, a device having a super-junction configuration is implemented with a charge balanced drift region. The resistance Rdson has a more favorable functional relationship with the breakdown voltage. The functional relationship can be represented as:

Rdson $\alpha$ BV

For high voltage applications, it is therefore desirable to improve the device performance by designing and manufacturing the semiconductor power devices with super-junction configurations for reducing the resistance Rdson while achieving high breakdown voltage. Regions adjacent to the channel within the drift region are formed with an opposite conductivity type. The drift region may be relatively highly doped, so long as the regions adjacent to the channel are similarly doped but of an opposite conductivity type. During the off state, the charges of the two regions balance out such that the drift region becomes depleted, and can support a high voltage. This is referred to as the super-junction effect. During the on state, the drift region has a lower resistance Rdson because of a higher doping concentration. Studies have shown that a dopant concentration of $1E12/cm^2$ is optimal for the drift region of a super junction device.

However, conventional super-junction technologies still have technical limitations and difficulties when implemented to manufacture the power devices. Furthermore, the manufacturing processes often require equipment not compatible with standard foundry processes. Additionally, these devices have structural features and manufacturing processes not conducive to scalability for low to high voltage applications. In other words, some approaches would become too costly and/or too lengthy to be applied to higher voltage ratings. Also in the prior art devices, it is difficult to manufacture thin vertical channels for the superjunction regions. As will be further reviewed and discussions below, these conventional devices with different structural features and manufactured by various processing methods, each has limitations and difficulties that hinder practical applications of these devices as now demanded in the marketplace.

There are three basic types of semiconductor power device structures for high voltage applications. The first type includes those device formed with standard structures as depicted in FIG. 1A for a standard VDMOS that do not incorporate the functional feature of charge balance. For this reason, there is no breakdown voltage enhancement beyond the one-dimensional theoretical figure of merit, i.e., the Johnson limit, according to the I-V performance measurements and further confirmed by simulation analyses of this type of devices. The devices with this structure generally have relatively high on-resistance due to the low drain drift region doping concentration in order to satisfy the high breakdown voltage requirement. In order to reduce the on resistance Rdson, this type of devices generally requires large die size. Despite the advantages that the devices can be manufactured with simple processes and low manufacturing cost, these devices are however not feasible for high current low resistance applications in the standard packages due the above discussed drawbacks: the die cost becomes prohibitive (because there are too few dies per wafer) and it becomes impossible to fit the larger die in the standard accepted packages.

The second type of devices includes structures provided with two-dimensional charge balance to achieve a breakdown voltage higher than the Johnson limit for a given resistance, or a lower specific resistance (Rdson*Area product) than the Johnson limit for a given breakdown voltage. This type of device structure is generally referred to as devices implemented with the super junction technology. In the super junction structure, a charge-balance along a direction parallel to the current flow in the drift drain region of a vertical device, based on PN junctions or by field plate techniques as that implemented in oxide bypassed devices to enable a device to achieve a higher breakdown voltage. The third type of structure involves a three-dimensional charge-balance where the coupling is both in the lateral as well as the vertical directions. Since the purpose of this invention is to improve the structural configurations and manufacturing processes of devices implemented with super junction technologies to achieve two-dimensional charge balance, the limitations and difficulties of devices with super junction will be reviewed and discussed below.

FIG. 1B is a cross sectional view of a device with super junction to reduce the specific resistance (Rsp, resistance times active area) of the device by increasing the drain dopant concentration in the drift region while maintaining the specified breakdown voltage. The charge balance is achieved by providing P-type vertical columns formed in the drain to result in lateral and complete depletion of the drain at high voltage to thus pinch off and shield the channel from the high voltage drain at the N+ substrate. Such technologies have been disclosed in Europe Patent 0053854 (1982), U.S. Pat. No. 4,754,310, specifically in FIG. 13 of that patent and U.S. Pat. No. 5,216,275. In these previous disclosures, the vertical super junctions are formed as vertical columns of N and P type dopant. In vertical DMOS devices, the vertical charge balance is achieved by a structure with sidewall doping to form one of the doped columns as were illustrated in drawings. In addition to doped columns, doped floating islands have been implemented to increase the breakdown voltage or to reduce the resistance as disclosed by U.S. Pat. Nos. 4,134,123 and 6,037,632. Such device structure of super junction still relies on the depletion of the P-regions to shield the gate/channel from the drain. The floating island structure is limited by the technical difficulties due to charge storage and switching issues. It is difficult to form vertical columns of alternating conductivity types, particularly when the columns are deep and/or when the widths of the columns are small. For super junction types of devices, the manufacturing methods are generally very complex, expensive and require long processing time due to the facts that the methods require multiple steps and several of these steps are slow and have a low throughput.

Additionally, for vertical super-junction devices (VSJD), the manufacturing processes either have difficulties in etching or filling the trenches. Major problems include the requirement to filling the trenches with epitaxial (epi) layers without void at the interface of the epitaxial layers covering the sidewalls are merged at the center of the trench. FIG. 1D (FIG. 1 of U.S. Pat. No. 6,608,350) shows the gap filling difficulties when the sidewalls are substantially 90 degrees with voids formed when filling up the gaps (FIG. 1D). Furthermore, the charge balance and the breakdown voltage are very sensitive to the sidewall angles of the trenches. Furthermore, the device performance is degraded with the wider P and N columns due to multiple epitaxial and boron implants according to the processes of the conventional methods. These manufacturing processes also increase the production costs. For these reasons, the conventional structures and manufacture methods are limited by slow and expensive manufacturing processes and are not economical for broad applications.

Therefore, a need still exists in the art of power semiconductor device design and manufacture to provide new device configurations and manufacturing method in forming the power devices such that the above discussed problems and limitations can be resolved.

SUMMARY OF THE PRESENT INVENTION

It is therefore an aspect of the present invention to provide a new and improved device structure and manufacturing method to form the doped columns in the drift regions for charge balance with simple and convenient processing steps. The simplified processes are achieved through stacking multiple epitaxial layers formed as nano-tubes by etching trenches with larger openings that is about five to ten microns or more surrounding pillar columns of about three to five microns. Epitaxial layers with varying thicknesses ranging from a few microns to less than one micron are grown with alternating N and P type dopants constituting nano tubes to fill the trenches with a central gap less than a width set for a particular filling process (about a micron or less for most cases). Then the central gap can be filled with a gap filling layer which may be insulating such as thermally grown oxide, deposited oxide, deposited dielectric material or intrinsically grown or deposited silicon (grown silicon is preferred over deposited silicon). The gap-filling dielectric layer may be implemented with a very lightly doped or undoped dielectric layer. By way of example the gap fill may have a dopant concentration equal to or less than 10% of a dopant concentration of adjacent nano tubes. The remaining gap may be filled as center nano tube, but this may be very difficult to accurately manufacture, and may throw off the charge balance. Therefore, it is desirable to implement a gap fill that is much more feasible. The manufacturing processes are simplified and can be conveniently carried out with mostly standard fabrication processes using standard processing modules and equipment. Therefore, the above discussed technical difficulties and limitations can be resolved.

Specifically, it is an aspect of the present invention to provide a new and improved device structure and manufacturing method to form a plurality of nano tubes of alternating conductivity types in a substantially vertical trench with the original epitaxial layer doped before the trench etch and epitaxial filling. The nano tubes and the columns are formed with adjustment to the doping concentration to achieve charge balance. The multiple nano tubes have doping concentrations of about $2E12/cm^2$ (which may be treated as two halves each having $1E12/cm^2$) per nano tube for optimized charge balance. The multiple nano tubes act as channels (N-type doped nano tubes as conducting channels for N-type devices) in a small area enables construction of low Rds semiconductor power devices.

It is another aspect of the present invention to provide a new and improved device structure and manufacturing method to form a plurality of nano tubes of alternating conductivity types in a vertical trench with the nano tubes having a thickness of about less than one micron to a few microns. By way of example, every trench can accommodate five to twenty conducting channels (nano tubes). In comparison to the conventional configuration of one conducting channel super-junction power device, the nano-tube configuration of this invention can achieve five to ten times resistance reduction than a conventional super junction device.

It is another aspect of the present invention to provide new and improved device structure and manufacturing method to form a plurality of nano tubes of alternating conductivity types in a vertical trench by etching the trenches with sidewalls having a relatively large tilt angle (tilt angle is defined with respect to a vertical line). Usual tilt angle of a Silicon trench is about 1 Degree (89 Degrees if measured with respect to the plane of the bottom of the trench). By way of example, the tilt angle can be between 5 and 1 Degrees without significant performance penalty to power semiconductor device performance.

The trench width can be increased from the bottom of the trench towards the surface; could have multiple trench widths (variation of Trench step widths is from 0.5 to 2 microns steps) thus pillars with different widths can be implemented to make filling easier.

A large tilt angle is allowable because the charge balance can be flexibly adjusted by using very lightly doped starting material to etch large trenches to form pillars (columns) and adjusting the doping concentration of the nano tubes whereby a strict angular requirement of the trench sidewalls is no longer necessary. Since the pillars are lightly doped and only contribute a small amount to charge balance, the varying widths of the pillars will not greatly affect the charge balance. Also because the tubes are grown, the thickness of each tube will remain uniform, regardless of the tilt angle. Therefore, a more conveniently and more economical manufacturing process can be implemented.

It is another aspect of the present invention to provide new and improved device structure and manufacturing method to form a plurality of nano tubes of alternating conductivity types in a vertical trench to function as conducting channels thus achieve charge balance. The basic super junction structure as disclosed can be implemented to manufacture many different types of vertical devices including but not limited to devices such as MOSFET, bipolar junction transistor (BJT), diodes, junction field effect transistor (JFET), insulated-gate bipolar transistor (IGBT), etc.

Briefly in a preferred embodiment this invention discloses a semiconductor power device disposed in a semiconductor substrate and the semiconductor substrate has a plurality of trenches. Each of the trenches is filled with a plurality of epitaxial layers of alternating conductivity types constituting nano tubes functioning as conducting channels stacked as layers extending along a sidewall direction with an insulating layer filling a merging-gap in each of the trenches. In an exemplary embodiment, the plurality of trenches merging-gap between the nano tubes is disposed substantially at a center of trenches which are separated by pillar columns each having a width approximately half to one-third of a width of the trenches.

In another exemplary embodiment, the plurality of trenches each having a width of about ten microns and separated by a pillar column from adjacent trenches having a width substantially ranging between three to five microns. In another exemplary embodiment, the plurality of trenches each having a width of about ten microns and filled with a plurality of epitaxial layers of alternating conductivity types constituting nano tubes having a layer thickness substantially ranging between about 0.2 to 2 microns. In another exemplary embodiment, the semiconductor pillar region having a depth ranging from 10 to 120 micrometers and the plurality of trenches each having a depth of about 5 to 120 micrometers. By way of example, a ten micron depth might be used to support about a 100 volt (V) device, whereas a 120 micron depth might be used to support a 1200 V device.

In another exemplary embodiment, the semiconductor substrate comprises an N+ substrate and a bottom region below the nano tubes and pillars comprising N+ nano tube merger regions merging together the bottoms of the nano tubes and connecting them to a bottom substrate region. By way of example, the nano tube merger regions may be N+ bottom diffusion regions formed by diffusion from the bottom substrate region, or they may be formed by a top implantation (midway through the growing of the nano tubes) or as a backside implantation after a backside grinding as later described. In another exemplary embodiment, the plurality of trenches having sidewalls formed with a slightly tilted angle relative to a perpendicular direction to a top surface of the semiconductor substrate. In another exemplary embodiment, the semiconductor substrate comprising an N+ substrate with a P-type epitaxial layer supported on the N+ substrate for opening the plurality of trenches therein.

This invention further discloses a method for forming a semiconductor power device on an N++ semiconductor substrate with lightly doped and thick N- or P-epi layer. The method includes a step of opening a plurality of deep trenches between lightly doped pillars and substantially filling the deep trench with alternating N and P doped multiple epitaxial layers overflowing and covering a top surface of the semiconductor substrate with a top epitaxial layer. The remaining gap is fully filled by very lightly doped silicon layer or thermally grown oxide or deposited dielectric layer. This method includes removal of epitaxial layers down to original Pillar surface by CMP (Chemical Mechanical Polishing) method. After CMP, N layer formed with thickness from 1-2 microns range by ion implantation or epi growth.

This invention further discloses an alternative method for forming a semiconductor power device on a lightly doped single crystal substrate (without an initial epitaxial layer). Trenches and nano tubes are formed on the single crystal substrate as described above, however, the back of substrate is then ground off up to the nano tubes, and then a highly doped bottom substrate is either implanted or grown on the back side.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIG. 2-1 shows a cross section for a device with multiple unit cells 101 of FIG. 2 repeated one next to another throughout the semiconductor die.

FIG. 2-2 shows a perspective view of a unit cell 101 of FIG. 2 without the P-implant top layer 130.

FIG. 2A-1 is a cross section view of the device of FIG. 2A for showing the conductivity types and the dopant concentrations.

FIG. 2A-2 is a cross section view of an alternative embodiment of the invention with a center nano tube rather than an insulating gap fill.

FIG. 2E-1 shows the same embodiment as FIG. 2E, except with the Schottky metal removed to show the underlying structures.

FIG. 2E-2 is the same as FIG. 2E-1, except that layer 120 in FIG. 2E-2 is made from an oxide, rather than lowly doped (intrinsic) silicon.

FIG. 2F-1 shows a similar IGBT device as FIG. 2F but one with trench gates.

FIG. 2G shows a junction field effect transistor (JFET) as it would appear on the plane 111 of FIG. 2A, wherein the device further includes P type gate region, N+ source contact region, and N− region to form a JFET device.

FIG. 2H shows a bipolar junction transistor (BJT) wherein the device further includes an N+ emitter region and a P-type base region to form a BJT device with the substrate functions as the collector.

FIG. 4A-1 shows a top view of the layout of semiconductor device 300 of this invention.

FIG. 9B-1 is a top view for showing a first termination ring of the termination area of a semiconductor device.

9B is a top view for showing an alternative, staggered rectangular shape for the unit cells.

Figure 9A:
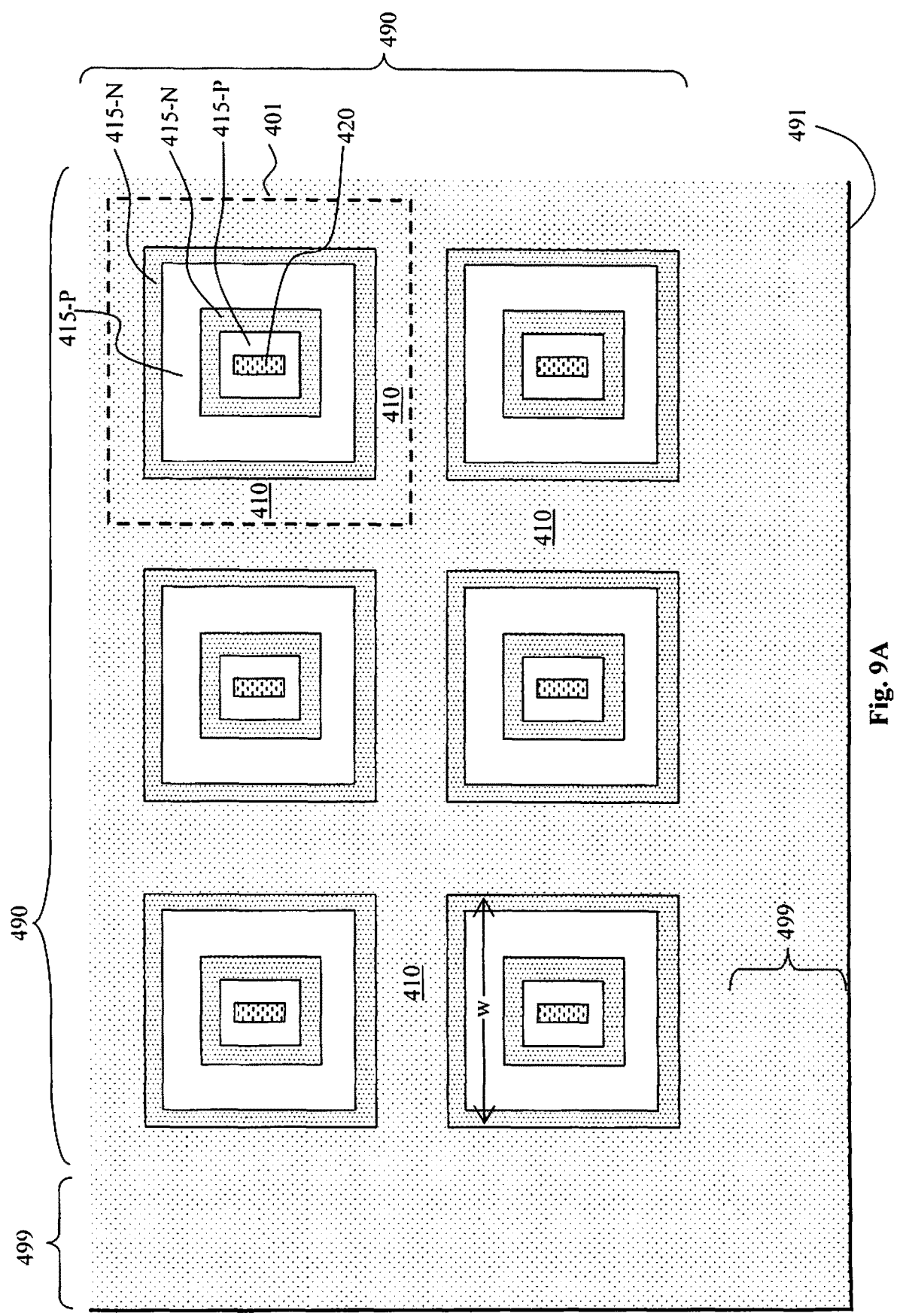
FIG. 9A is a top view for showing the closed cell configuration that includes a plurality of the nano tube unit cells in an active area disposed substantially in the middle portion of a semiconductor substrate.
Figure 9B:
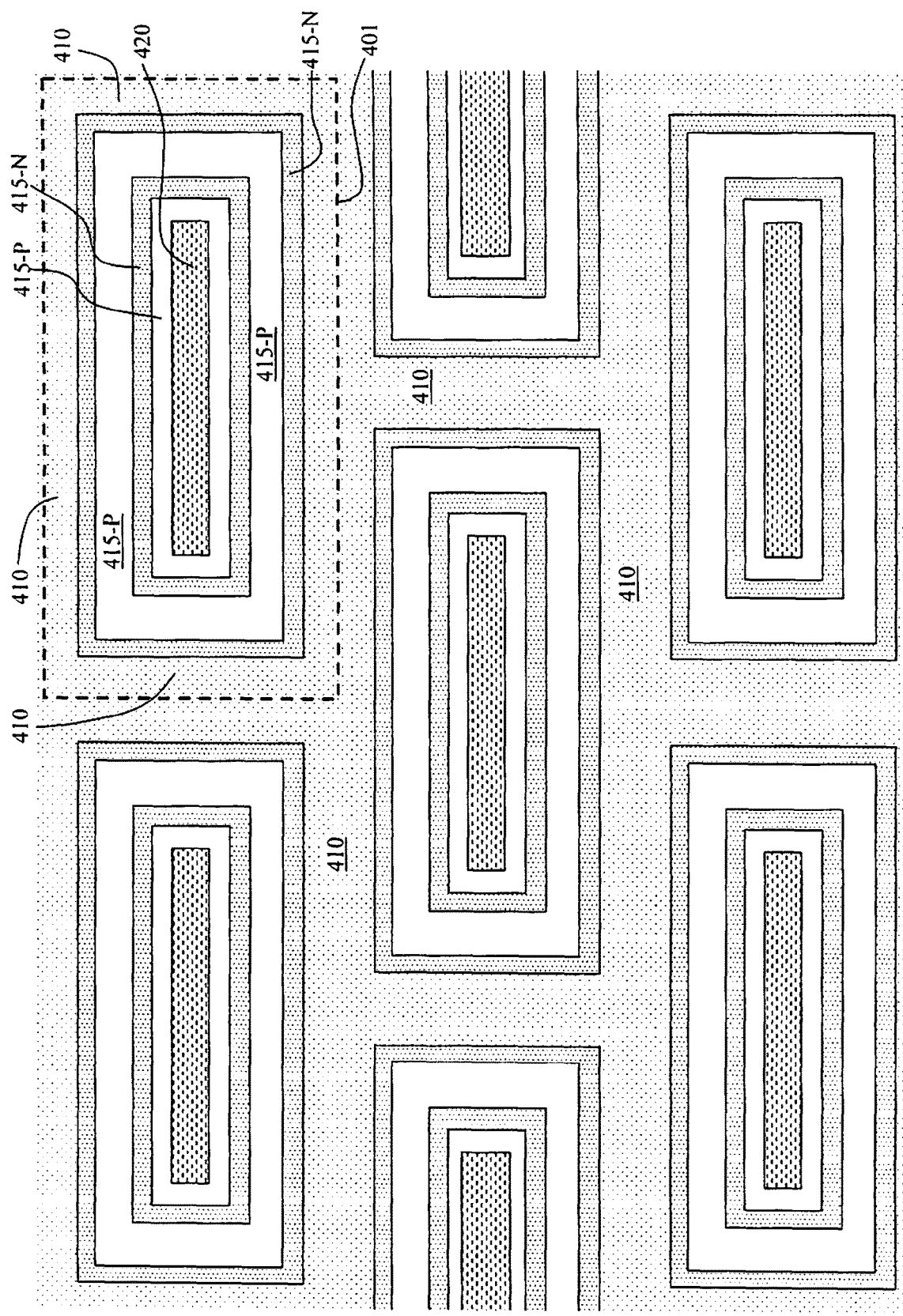
Figures 1, 9B:
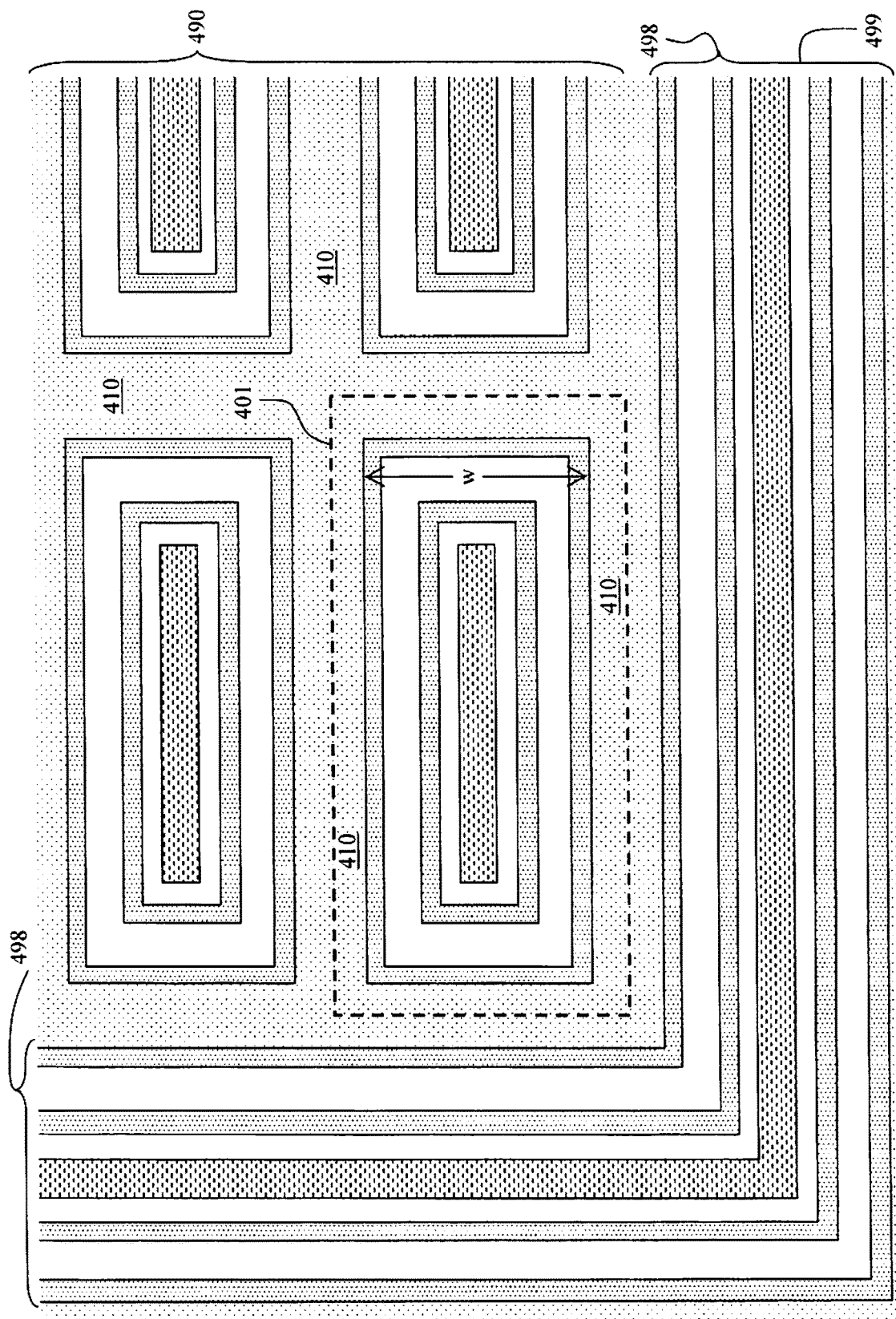
Figure 9C:
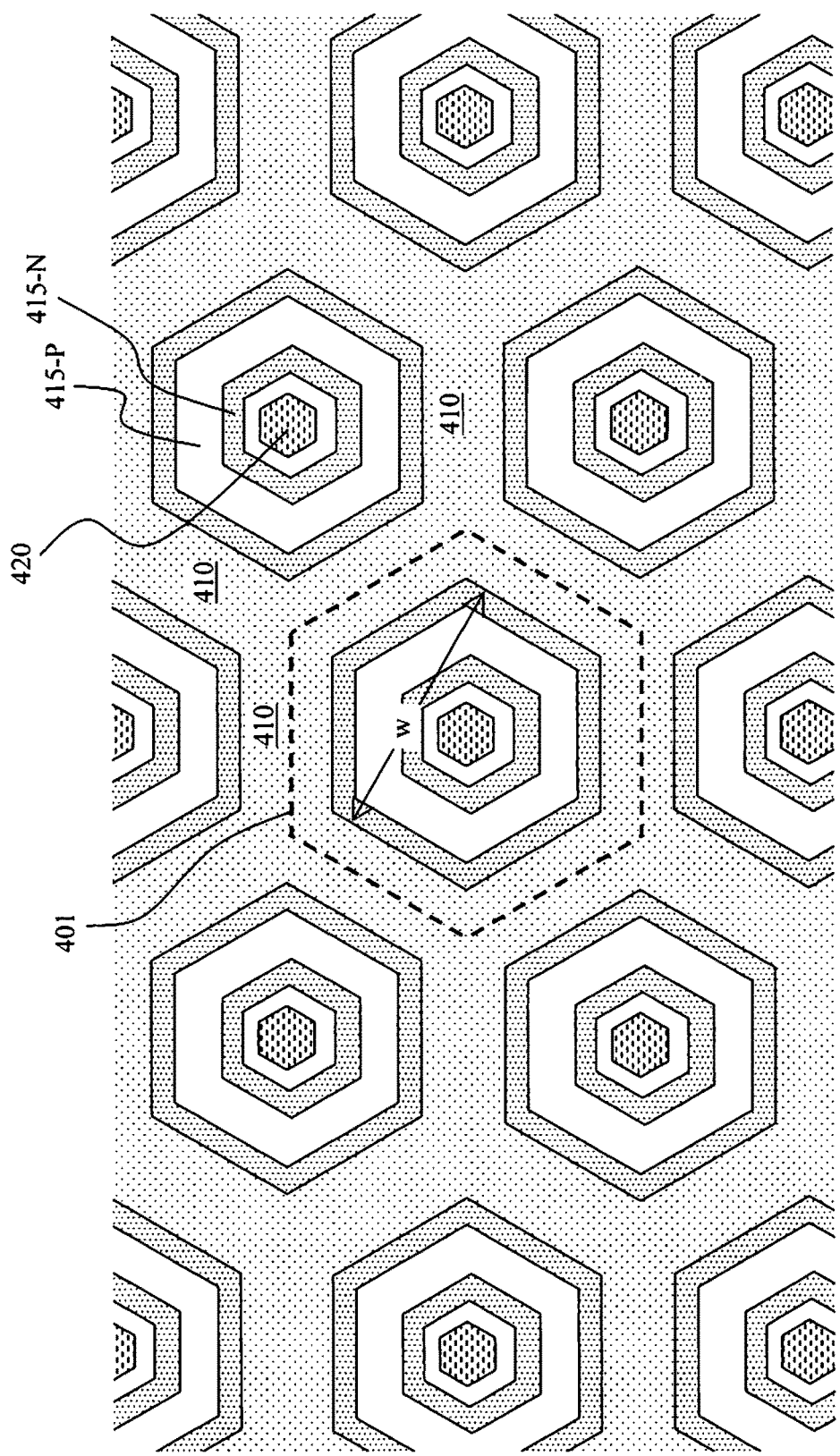

FIG. 9C is a top view for showing an alternative, hexagonal shape for the unit cells.

DETAILED DESCRIPTION OF THE METHOD

Figure 1B:
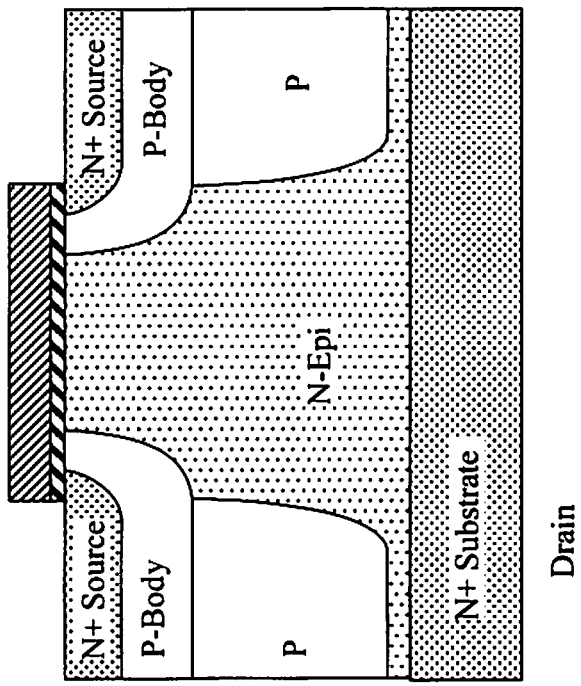
FIGS. 1A to 1D are cross sectional views for showing conventional vertical power device configurations.
Figure 1A:
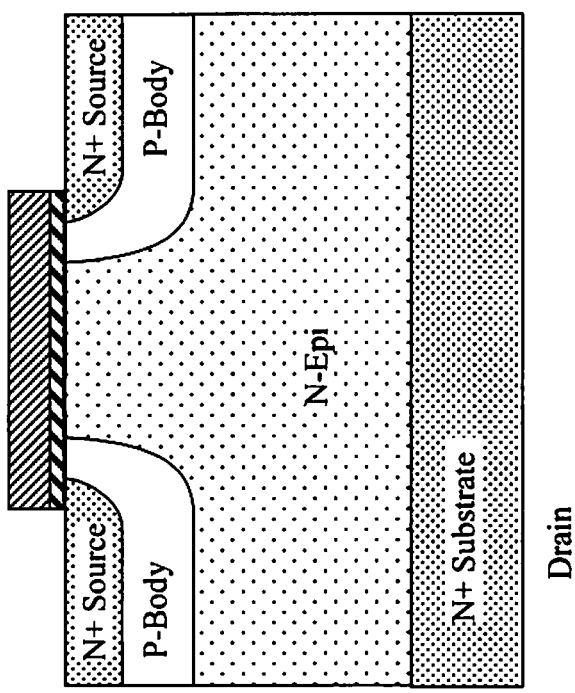
Figure 1D:
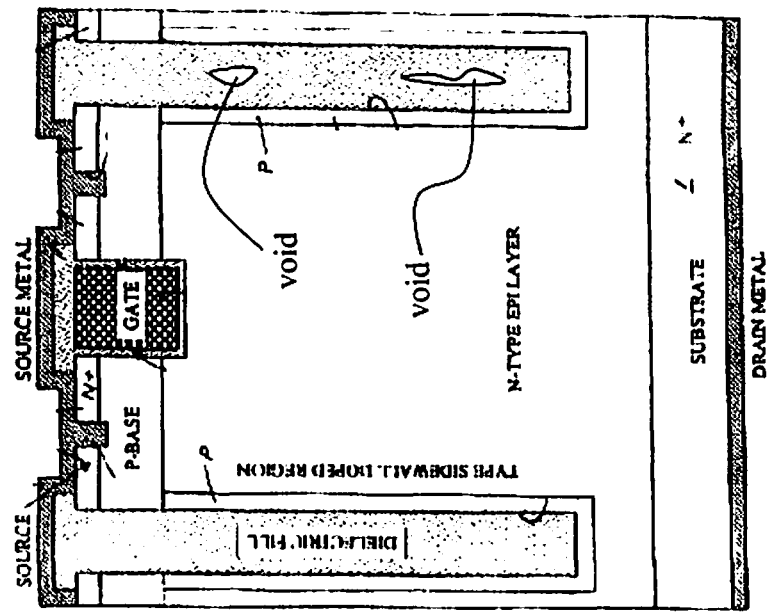
Figure 1C:
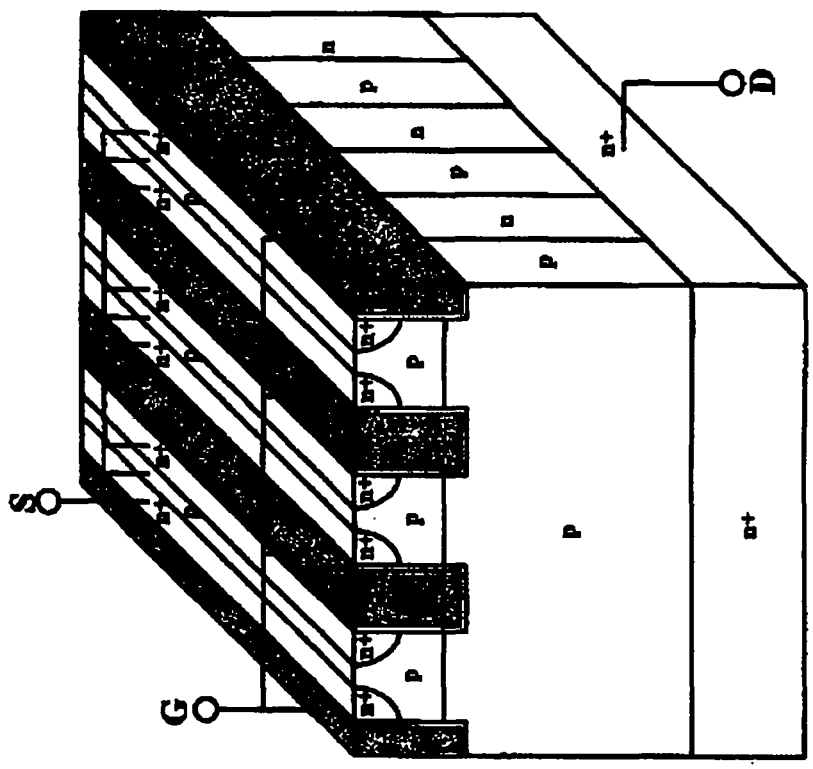
Figure 2:
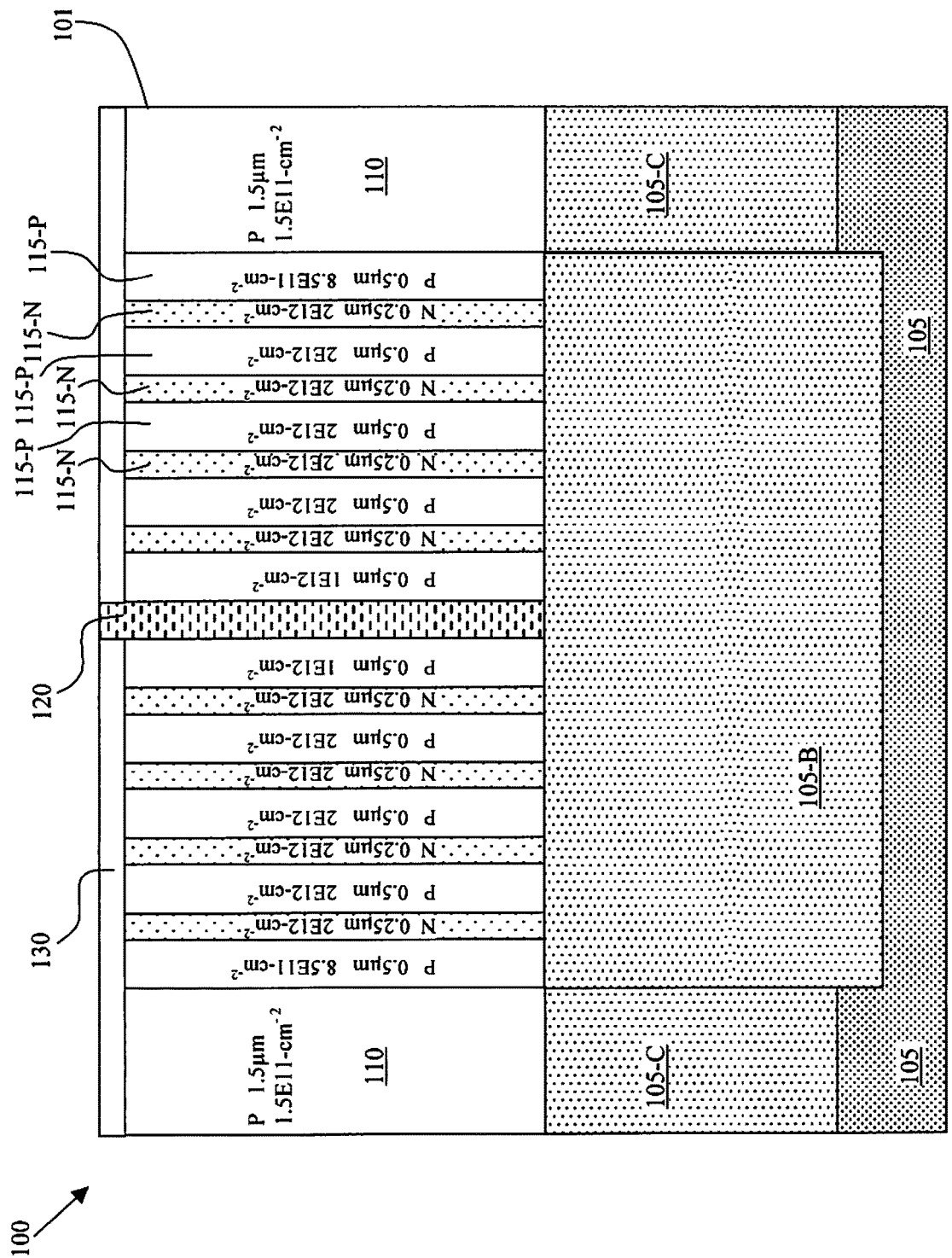
FIG. 2 is cross sectional view of high voltage power devices with super junction structure formed with nano tubes in trenches as an exemplary embodiment of this invention.

Referring to FIG. 2 for a cross sectional view of a unit cell 101 of a vertical nano-tube high-voltage (HV) diode device 100 that illustrates the new concepts including the new structural and manufacturing features of this invention. The HV diode device 100 is supported on a heavily doped N type bottom substrate 105, e.g., an N+ red phosphorous substrate, which lies below an N+, nano tube merger region 105-B which may be a diffusion bottom region 105-B and an N+ column diffusion region 105-C, which may be formed by a diffusion process as will be described below. The HV device further includes a plurality of N-type nano tubes and P-type nano tubes formed as N-type thin epitaxial layers 115-N and P-type thin epitaxial layers 115-P. These nano-tubes are formed as alternating N-epitaxial layers 115-N and P-epitaxial layers 115-P between two P-type pillars 110 as vertical nano-tubes extended from a P-implant top-layer 130 to the bottom N+ region 105-B. The HV nano-tube diode device 100 further includes a gap filler 120—a very lightly doped silicon or an oxide (or other dielectric) region—formed substantially in the center of each unit cell 101, in the middle of the nano tubes. The nano tubes are formed in the top of the semiconductor substrate. The semiconductor substrate may further include a lightly doped epitaxial layer from which the pillars 110 are formed. Alternatively, the pillars 110 be formed of a lightly doped single crystal substrate without an initial epitaxial layer, as is later disclosed.

Figures 1, 2:
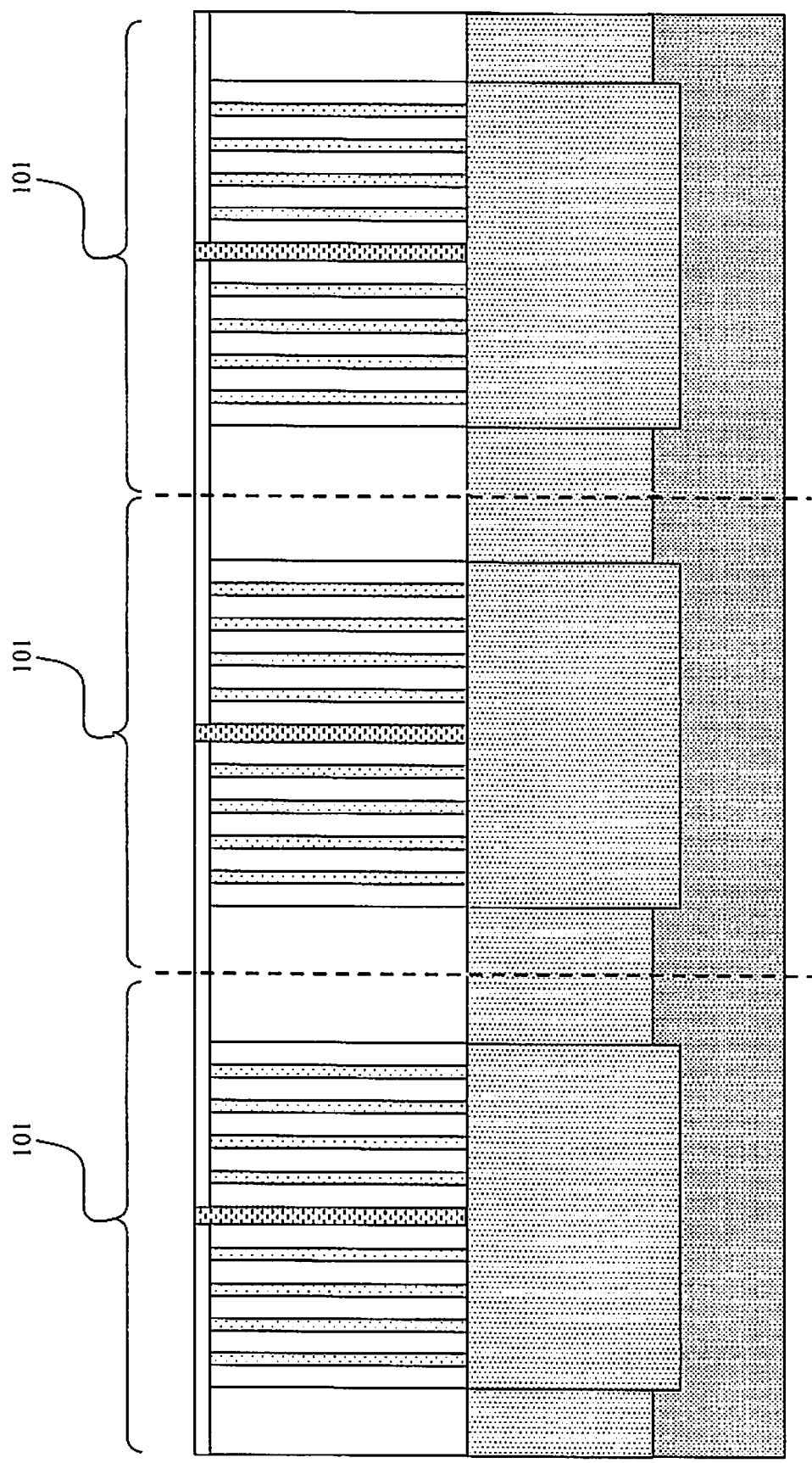
Figure 2:
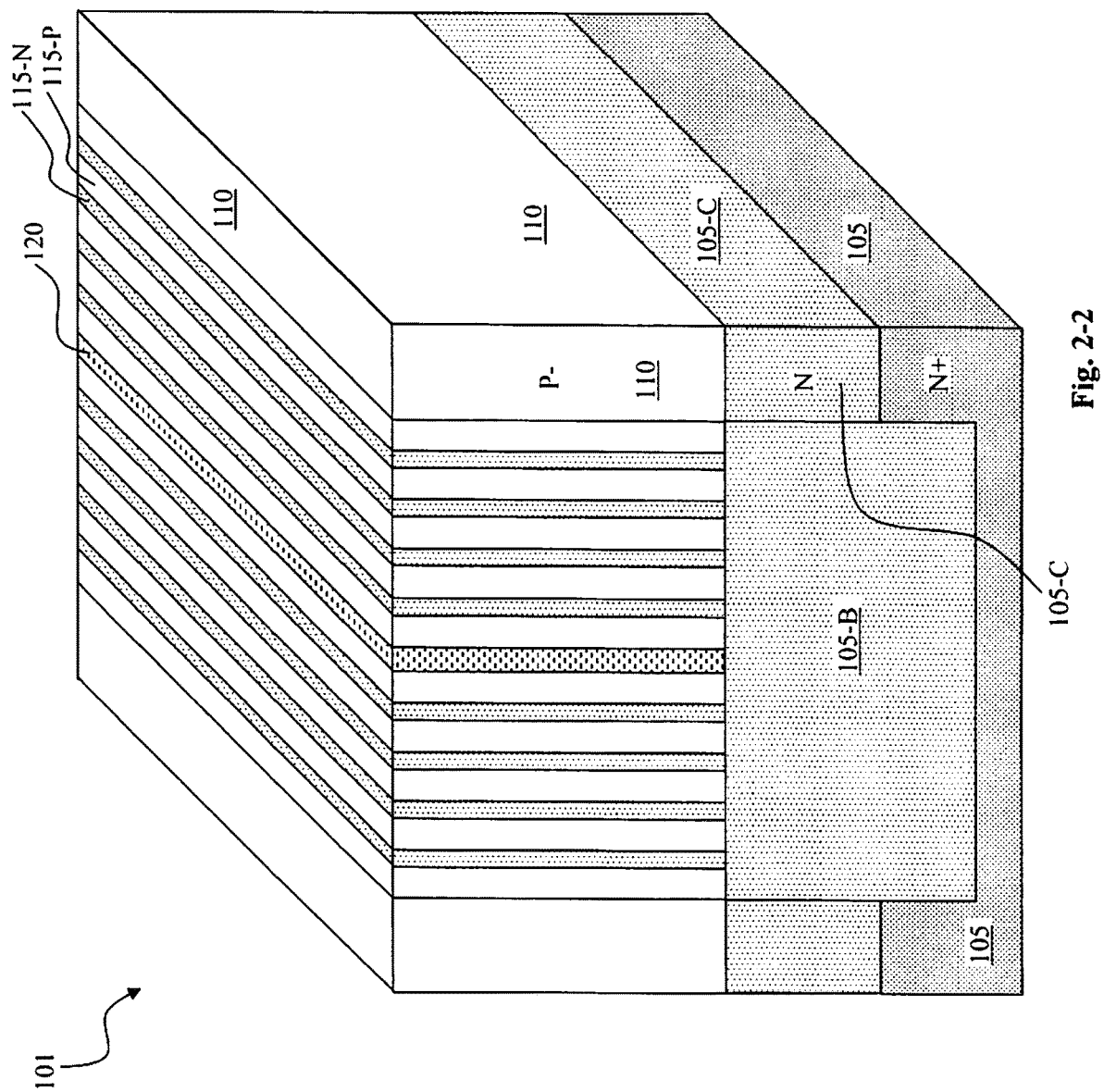
Figures 1, 2A:
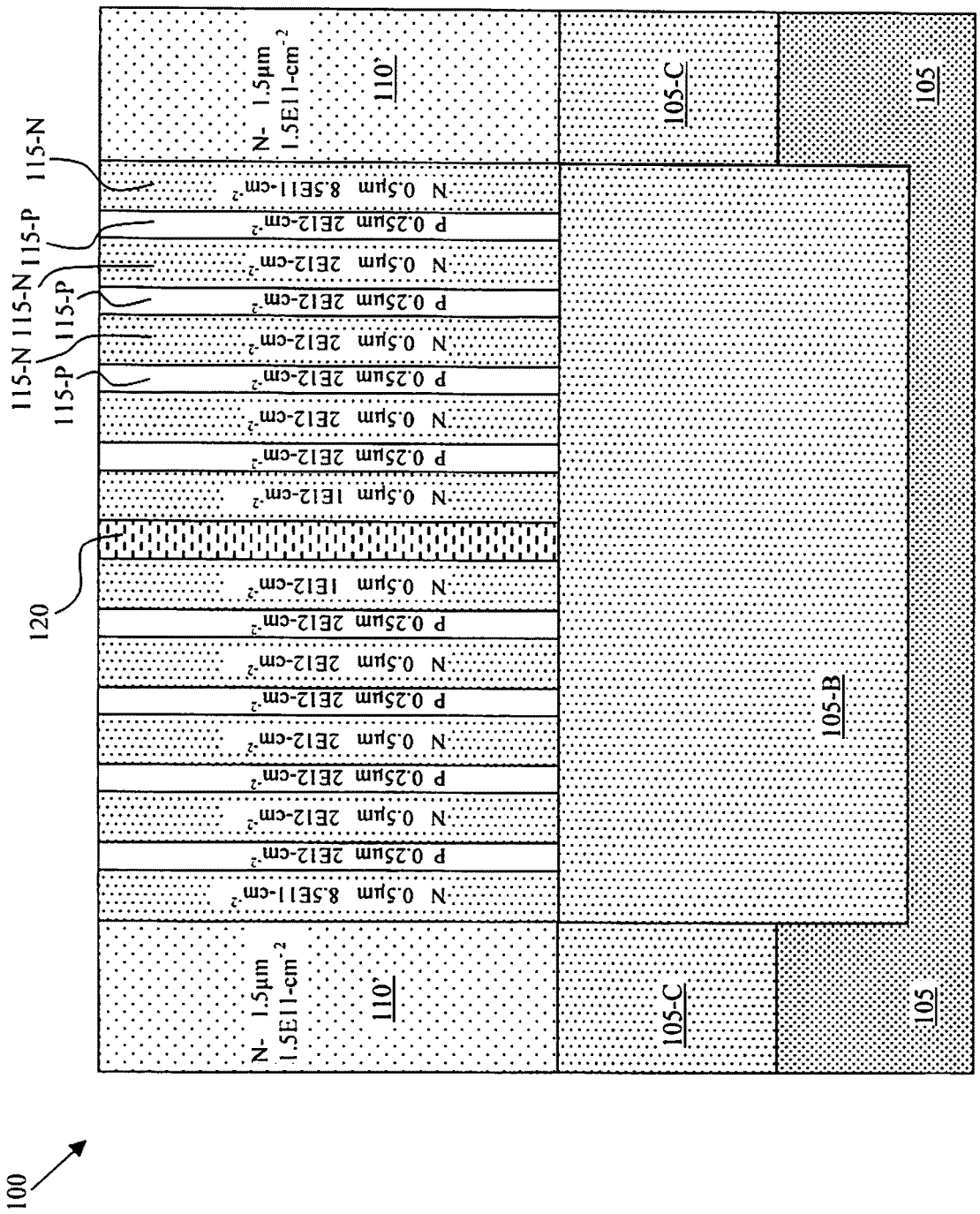
Figures 2, 2A:
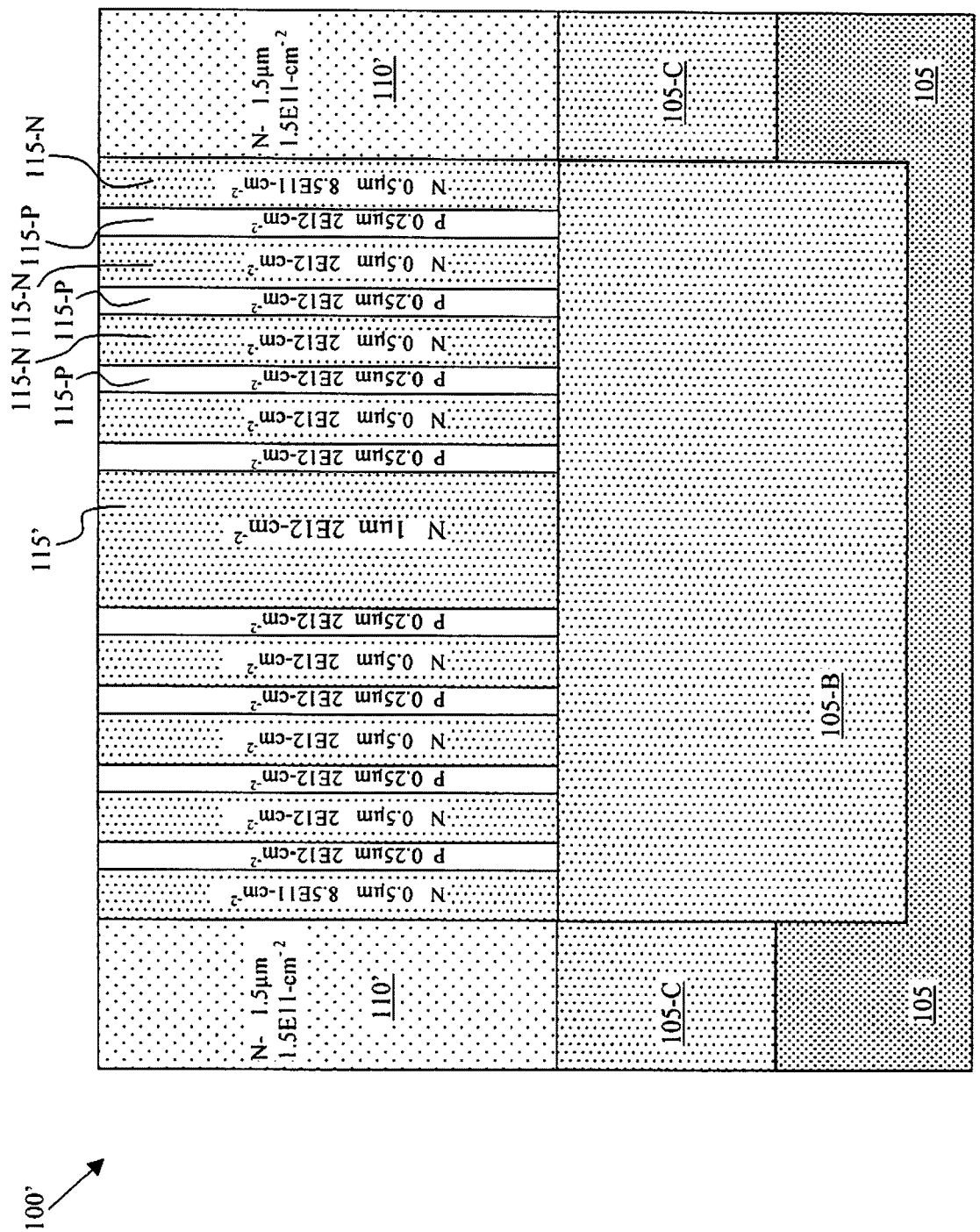
FIG. 2A shows a perspective view of a unit cell 101 similar to FIG. 2-2 without the P-implant top layer 130 and with N-type pillars 110'.

In an exemplary embodiment, each of the N-type nano tubes has a width of about 0.25 microns and dopant concentration of about $2E12/cm^2$ (for a per volume concentration of $8E16/cm^3$) and most of the P-type nano tubes have a width of about 0.5 microns with a dopant concentration of about $2E12/cm^2$. However, the P-type nano-tube nearest the gap filler 120 has a dopant concentration of about $1E12/cm^2$. The P-type nano tube nearest to the P-type pillars 110 has a width of about 0.5 microns and a dopant concentration of about $8.5E11/cm^2$. The surrounding P-type pillars 110 have a width of about 1.5 microns and a dopant concentration of about $1.5E11/cm^2$ (between $2E14/cm^3$ to $1E15/cm^3$ as a per volume concentration). In this way P-type pillar 110 and the P-type tube closest to the P-type pillar 110 sum up for a combined dopant concentration of $1E12/cm^2$. Each of the P-type nano tubes and N-type nanotubes with a dopant concentration of $2E12/cm^2$ may be considered and conceptualized as two adjacent halves, each half having a dopant concentration of $1E12/cm^2$ to form a combined charge-balanced nano tube by integrating two surrounding nano tubes with complementary opposite and equal charges. With the exemplary dopant concentrations as described, the nanotubes of opposite electrical conductivities are charge balanced with each other and further with the P-type columns 110, and achieve a super junction effect. Only a single unit cell 101 is shown in FIG. 2. FIG. 2-1 shows a cross section for a HV diode device 100 with multiple unit cells 101 repeated one next to another throughout the semiconductor die. Thus with two of these unit cells 101 next to each other, adjacent P-type pillars 110 combine for a cumulative width of about 3 microns, though each half of the combined pillar structure still has a dopant concentration of $1.5E11/cm^2$ across 1.5 microns, so that the per volume dopant concentration of the P-type pillars 110 is about $1E15/cm^3$. By way of example, the pillars may have a width of approximately half to one-fourth of a width of said trenches. FIG. 2-2 shows a perspective view of a unit cell 101, however without the P-implant top layer 130. FIG. 2A shows a perspective view of a unit cell 101, also without a P-implant top layer 130 with N-type pillars 110'.

The high voltage (HV) nano tube diode device 100 as shown in FIG. 2 can be formed with many nano-tube N-channels and P-channels to reduce the resistance and achieve a low drain-to-source resistance (Rds). For example, a device with the N-type nano tubes having a width of 0.25 micron and total $1E12/cm^2$ dopant concentration, the resistance is about the same as the Rds of a device with a channel that has a width of five microns and having a dopant concentration of $1E12/cm^2$. A conventional super junction device may have a drain-to-source resistance Rds of about 25-30 milliohms-cm2, the device implemented with ten nano tubes as disclosed has an estimated Rds of about 2-4 Milliohms-cm2 for a 600V BV The vertical junction structure shown in FIG. 2 can be implemented to manufacture many different types of devices such as MOSFET, bipolar junction transistor (BJT), diodes, junction field effect transistor (JFET), and insulated gate bipolar transistor (IGBT). The nano tubes may be formed with thin epitaxial layers including P-layers having a thickness approximately 0.5 microns doped with 0.6-$0.8E12$ cm-2 formed next to N-layers with a thickness of 0.25 to 0.5 microns doped preferably by Arsenic or Antimony in the range of about 1.6-$2E12$ cm-2. Then a P-type column of a width ranging from about 0.5 to 1 micro is formed that is doped in the range of $1.6E12$ to $2E12/cm^2$. These thin N-type and P-type columns are repeatedly formed in trenches until these layers merge to the central part of the trenches. A dielectric or very lightly doped silicon gap filling layer 120 is then formed to fill the gap between the merging nano tube columns. As discussed above, the gap-filling layer can be grown oxide, deposited dielectric material, or intrinsic silicon.

The vertical super junction structure as disclosed in FIG. 2-1 and manufactured by applying the processes described below is formed with a wide P-type column/Pillar structure that is approximately 2 to 5 microns wide and lightly doped in a range of 0.1-$0.2E12$ cm-2 on a N++ substrate. Instead of using P-type Column/Pillar, these Pillars could be N-type by using a lightly ($2E14$-$1e15$ cm-3) doped N-epi on N++ substrate as a starting material. An alternative configuration of the nano tubes is shown in FIG. 2A with N-type pillars 110' between the trenches formed as N-type pillars 110'. The conductivity types of the pillars and of the nano tubes have been reversed, as compared to FIG. 2, but the substrate 105 is still N-type, as are the N-type diffusion bottom and column regions, 105-B and 105-C. The dopant concentrations are shown in FIG. 2A-1, and are still charge balanced. The conductivity types, thicknesses, quantity and arrangement of the pillars and the N-type and P-type nano tubes may be reconfigured so long as they are still charge balanced.

FIG. 2A-2 shows an alternative embodiment 100' of the invention similar to FIG. 2A-1, but in which the center of the trench is filled with a center nano tube 115' rather than an insulating gap fill. This center nano tube 115 may be epitaxially grown to completely fill the remaining gap between the surrounding nano tubes. In the example shown here, the center nano tube 115' has a thickness of about 1 micron and a doping concentration of about $2E12/cm^2$, and achieves charge balance with the surrounding nano tubes. This embodiment may be more difficult to manufacture because of tolerance, charge balance, and gap fill issues.

Figure 2B:
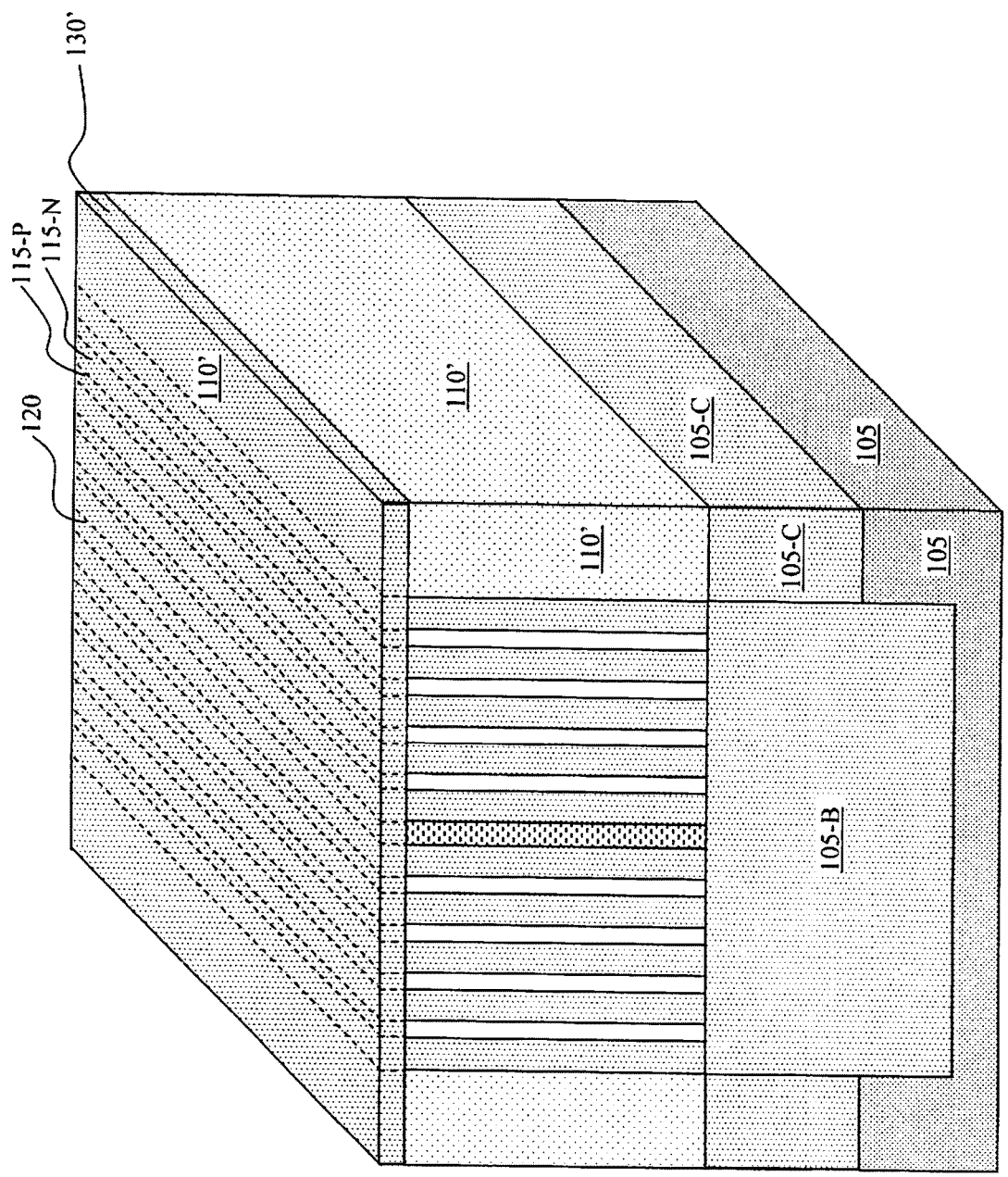
FIG. 2B shows a perspective of a device similar to FIG. 2A with an N+ type surface layer electrically connected to all the N-type columns.
Figure 2C:
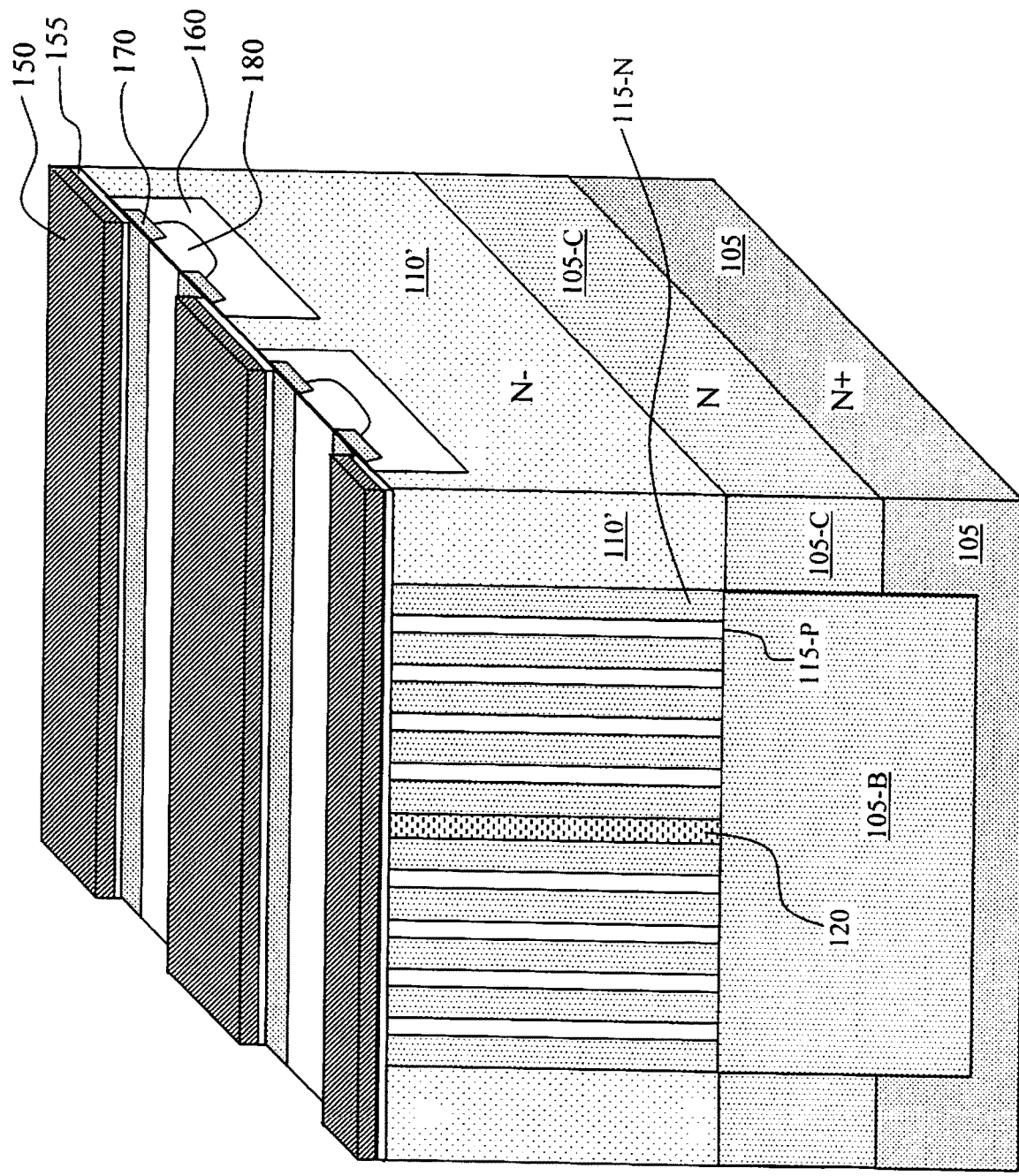
FIG. 2C is a perspective view of a vertical planar MOSFET formed with a planar polysilicon gate padded by a gate oxide layer extended along an orientation that is ninety degrees from the P and N type columns.
Figure 2D:
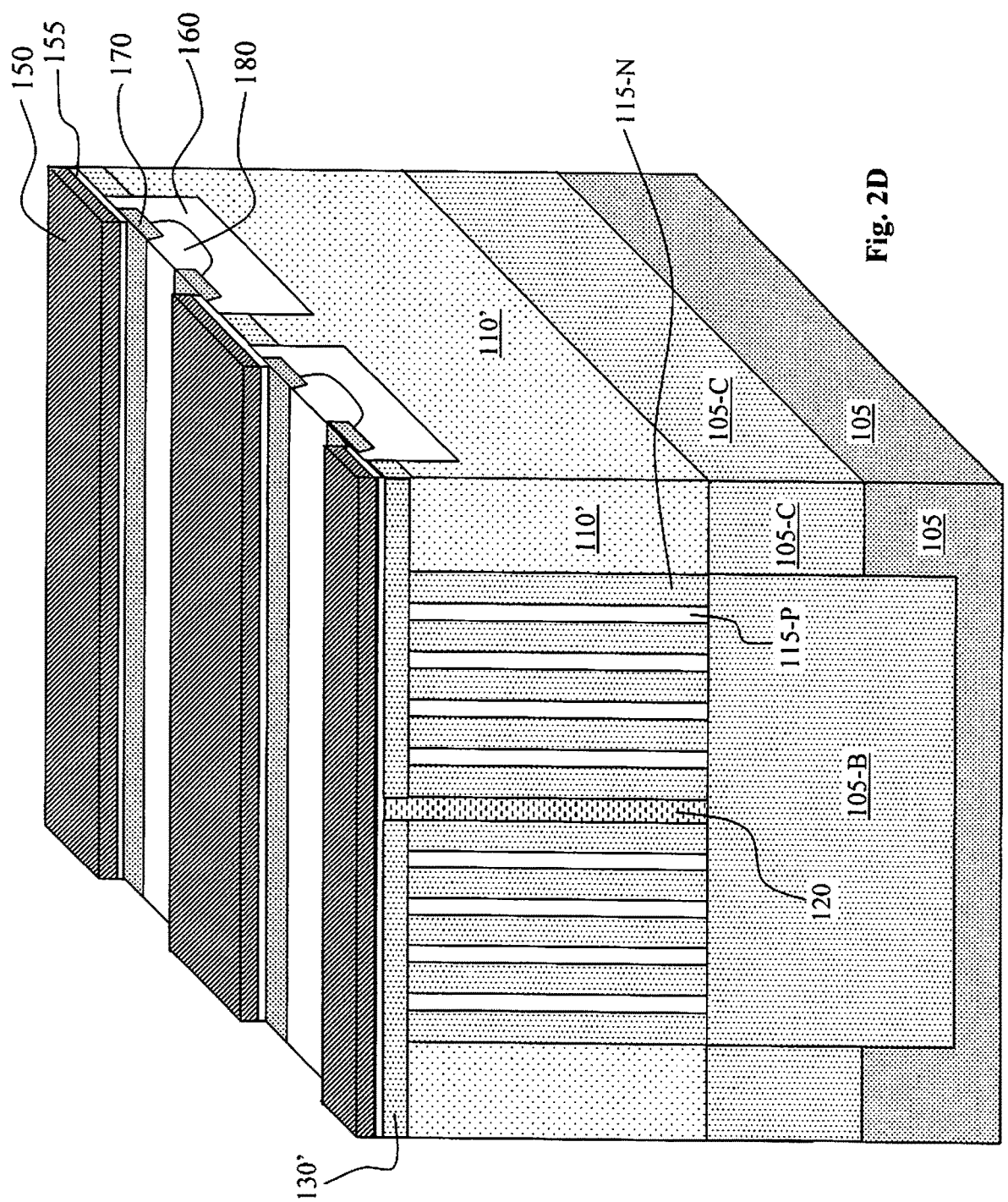
FIG. 2D shows another exemplary embodiment similar to FIG. 2C except that there is an N-type surface layer electrically connected to all the N-type columns 115-N.
Figure 2E:
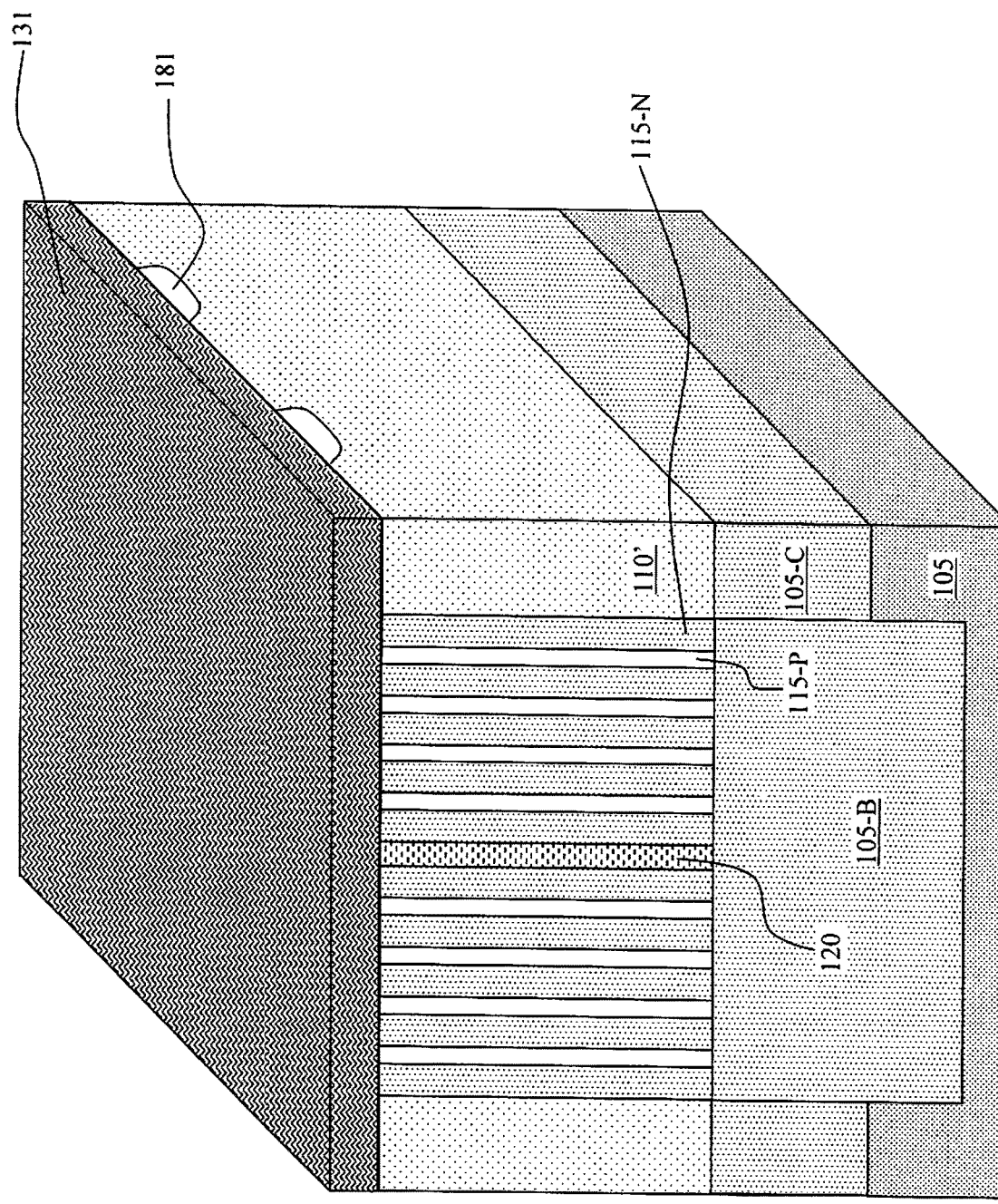
FIG. 2E shows another exemplary embodiment that further includes a Schottky metal disposed on the top surface for contacting all N-columns 115-N to form a Schottky diode.
Figures 1, 2E:
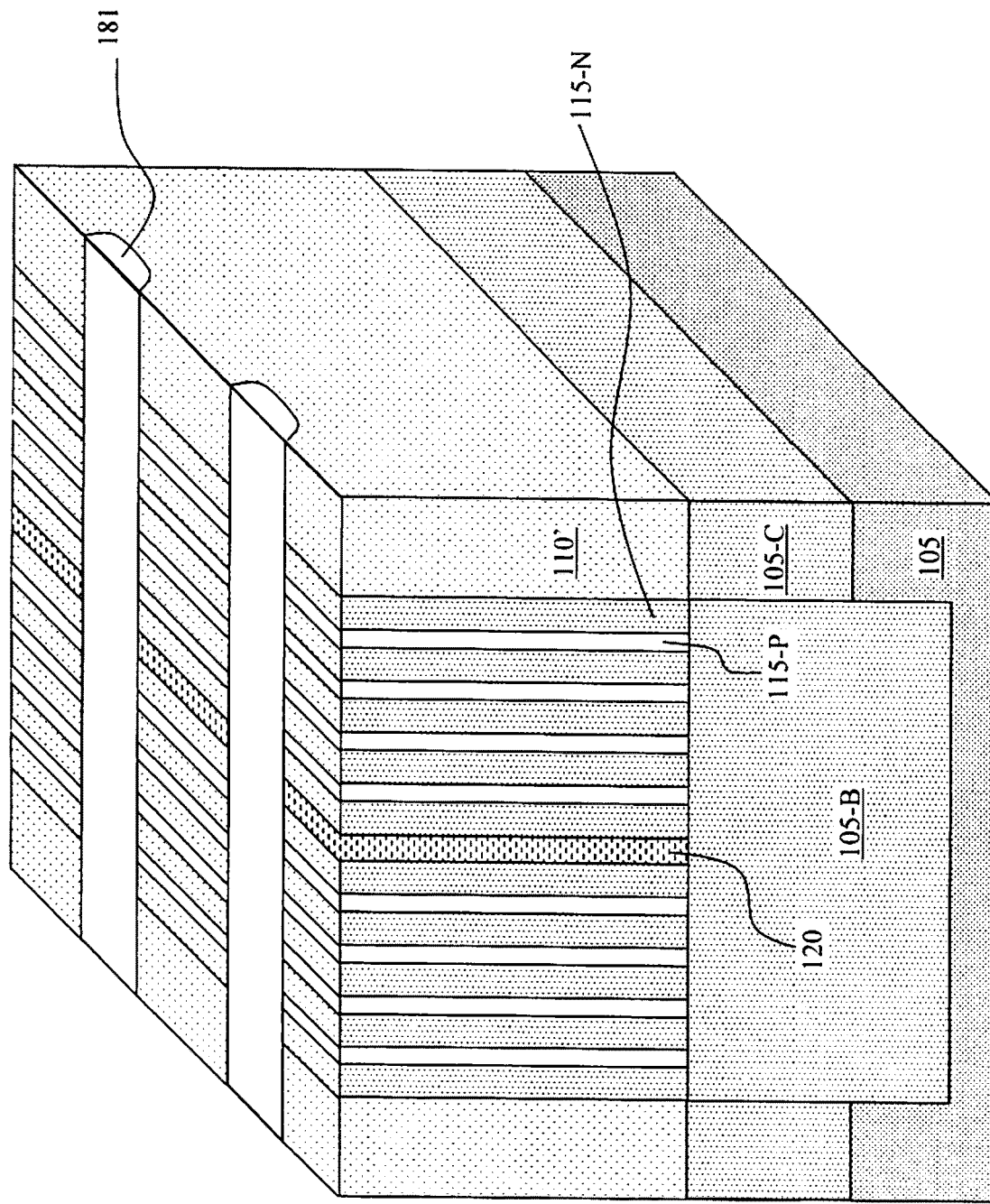
Figures 2, 2E:
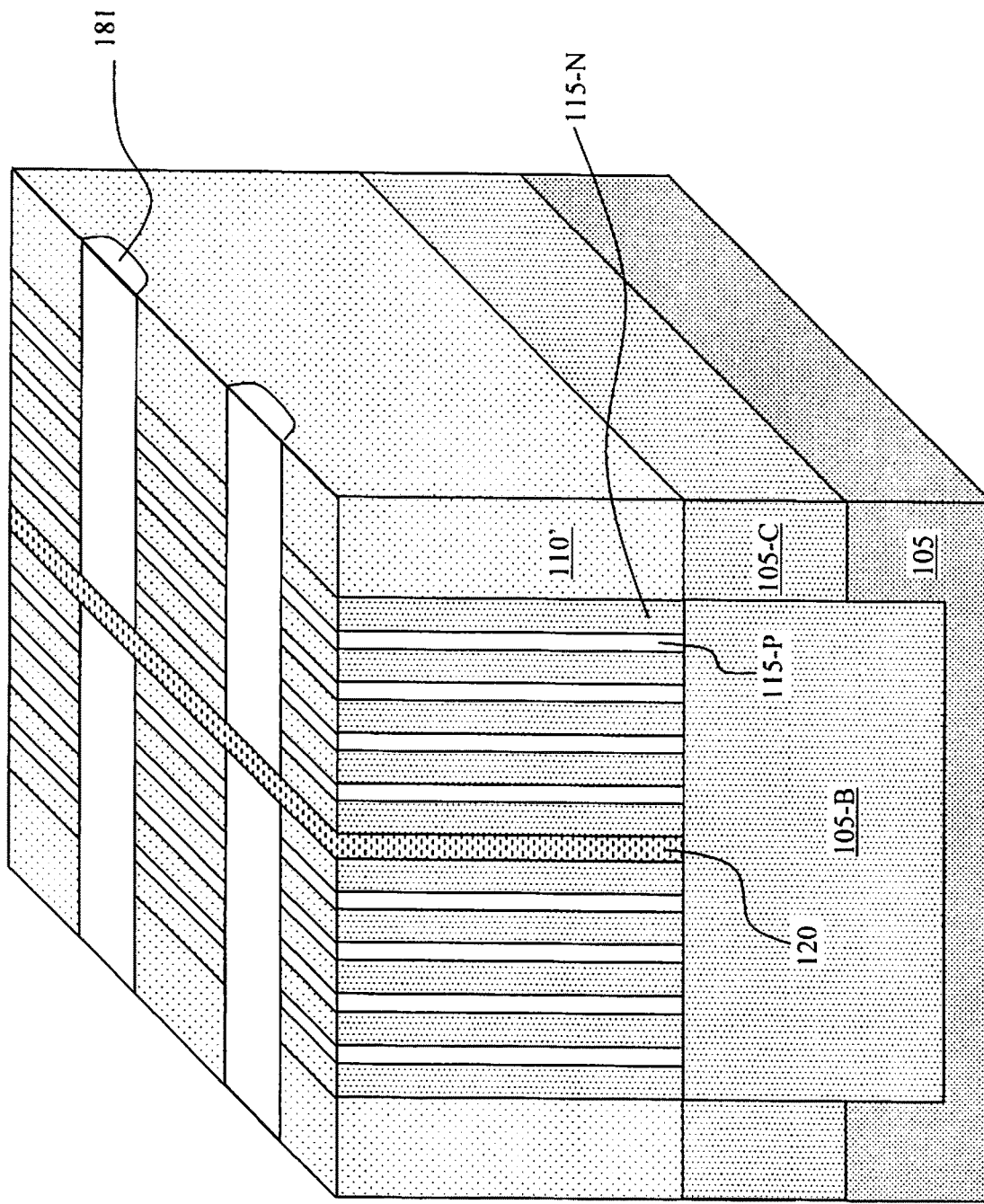
Figure 2F:
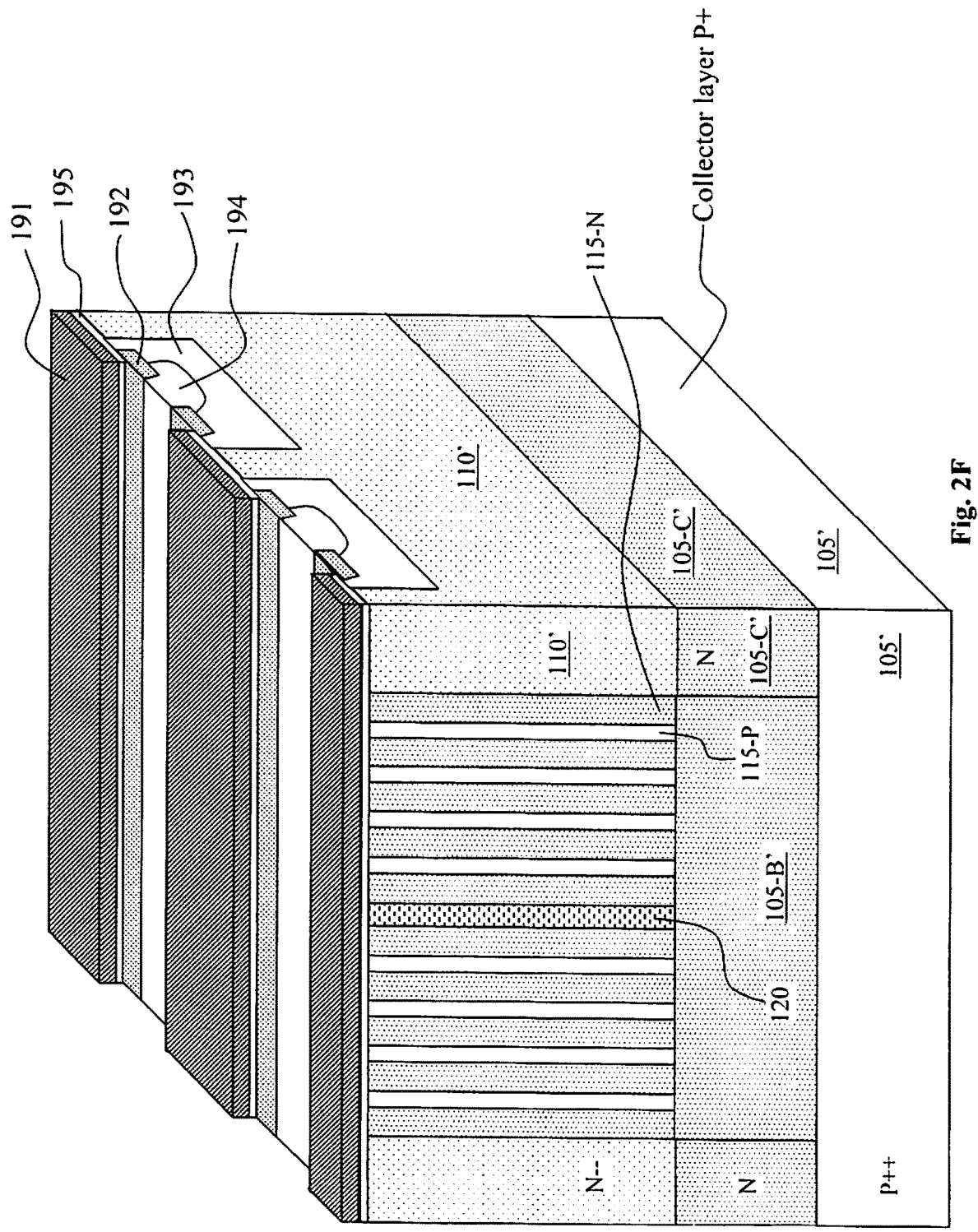
FIG. 2F shows another embodiment of this invention wherein the device has P+ type substrate 105' with N-type bottom buffer layer 105-B' and pillar buffer layer 105-C' beneath the P columns 115-P and N columns 115-N and the N-type pillars 110' to form an IGBT device.
Figures 1, 2F:
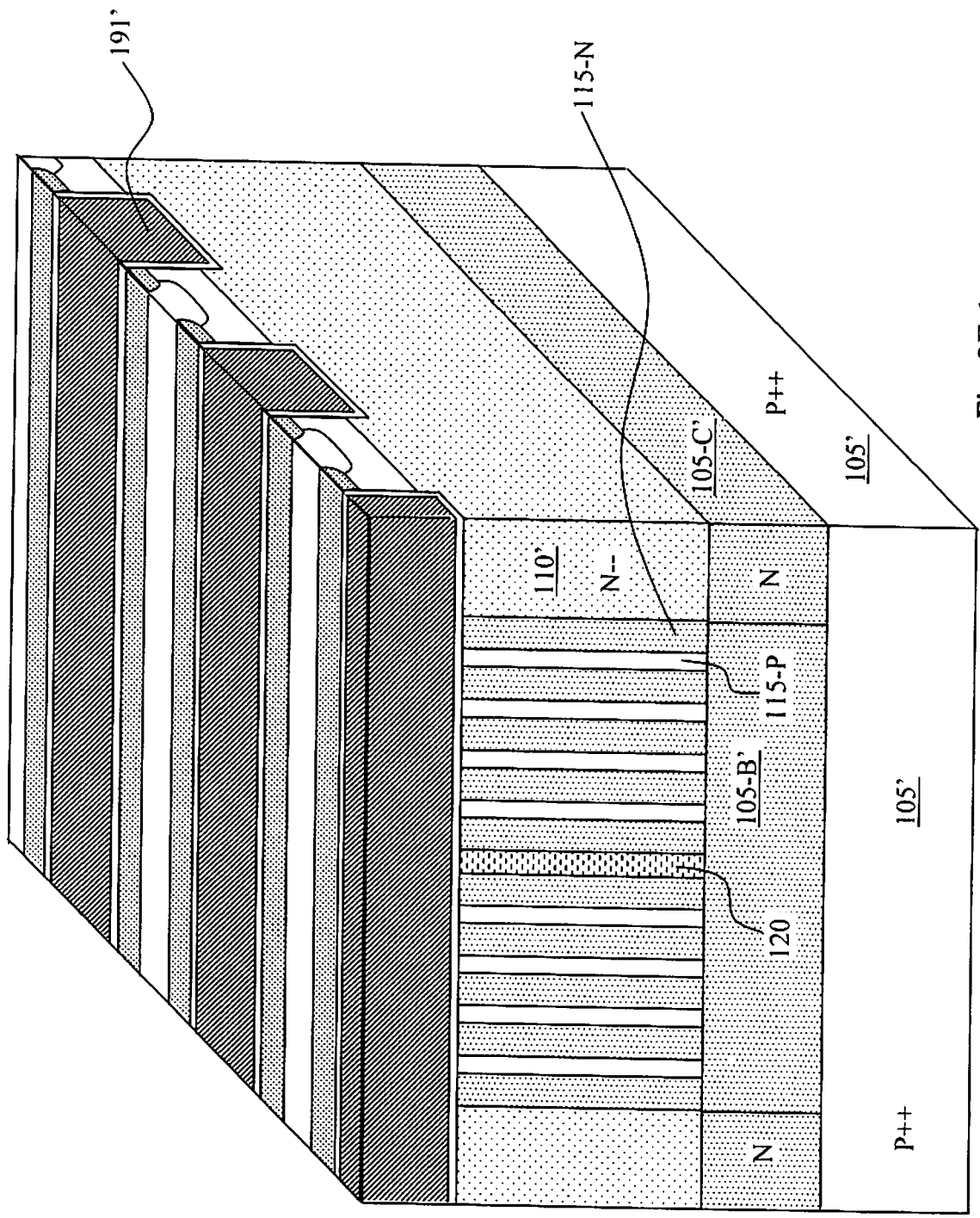
Figure 2H:
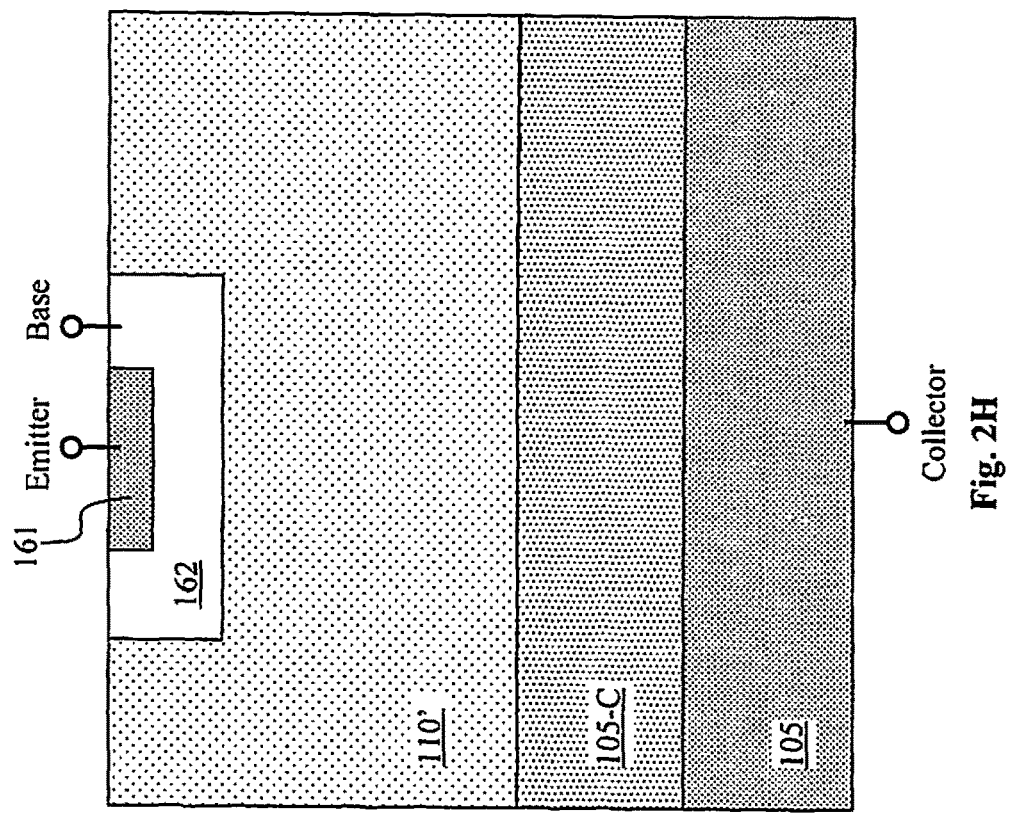
FIGS. 2G-2H show additional embodiments in which various device structures are formed on the face 111 of FIG. 2A along an orientation that is ninety degrees from the P and N type columns 115-P and 115-N.
Figure 2G:
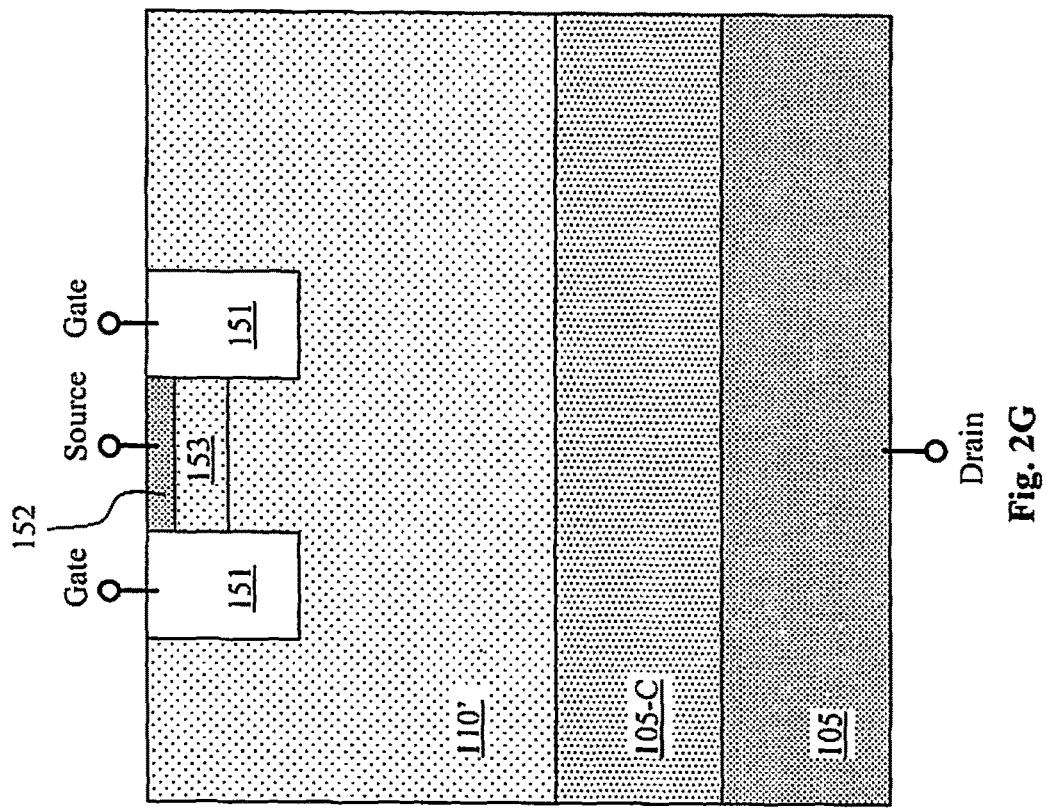

Various structures may be formed on the top surface that run ninety degrees to the P and N type columns, as will be illustrated below; the cross section of these structures can be seen on the plane 111 of FIG. 2A, as will be shown in further embodiments. In an exemplary embodiment shown in FIG. 2B, an N+ type surface layer 130' is electrically connected to all the N-type columns. The top surface layer 130' may be implanted or grown. In another exemplary embodiment, the device further comprises a vertical planar MOSFET formed with a planar polysilicon gate 150 padded by a gate oxide layer 155 extended along an orientation that is ninety degrees from the P and N type columns with P− body regions 160 encompassing N+ source regions 170 and having a P+ body contact region 180 formed near the top surface between the source regions 170 as shown in FIG. 2C. The N+ substrate 105 acts as the drain for the MOSFET. The MOSFET structure of FIG. 2C is superimposed on the plane 111 of FIG. 2A. FIG. 2D shows another exemplary embodiment similar to FIG. 2C except that there is a N-type surface layer 130' electrically connected to all the N-type columns 115-N. Shorting the n-type columns 115-N together with the N-type surface layer 130' may help reduce Rds, and lower spreading resistance. Similar to FIG. 2C, the device of FIG. 2D also comprises a vertical planar MOSFET formed along an orientation that is ninety degrees from the P and N type columns where all the P columns 115-P are electrically connected to the P− body regions 160. The N-type nano tubes 115-N and the N-type pillars 110' are connected to the N-type surface layer 130' and act as the super junction drift region. FIG. 2E shows another exemplary embodiment that further includes a Schottky metal 131 disposed on the top surface for contacting all N-columns 115-N. P+ ohmic contact regions 181 may optionally be included to provide ohmic contact between the P columns 115-P and the Schottky metal 131. FIG. 2E-1 shows the same embodiment as FIG. 2E, except with the Schottky metal 131 removed to show the underlying structures. FIG. 2E-2 is the same as FIG. 2E-1, except that gap filler 120 in FIG. 2E-2 is made from an oxide, rather than lowly doped (intrinsic) silicon. FIG. 2F shows another embodiment of this invention wherein the device further has P+ type substrate 105' with N-type buffer layers 105-B' and 105-C beneath the P columns 115-P and N columns 115-N and the N-type pillars 110' to form an IGBT device. The IGBT device also includes a planar gate 191, an N+ emitter/source region 192, P− body region 193, P+ body contact 194, and gate oxide 195. The P+ substrate 105' acts as the collector. FIG. 2F-1 shows a similar IGBT device, but one with gate trenches 191', rather than planar gates. FIGS. 2G-2H show additional embodiments in which various device structures are formed on the plane 111 of FIG. 2A along an orientation that is ninety degrees from the P and N type columns 115-P and 115-N. FIG. 2G shows a junction field effect transistor (JFET) as it would appear on the plane 111 of FIG. 2A, wherein the device further includes P type gate region 151, N+ source contact region 152, and N− region 153 to form a JFET device. The N+ substrate 105 acts as the drain. FIG. 2H shows bipolar junction transistor (BJT) wherein the device further includes a N+ emitter region 161 and a P-type base region 162 to form a BJT device. The N+ substrate 105 functions as the collector.

Figure 2I:
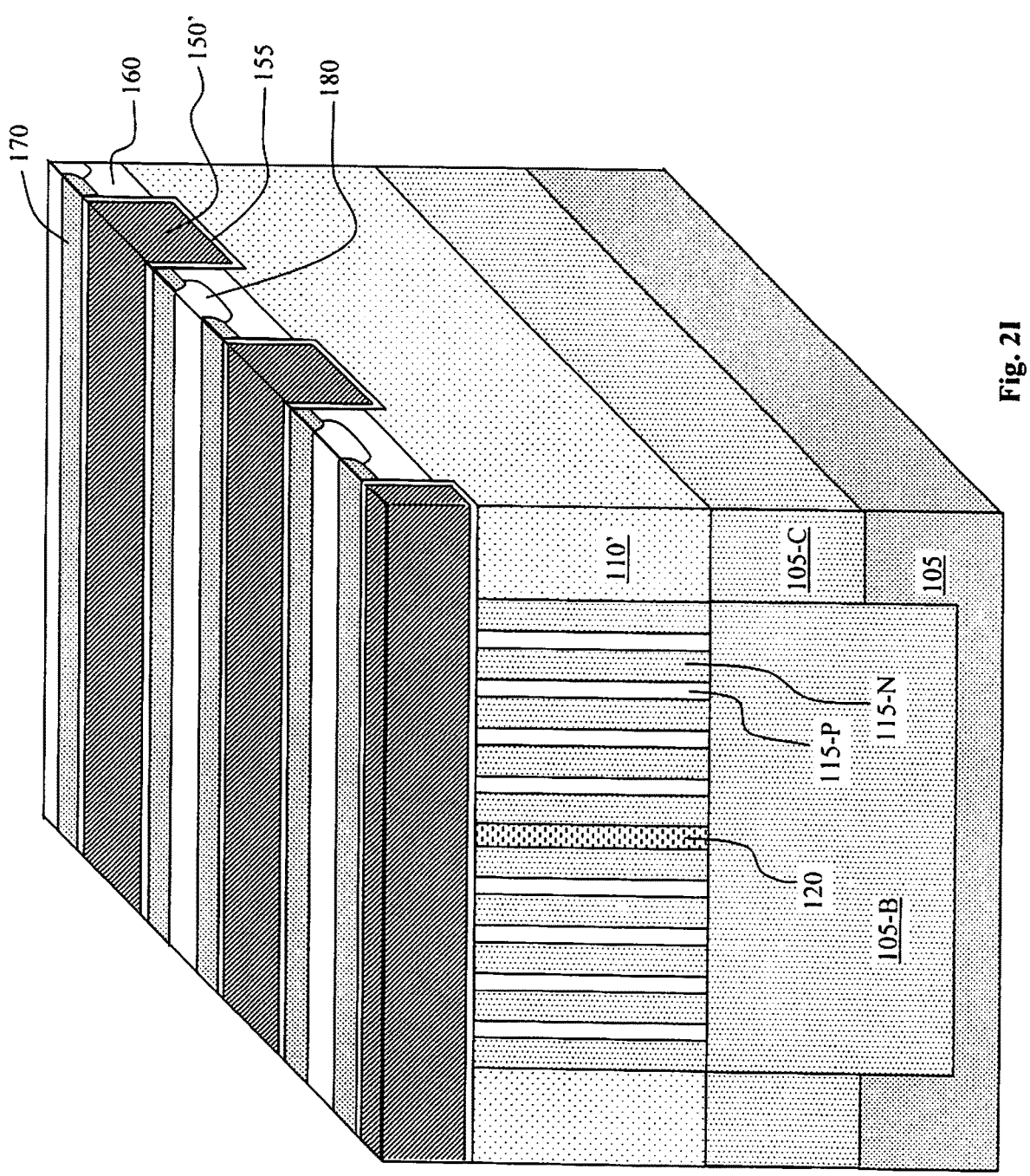
FIG. 2I shows another exemplary embodiment wherein the device further comprises a trench MOSFET formed with a trench polysilicon gate padded by a gate oxide layer extended along an orientation that is ninety degrees from the P and N type columns.
Figure 2J:
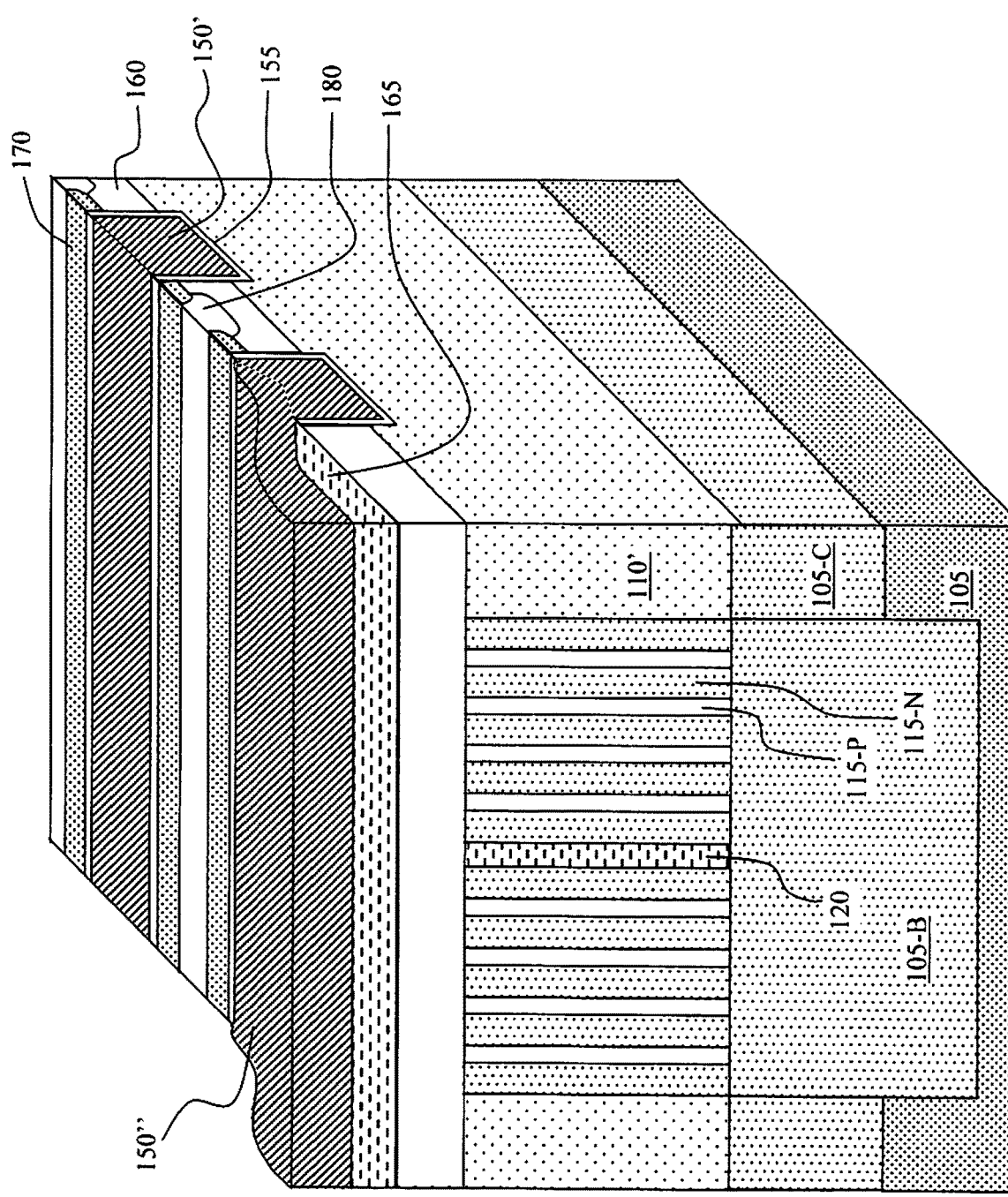
FIG. 2J shows another exemplary embodiment similar to FIG. 2I wherein a gate pad is formed on top of a field oxide layer.

FIG. 2I shows another exemplary embodiment wherein the device further comprises a trench MOSFET formed with a trench polysilicon gate 150' padded by a gate oxide layer 155 extended along an orientation that is ninety degrees from the P and N type columns with P− body regions 160 encompassing N+ source regions 170 and having a P+ body contact region 180 formed near the top surface between the source regions 170. N+ substrate 105 acts as the drain. FIG. 2J shows another exemplary embodiment similar to FIG. 2I wherein the beginnings of a gate pad 150" is formed on top of a field oxide layer 165. Similar to FIG. 2I, the device further comprises a trench MOSFET formed along an orientation that is ninety degrees from the P and N type columns where all the P columns are electrically connected to the P− body regions 160.

Figure 3A:
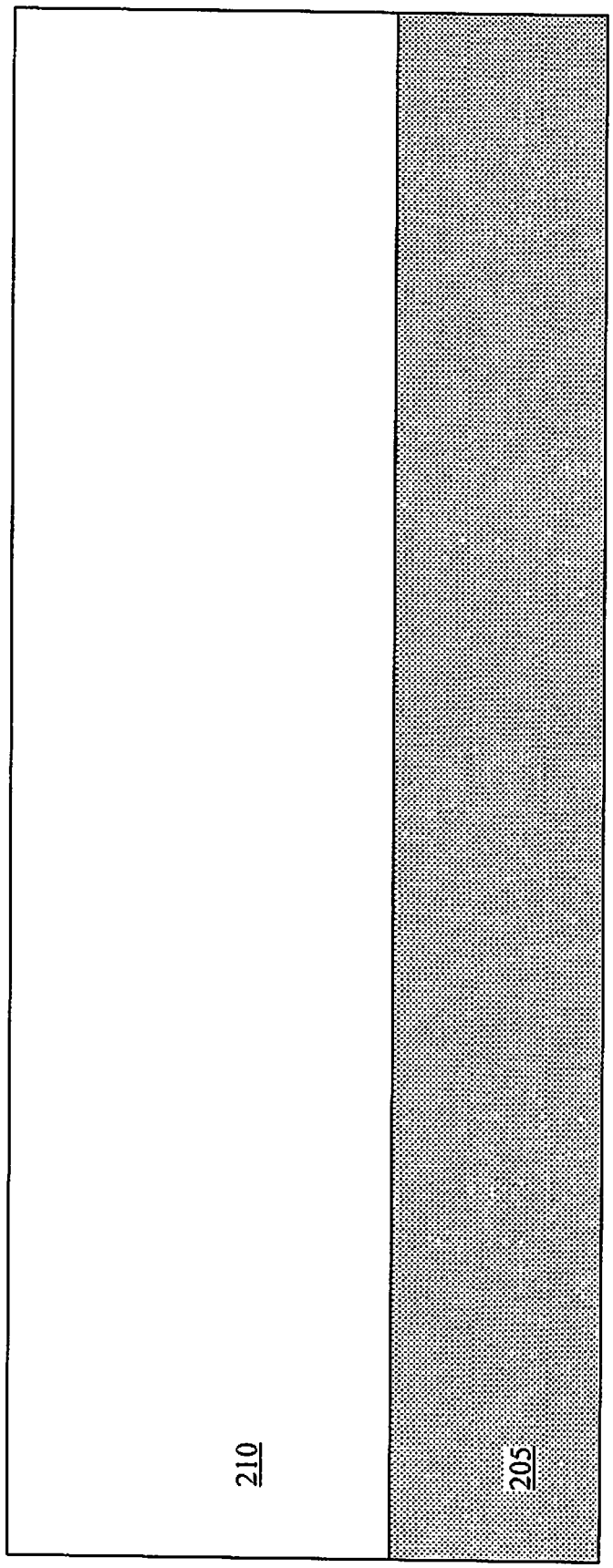
FIGS. 3A to 3J are cross sectional views and a top view to illustrate processing steps of this invention to manufacture high voltage power device of FIG. 2 with super junction structures.
Figures 1, 3B:
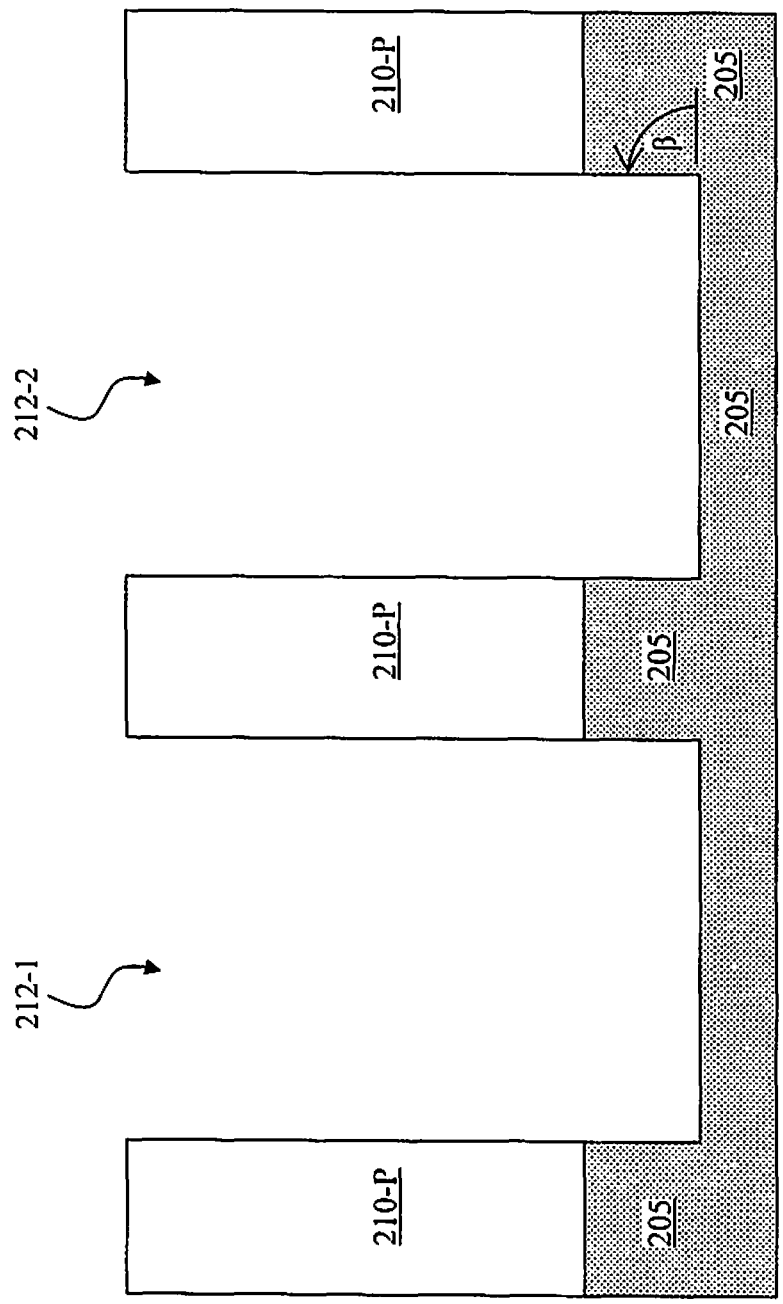
Figures 2, 3B:
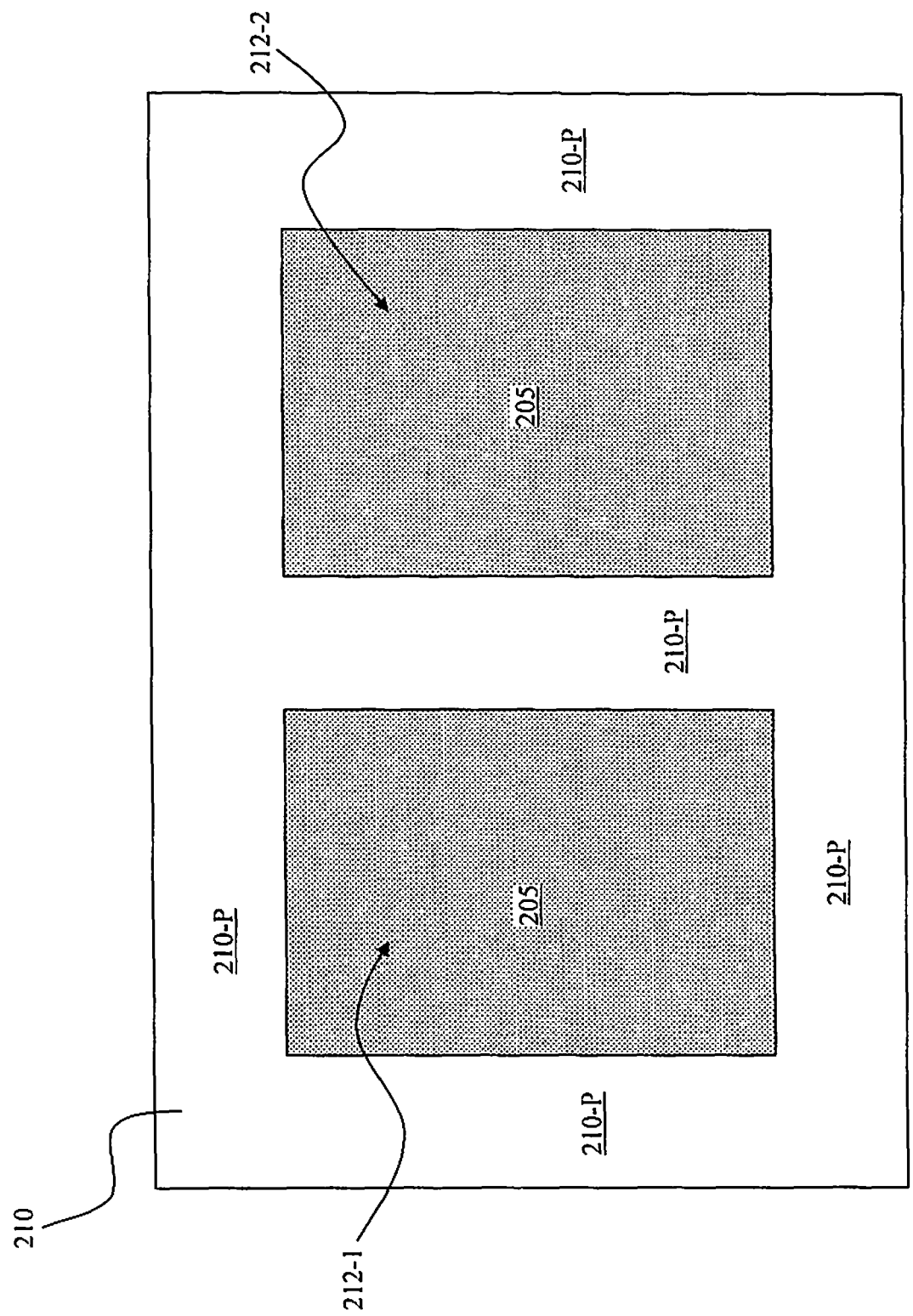

Referring to FIGS. 3A to 3E for a serial of side cross sectional views to illustrate the fabrication steps of a semiconductor power device implemented with nano tubes as that shown in FIG. 2. FIG. 3A shows a starting N+ red phosphorous silicon substrate 205, i.e., a heavily N+ doped silicon substrate, supports a P-type epitaxial layer 210 that has a thickness of approximately 40 micrometers with a P-dopant concentration of approximately 1e15/cm$^3$. In FIGS. 3B-1 and 3B-2, an etching process is carried out to open the trenches 212-1 and 212-2. The trenches have a width of about 10 microns with P-pillars 210-P having a pillar width of about 3 microns (by way of example the pillar width may vary about from two to five microns). The sidewalls of the trenches 212-1 and 212-2 may have a slightly tilted angles β such as 85-88 degrees (the tilt angle would be 2-5 degrees measured from a vertical axis) instead of a near perpendicular pillars, e.g., pillars of approximately 89 or 90 degrees, since the tilted angles of the sidewalls and the pillars 210-P would not have significant impact on the performance of charge balance.

Figure 3C:
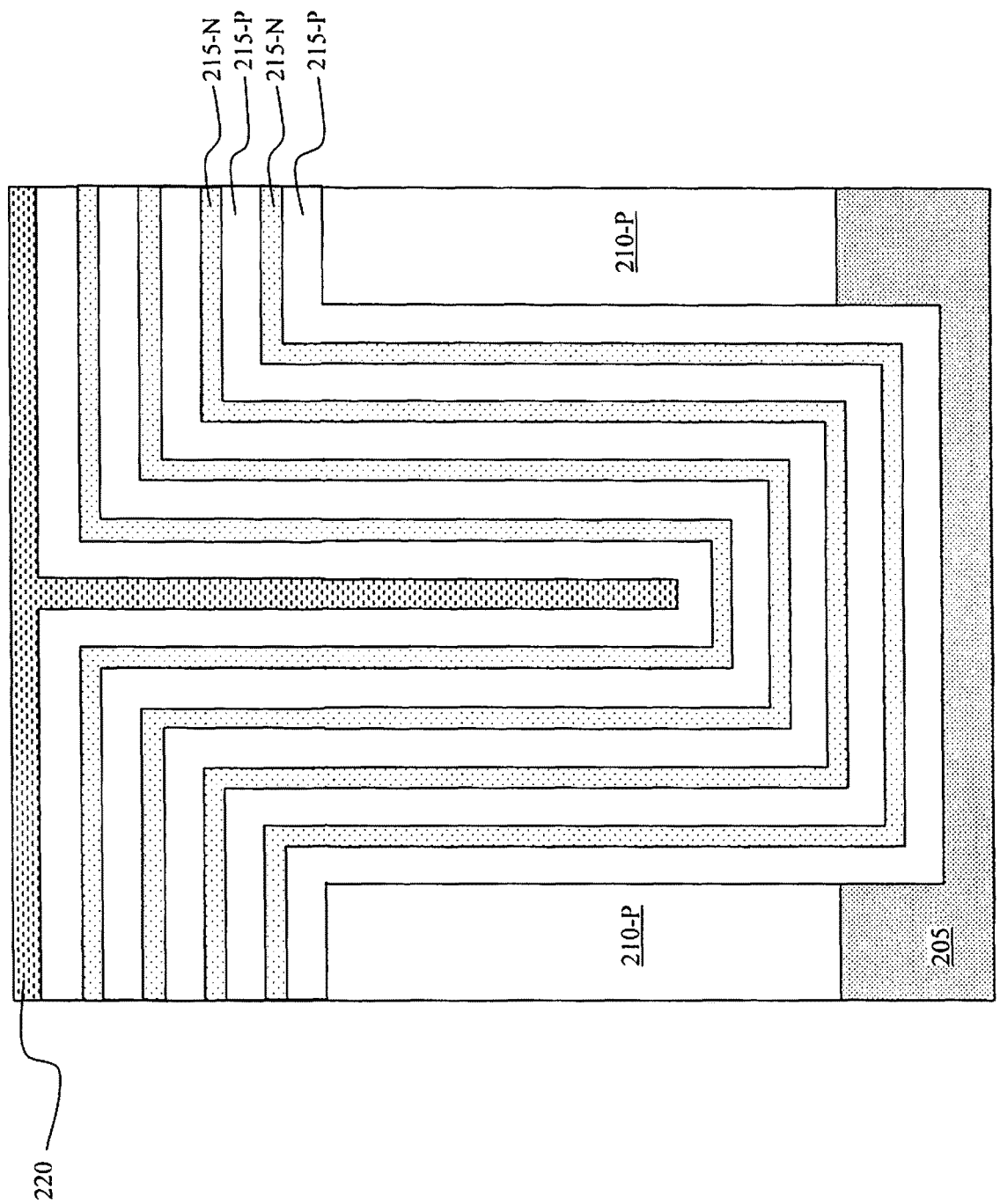
Figure 3D:
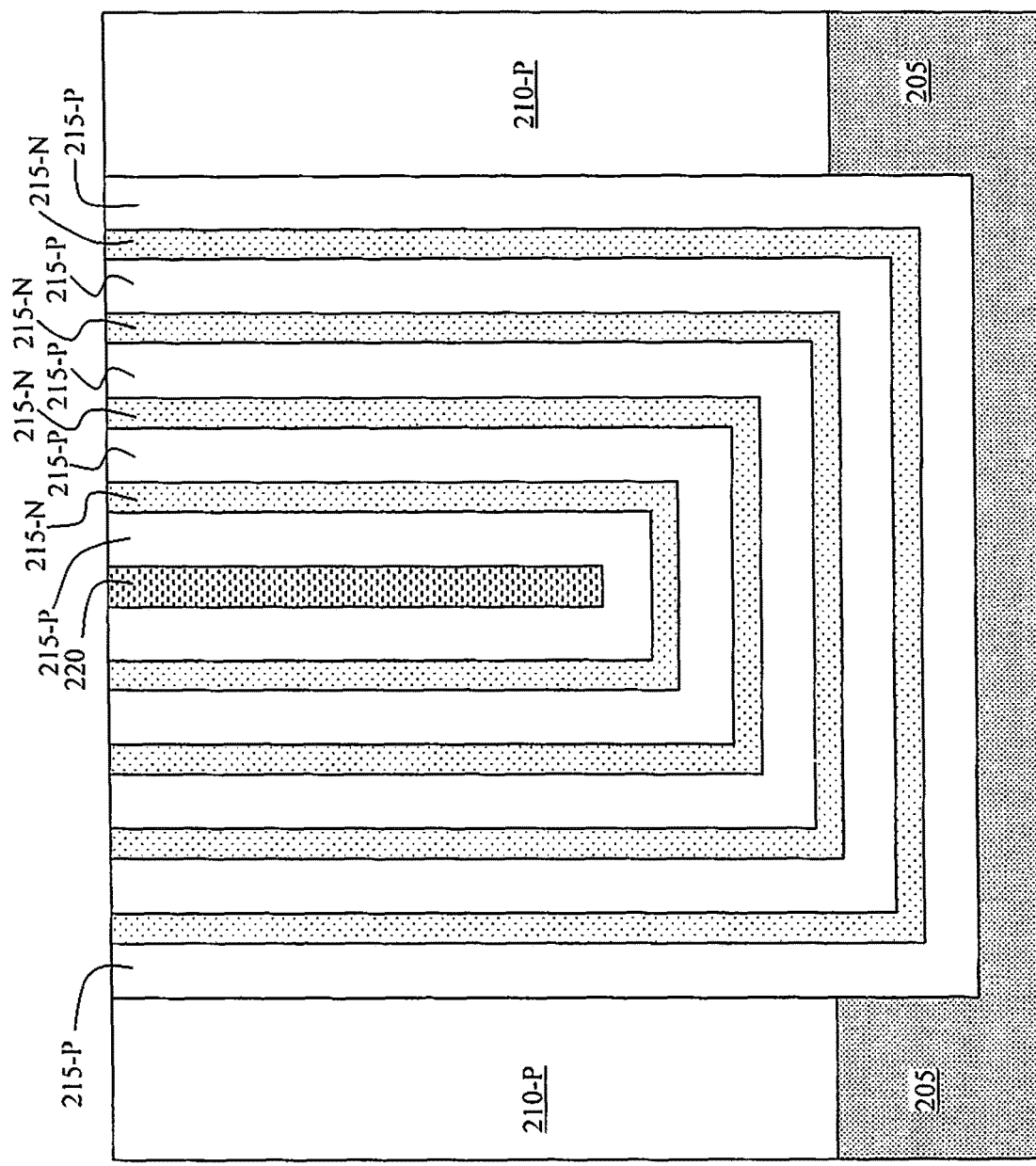
Figure 3E:
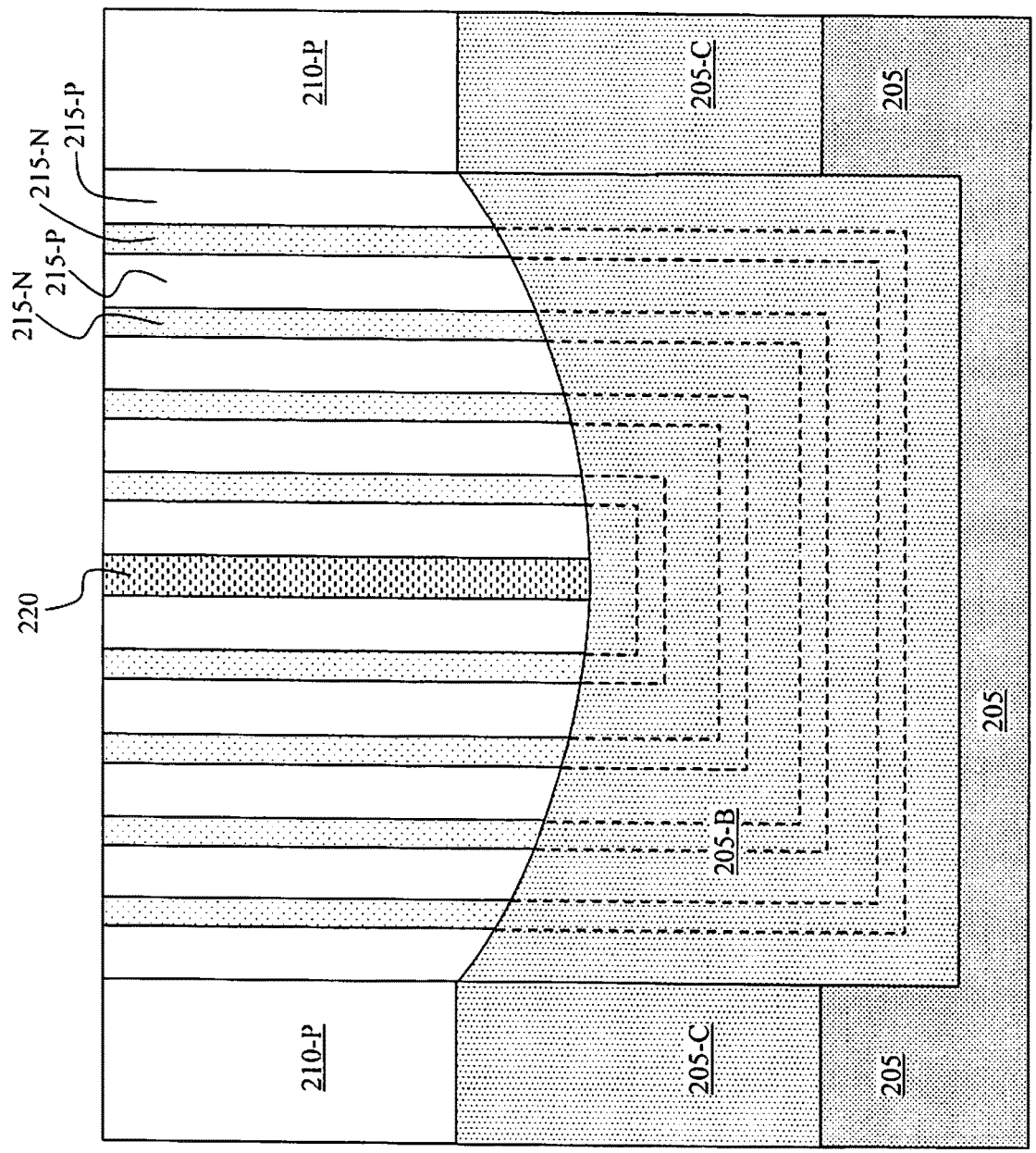

In FIG. 3C, alternating thin layers of N epitaxial layers 215-N and P epitaxial layers 215-P are grown covering the trench sidewalls and the top surface area surrounding the trenches 212-1 and 212-2. A small gap is left near the central portion of the trench after completing the growth of multiple N-epitaxial layers 215-N adjacent to the P-epitaxial layers 215-P. The small central gap is filled with a thermally grown or a deposition of an insulative gap filler 220. In FIG. 3D, a chemical mechanical planarization (CMP) process is carried out to remove the top surface above the P-pillars 210-P and above the top surface of the trenches. In FIG. 3E, a N-diffusion process is carried out by applying an elevated temperature to diffuse the heavily doped N-dopant ions from the N+ substrate 205, which in this example may be a diffusion of about 5 microns, into the bottom portion of the trenches covering with epitaxial layers and into the bottom portion of the P pillars 210-P to form the N+ diffusion bottom region 205-B and N+ diffusion column region 205-C. This diffusion changes the remaining portions of the N and P epitaxial layers 215-N, 215-P into vertical nano tubes. If the charge concentrations of these N and P epitaxial layers 215-N, 215-P, and pillars 210-P are chosen correctly, as shown in FIG. 2, charge balance is achieved, and these vertical nano tubes can be used for super junction applications. The aspect ratio of the diffusion process as shown in FIG. 3E is more realistic than the representations shown in FIG. 2.

A P implant may be carried out to form a top P+ region on the top surface of the substrate to form a high voltage vertical diode, like the one shown in FIG. 2.

Figure 3F:
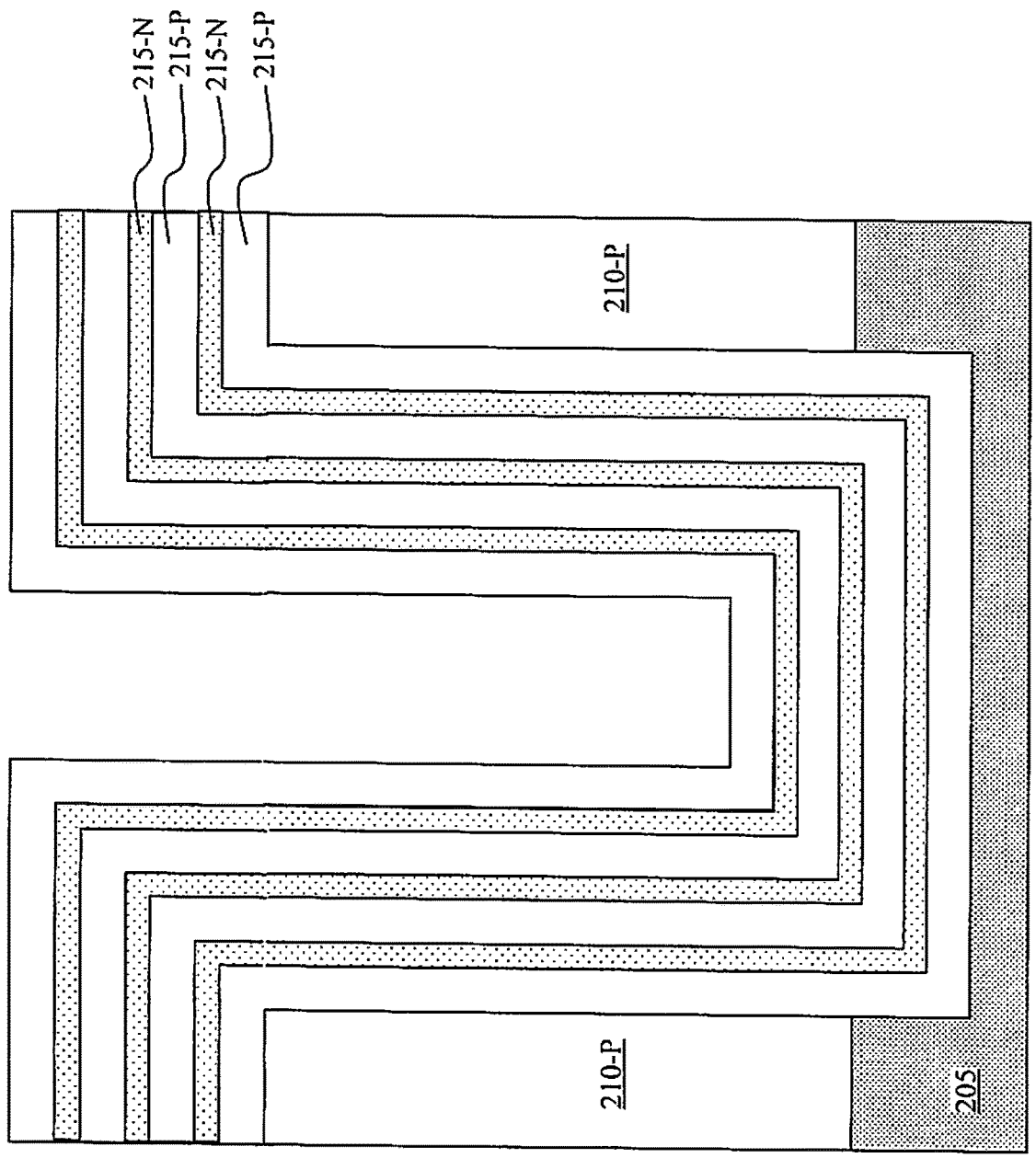
Figure 3G:
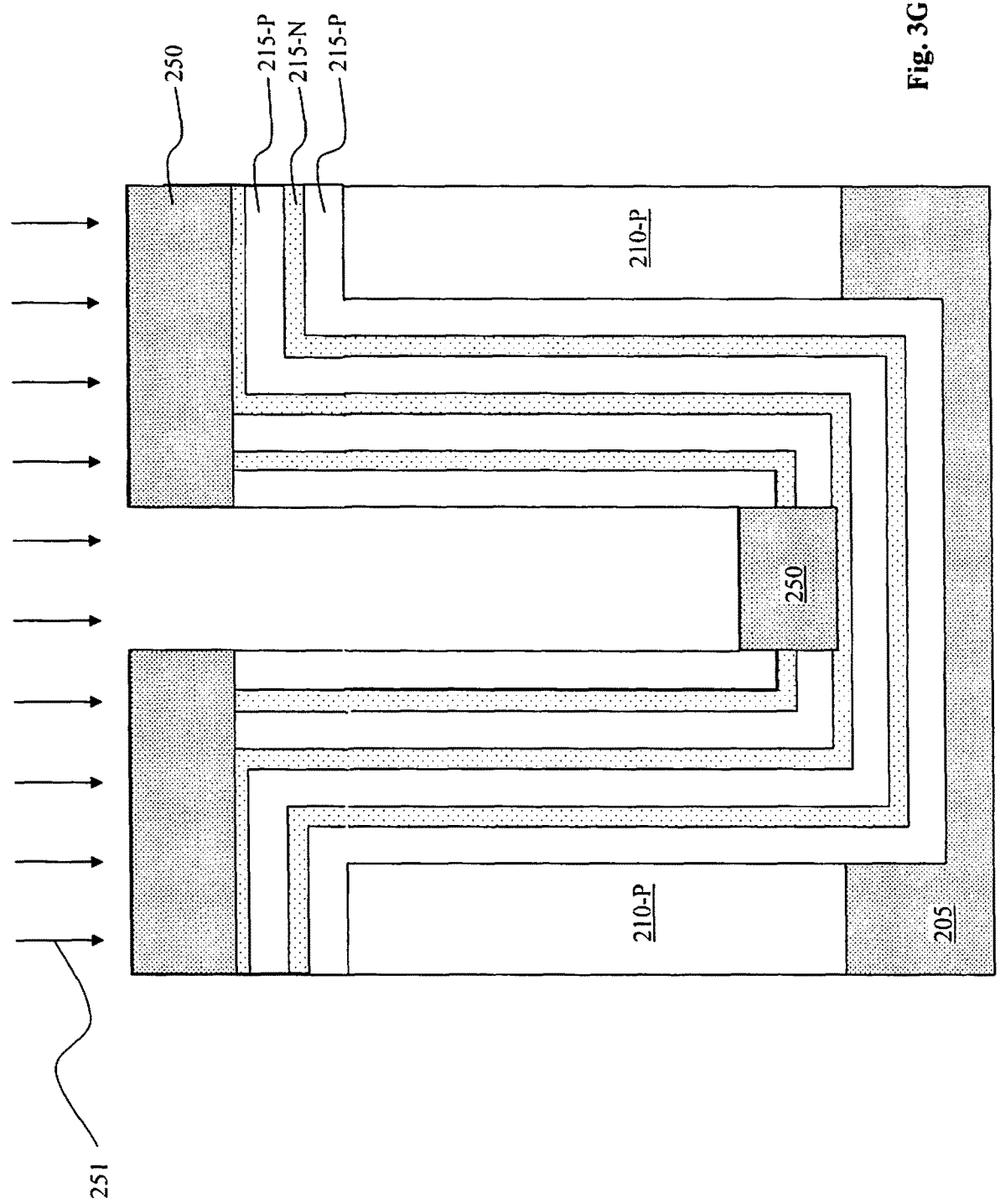
Figure 3H:
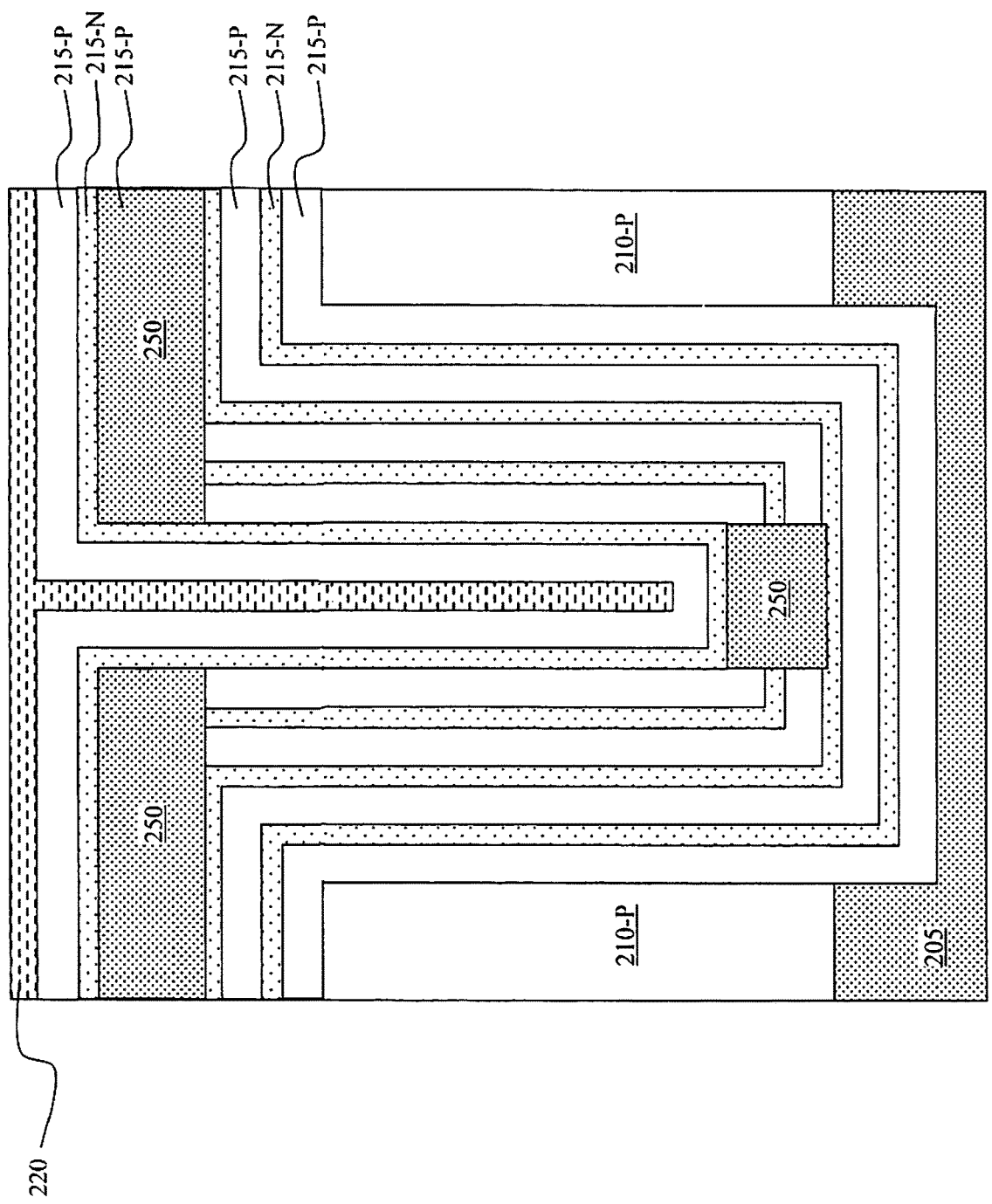
Figure 3I:
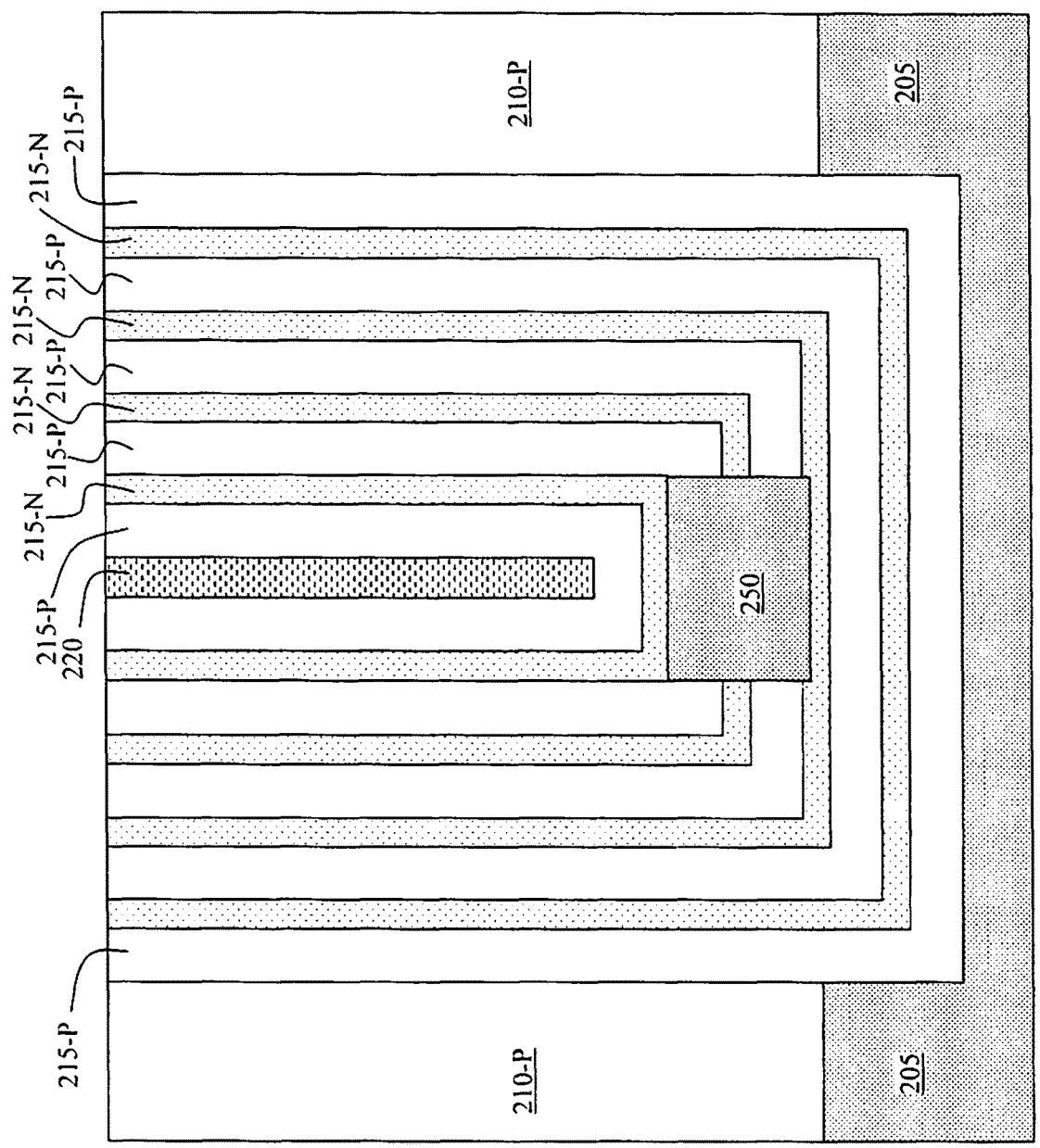
Figure 3J:
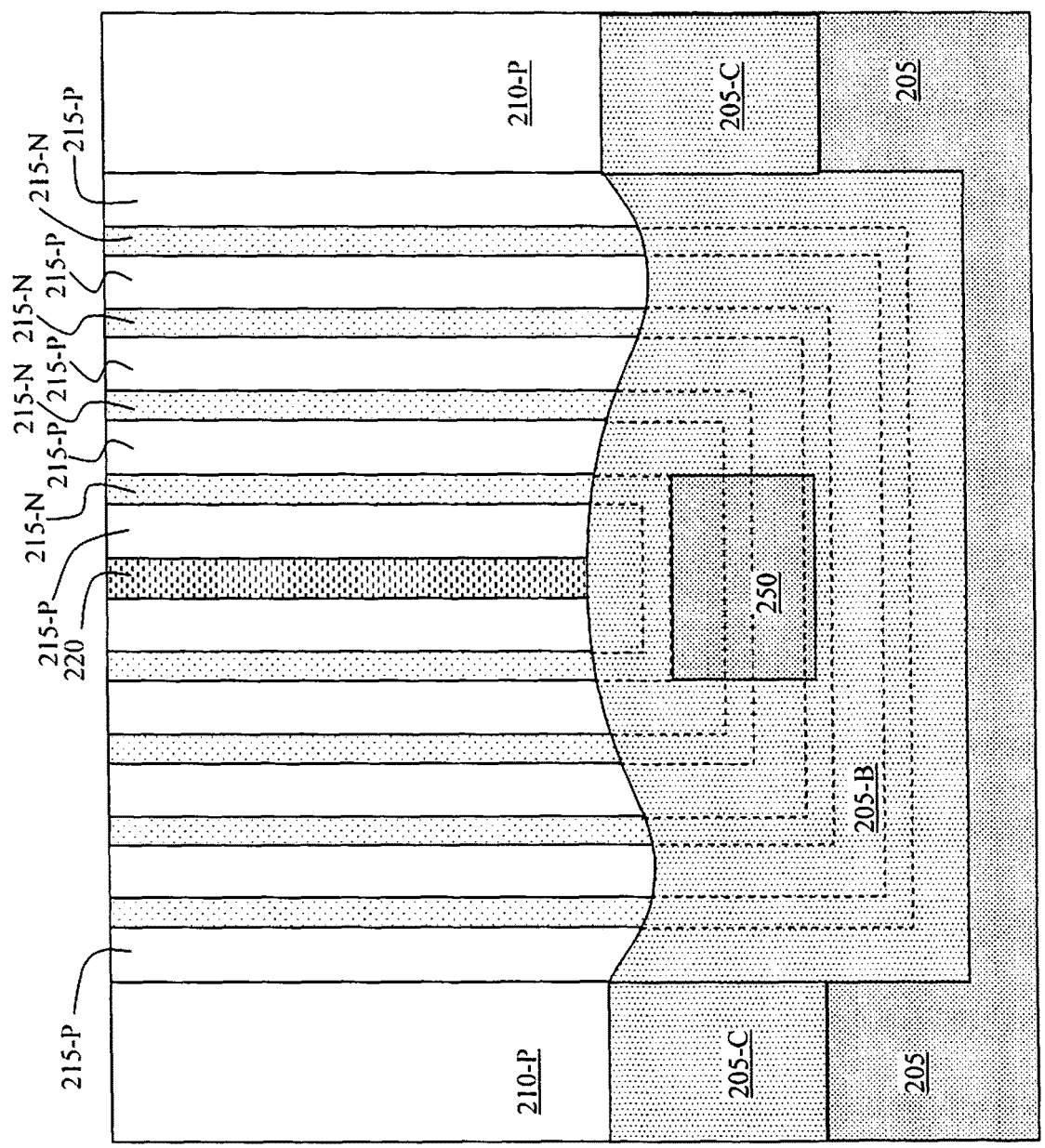

An alternative method is shown starting from FIG. 3F which may aid the diffusion process. It uses the same first steps as shown in FIGS. 3A and 3B-1. However as shown in FIG. 3F, after forming a few N and P epitaxial layers 215-N and 215-P, the epitaxial growth steps are paused, and a vertical (anisotropic) N+ implant 251 is performed to form N+ regions 250 in the exposed epitaxial layers 215-N and 215-P as shown in FIG. 3G. An oxide layer (not shown) may first be grown to protect the sidewalls during the implanting process, and removed afterwards. In FIG. 3H, the rest of the N and P type epitaxial layers 215-N and 215-P are grown as usual, along with the gap fill 220. A CMP process is carried out to remove the excess top material, as shown in FIG. 3I. During the diffusion process of FIG. 3J, the N+ region 250 may aid in the formation of N+ diffusion bottom region 205-B, and N+ diffusion column regions 205-C.

Figure 4:
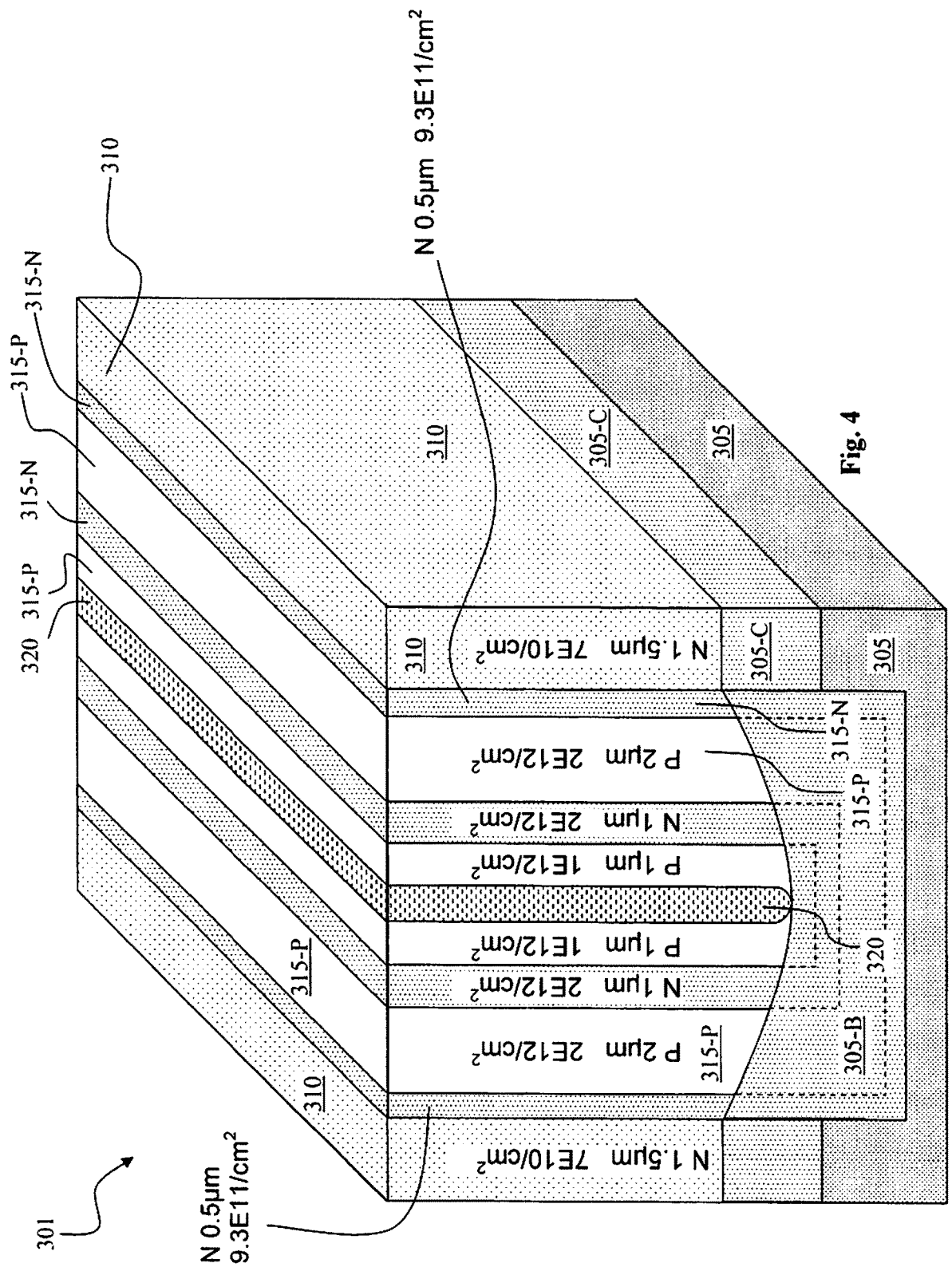
FIG. 4 shows a perspective view of an alternative configuration of a unit cell 301 having charge balanced alternating N and P nano tubes surrounded by N-pillars having an insulating gap filler layer in the center, supported on a N++ substrate.
Figure 4A:
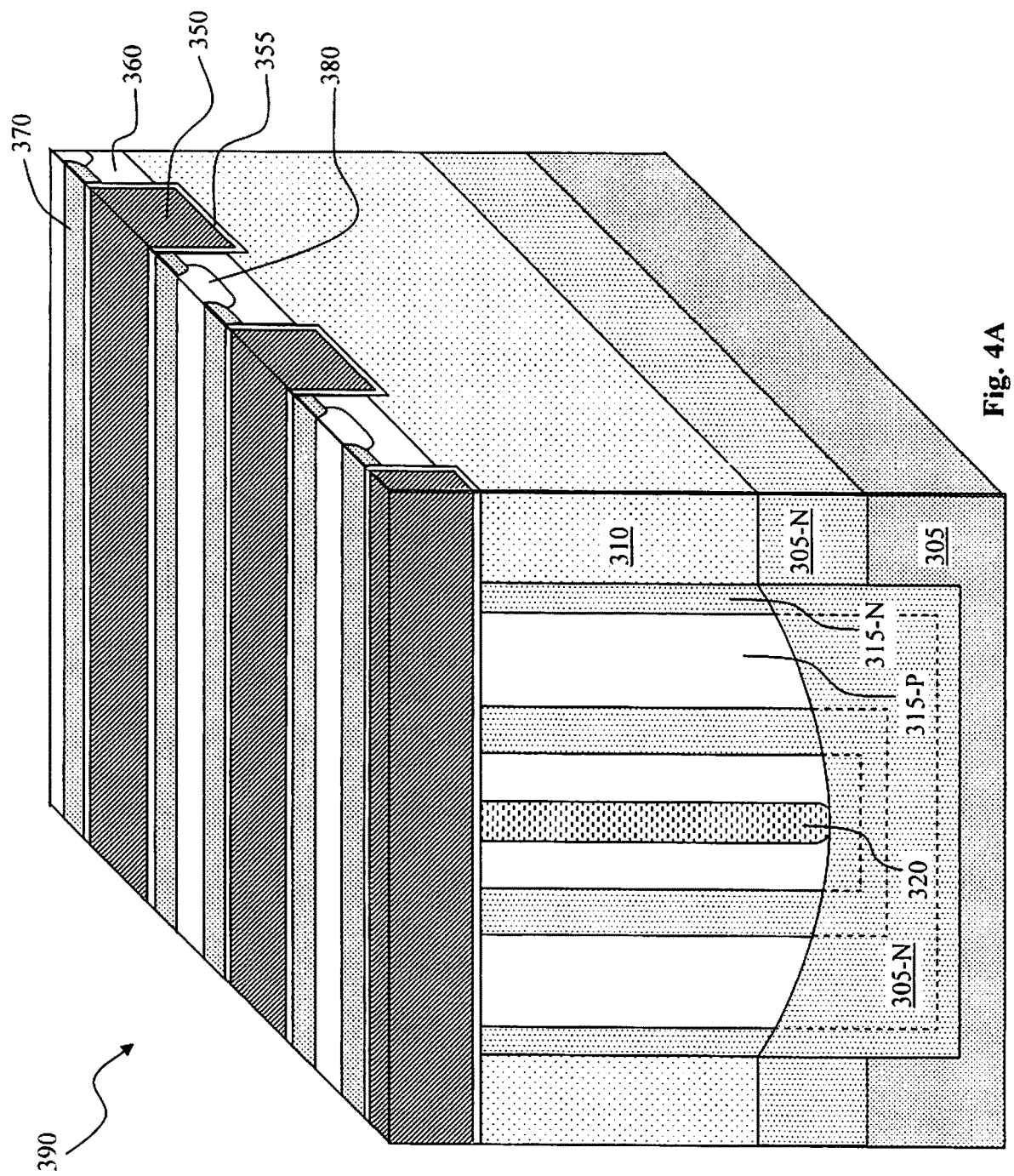
FIG. 4A shows a perspective view of a portion of the active area 390 of a semiconductor power device 300 using the nano tube unit cell 301 configuration of FIG. 4.
Figures 1, 4A:
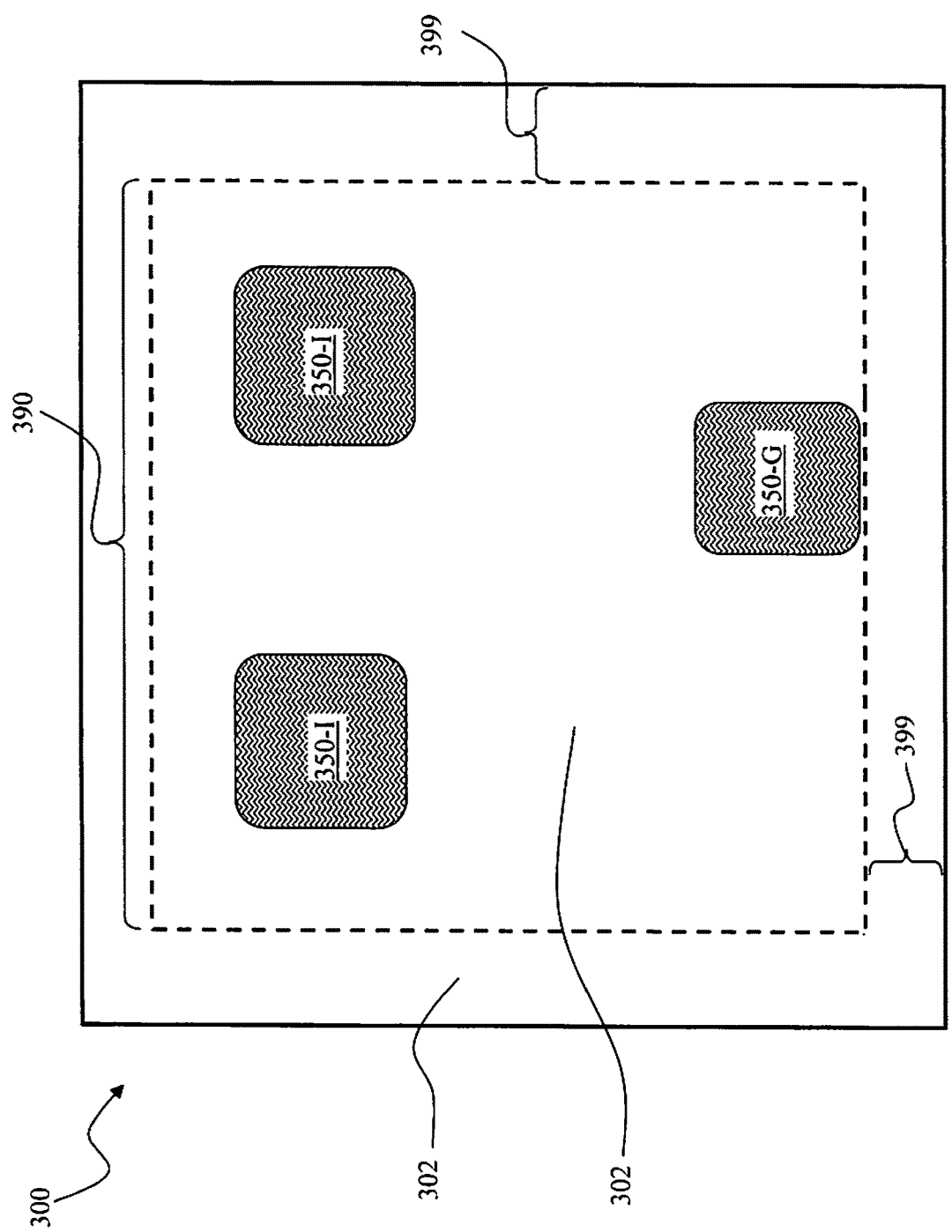

FIG. 4 shows an alternative configuration of a unit cell 301 having charge balanced alternating N and P nano tubes 315-N and 315-P surrounded by N-pillars 310, having a dielectric gap-filling layer 320 in the center supported on a N+F substrate 305. There is also an N+ diffusion bottom region 305-B and N+ diffusion column region 305-C over the substrate 305. This simplified nano tube configuration may be simpler to manufacture than those shown above. By way of example, the widths and dopant concentrations of the N and P nano tubes 315-N and 315-P and the N-pillars 310 are shown in the FIG. 4. The nano tubes and the pillars are charge balanced for the embodiments shown in FIG. 4, and also for the embodiments shown in FIGS. 2 through 3. FIG. 4A shows the active area 390 of a semiconductor power device 300 using the nano tube unit cell 301 configuration of FIG. 4. In this example the power device 300 is a trench MOSFET (similar to that in FIG. 2I) located. The trench MOSFET is formed with a trench polysilicon gate 350 padded by a gate oxide layer 355 extended along an orientation that is ninety degrees from the P and N type columns 315-P and 315-N with P− body regions 360 encompassing N+ source regions 370 and having a P+ body contact region 380 formed near the top surface between the source regions 370. N+ substrate 305 acts as the drain.

Figure 6:
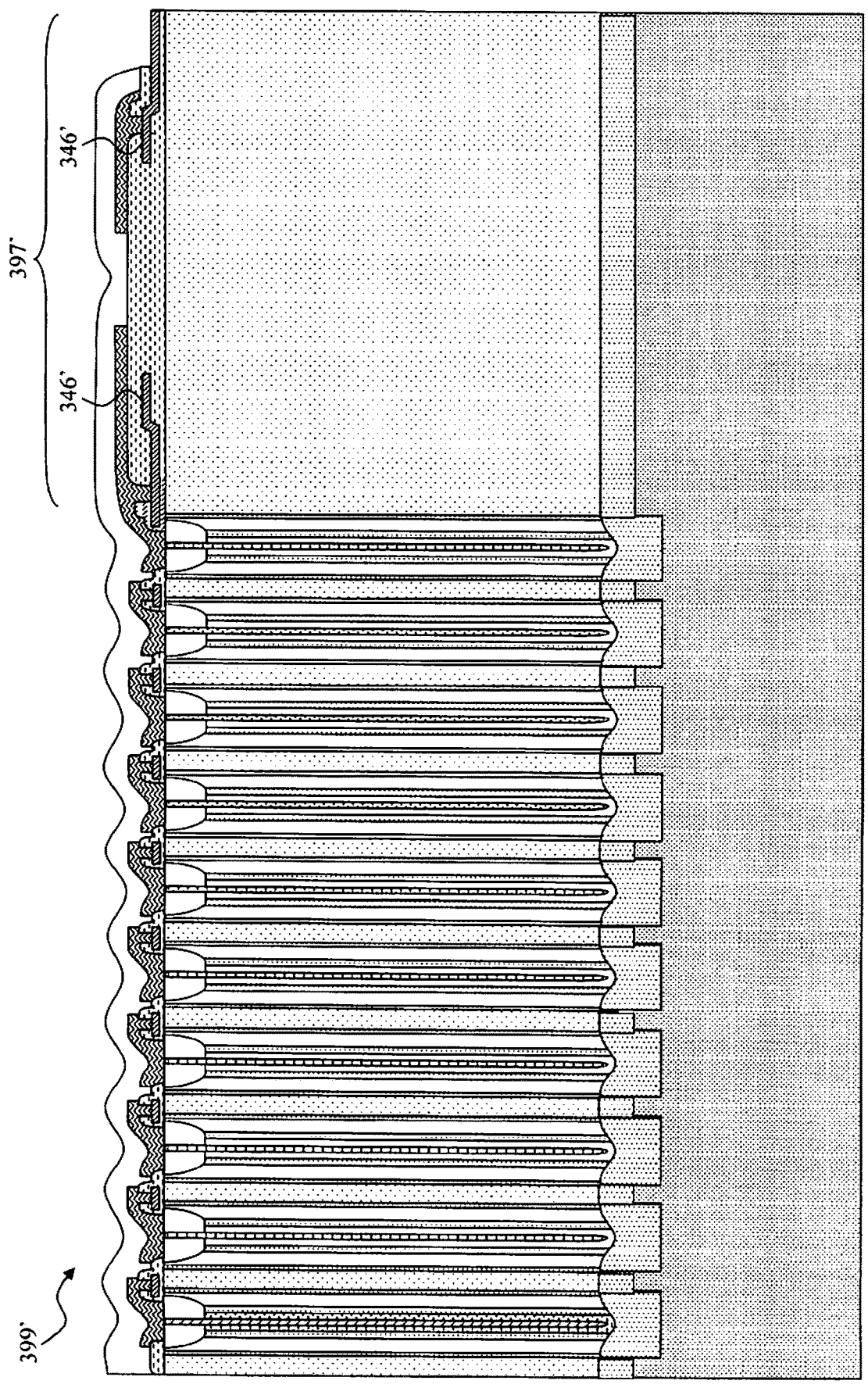
FIG. 6 is cross sectional view of a termination area similar to that shown in FIG. 5 with alternative field plate design in the final termination structure.

Referring to FIGS. 4A-1 through FIG. 6 for the configuration of a termination area 399 of a semiconductor power device 300 that is specifically implemented in this exemplary embodiment as a MOSFET. FIG. 4A-1 shows a top view of the layout of semiconductor device 300. The active area 390 occupies the middle portion of the power device 300. Within the active area 390 are the portions of source metal 350-I, and gate metal 350-G forming the source pads and gate pad. Other portions of the power device 300 may be covered with a passivation layer 302. Outside of the active area is the termination area 399. The termination area 399 forms a ring around the active area, near the edges of the power device 300. The drain is on the bottom side and is not visible from the top.

Figure 4B:
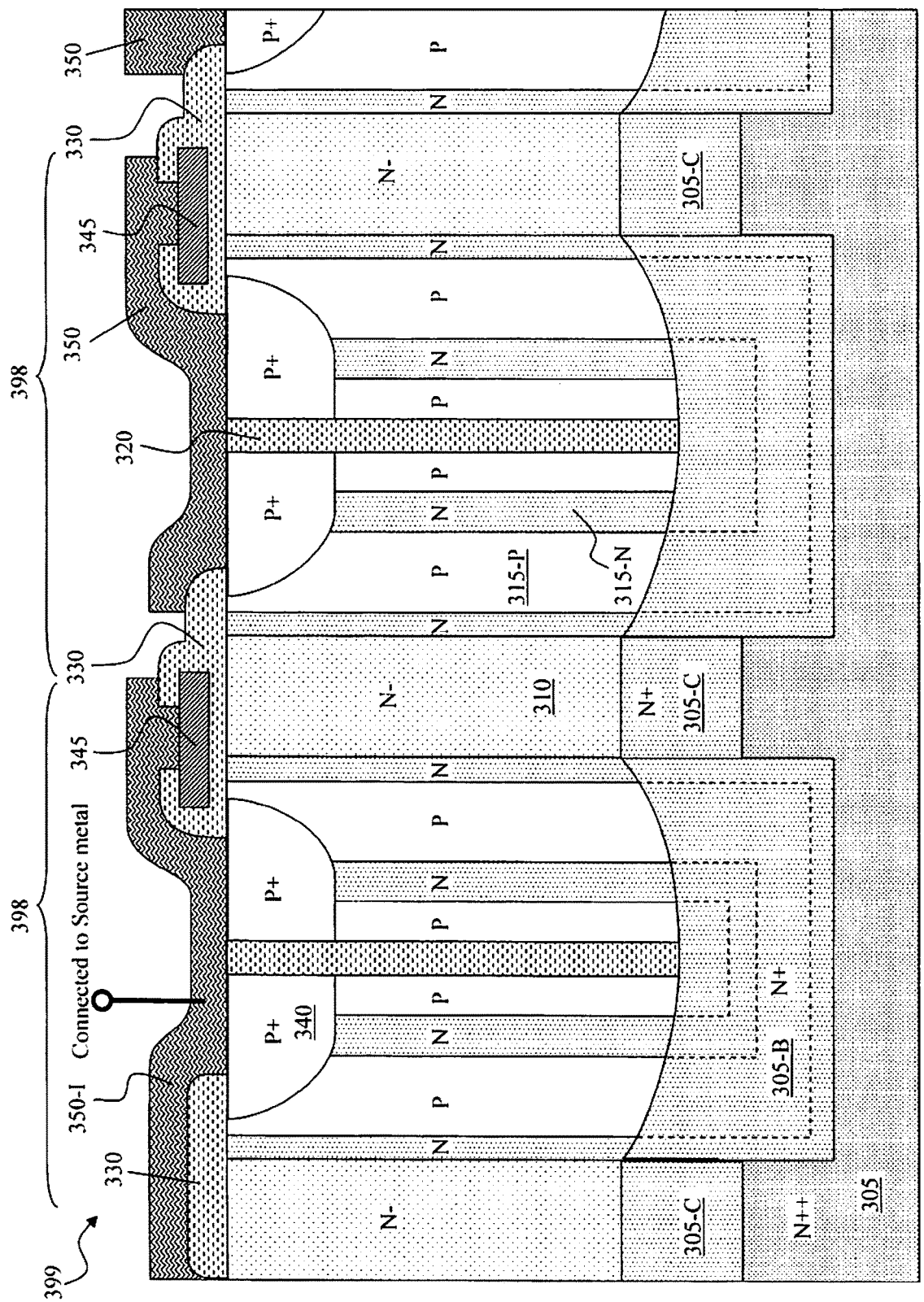
FIG. 4B shows a close-up cross sectional view of a termination area of a semiconductor power device 300 implemented with the vertical nano-tubes structure as that described in FIG. 4.

FIG. 4B shows a close-up cross sectional view of a termination area 399 of the semiconductor power device 300 of FIG. 4A-1 implemented with the vertical nano-tubes structure as that described in FIGS. 4 to 4A above to achieve a high breakdown voltage for the semiconductor power device 300. The nano tubes are still charge balanced to achieve the high breakdown voltage. The passivation layer is not shown in FIG. 4B for simplicity. FIG. 4B shows the cross section of the beginning of the termination region. The semiconductor power device 300 is supported on a heavily doped N type substrate shown as a red phosphorous substrate N++ layer 305. The bottom of the nano-tube structure further includes an N+ diffusion layer 305-B and the bottom of the N-pillars 310 have an N+ column diffusion layer 305-C which may be formed by a diffusion process of the N++× red phosphorous substrate 305 as described above. The semiconductor power device further includes a plurality of N-type thin epitaxial layers 315-N and P-type thin epitaxial layers 315-P. These nano-tubes are formed as alternating N-epitaxial layers 315-N immediately next to a P-epitaxial layer 315-P between N-type pillars 310 as vertical nano-tubes extended from a top surface of the substrate covered by an oxide insulation layer 330 to the bottom N+ region 305-B and N+ substrate 305. The nano-tube structure further includes a central gap fill (lightly doped silicon or a dielectric) 320 formed substantially in the center between the N-type and P-type nano tubes 315-N and 315-P. The semiconductor power device 300 further includes P− body regions 340 formed on the top portion of the nano-tube structure. The semiconductor power device 300 further includes a plurality of polysilicon field plates 345 electrically connected to the P+− regions 340 via a top metal layer 350 with the innermost metal layer 350-I also electrically connected to a source region of the semiconductor power device and the other metal layers 350 function as floating metals. The P+ regions 340 short together the P-type nano tubes 315-P. The innermost metal layer 350-I is generally implemented to operate at a zero volt, while as an exemplary embodiment; each successive floating metal layer 350 may be implemented to sustain a voltage of approximately fifty volts. Each nano tube termination group forms a ring 398 around the active area 390. Two such groups and the beginning of a third are shown in FIG. 4B. The basic structure of each nano tube group (not including the P+ region 340, oxide 330, polysilicon field plate 345, and floating metal 350) is the same as those of the unit cells 301 in the active area 390, and are formed at the same time.

Figure 5:
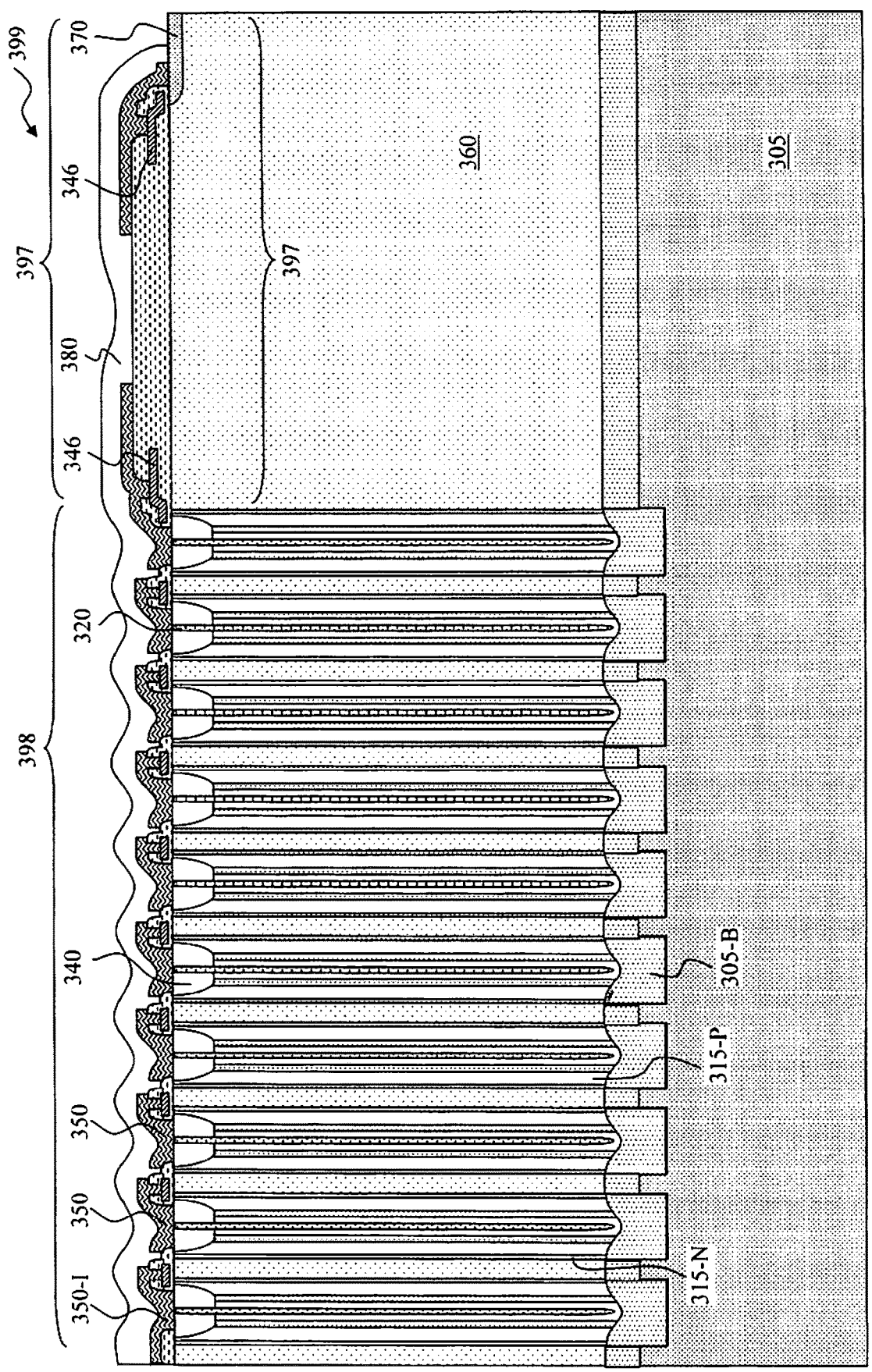
FIG. 5 is a cross sectional view to illustrate the entire termination area 399 of a semiconductor power device implemented with the nano-tube structure shown in FIGS. 4 to 4B.

FIG. 5 is a cross sectional view to illustrate the entire termination area 399 of a semiconductor power device 300 implemented with the nano-tube structure shown in FIGS. 4 to 4B. By increasing the number of the nano tube super-junction rings 398 and by adjusting the dopant concentrations of the N-region 360 and the voltage of the field plates 345, and the 2 step field plates 346. After the last field ring, a final termination structure 397 is formed including 2 step field plates 346 formed to reduce the surface field by using polysilicon and metal combination; also field plates region 346 are formed and electrically connected to Scribe line (where sawing will take place) to stop depletion reaching to die edge after the sawing. There is also an N+ channel stop 370 at the die edge. The termination area 399 is able to sustain a break down voltage up to 760 volts with ten rings of the nano-tube super junction structures as shown in FIG. 5 and the final 2 step field plates 346 edge structure. A passivation layer 380 is shown covering most of the termination area 399.

FIG. 6 is cross sectional view of a termination area 399' with alternative field plate design in the final termination structure 397'; three steps instead of two steps for forming field plates 346' (instead of 346) as that described for FIG. 5. These field plates 346' are formed by combination of thermally grown oxide layers, polysilicon, deposited oxide (borophosphosilicate glass (BPSG) or tetraethyl orthosilicate (TEOS)) and metal layers, and may be more capable than the final termination structure 397 of FIG. 5, but requires and extra step to make.

Figure 6A:
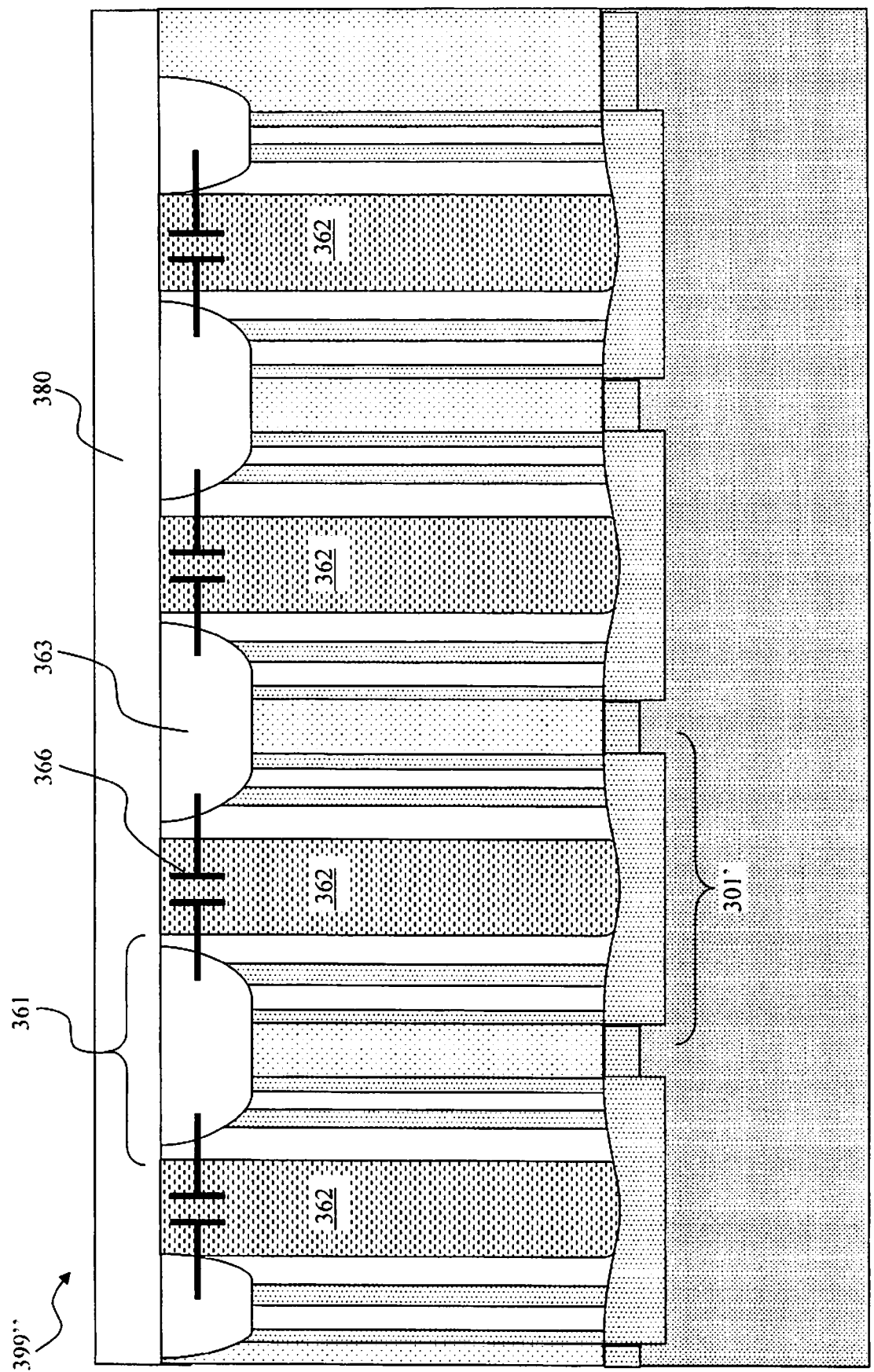
FIG. 6A is a cross section view of an alternative termination area 399" configuration.

FIG. 6A is a cross sectional view of an alternative termination structure 399". This structure is formed by using wider trenches (wider than active area trenches) to leave wide gaps after the epi growth process. Unit cells 301' are formed in the trenches, which are similar in structure to the unit cells 301 (FIG. 4) of the active area, and may be formed at the same time using the same steps, but have a wider gap in the middle. Pillars and adjacent nano tubes form silicon island rings 361 surrounded with 2-5 microns gaps substantially filled with a dielectric material 362 and having floating P-regions 363 at the top surfaces. The floating P-regions bridge the p-type nano tubes across the n type nano tubes and pillars.

These silicon island rings 361 separated by dielectric material 362 constitute a floating capacitor 366 network which divides the voltage amongst the floating P-regions 363 based on their equivalent capacitance values. In another words, high voltage termination for this invention can be implemented by using trench capacitors 366 separated by silicon side wall electrodes. By way of example the wide gaps 362 can be filled with oxide and silicon Oxide with Poly Silicon mixture(SIPOS) to reduce stress from thick SiO2 thus prevent cracking. Termination trenches can be formed after the MOSFET/active device processing before metallization by etching and epitaxial filling or as part of active area trench etch and epi fill process.

Although the termination regions 399 and 399' of FIGS. 4B-6 use the nano tube unit cell 301 configuration of FIG. 4, the same principle can be applied to other charge balanced nano tube configurations such as the ones disclosed in FIGS. 2 through 3.

Figure 7A:
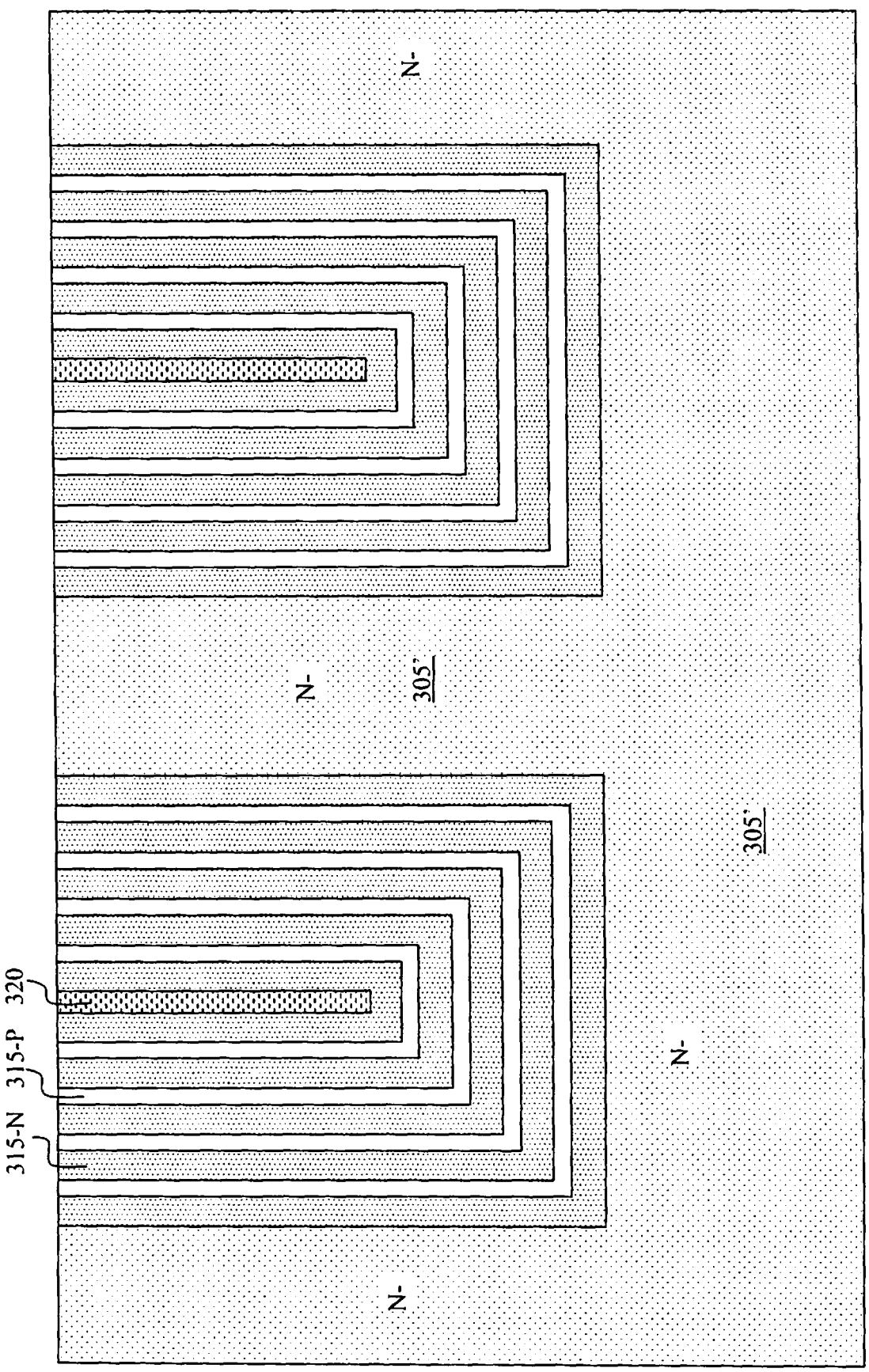
FIGS. 7A to 7E are a serial of cross sectional views for illustrating alternate manufacturing processes for making a semiconductor power device of this invention.
Figure 7B:
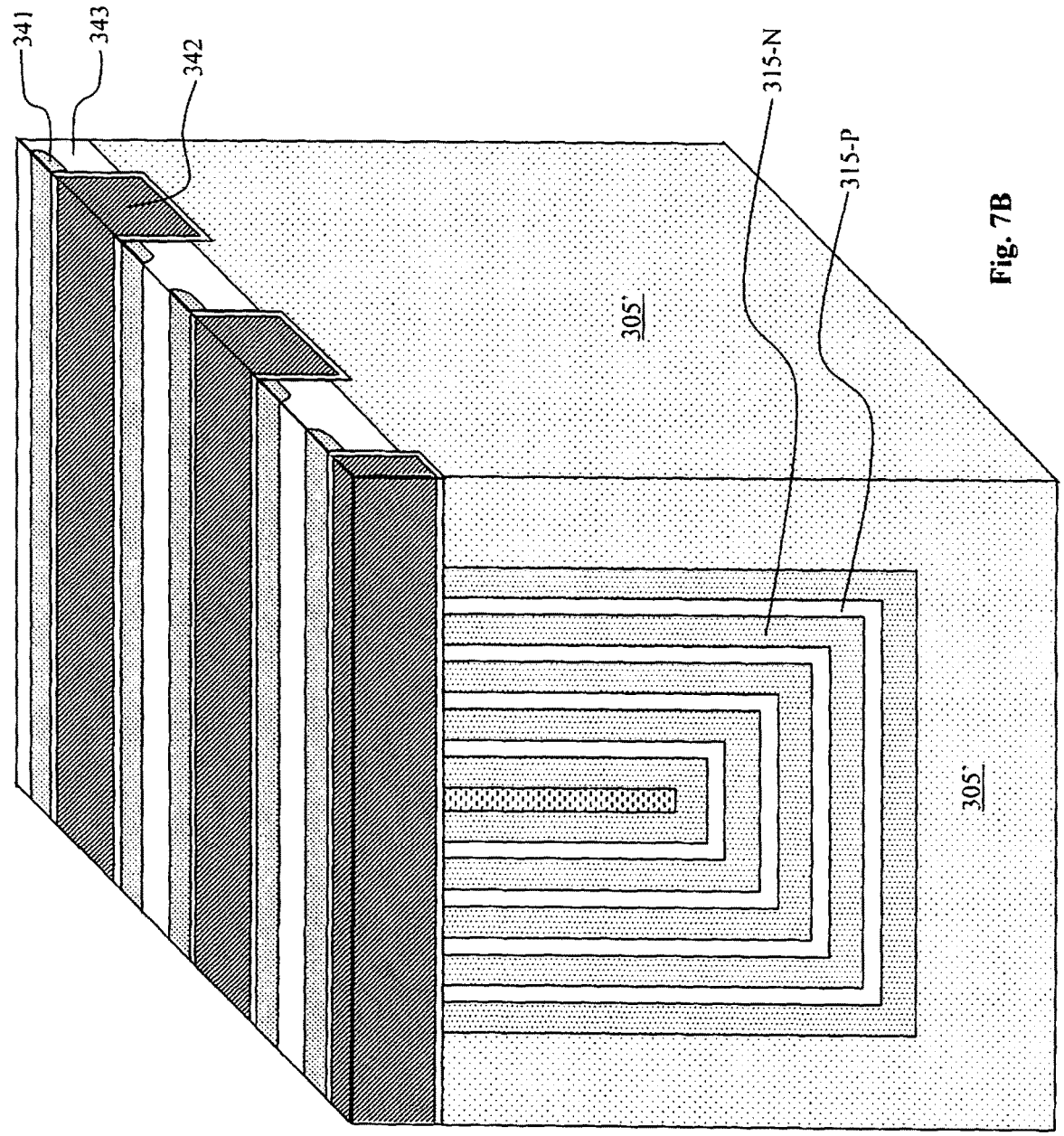
Figures 1, 7B:
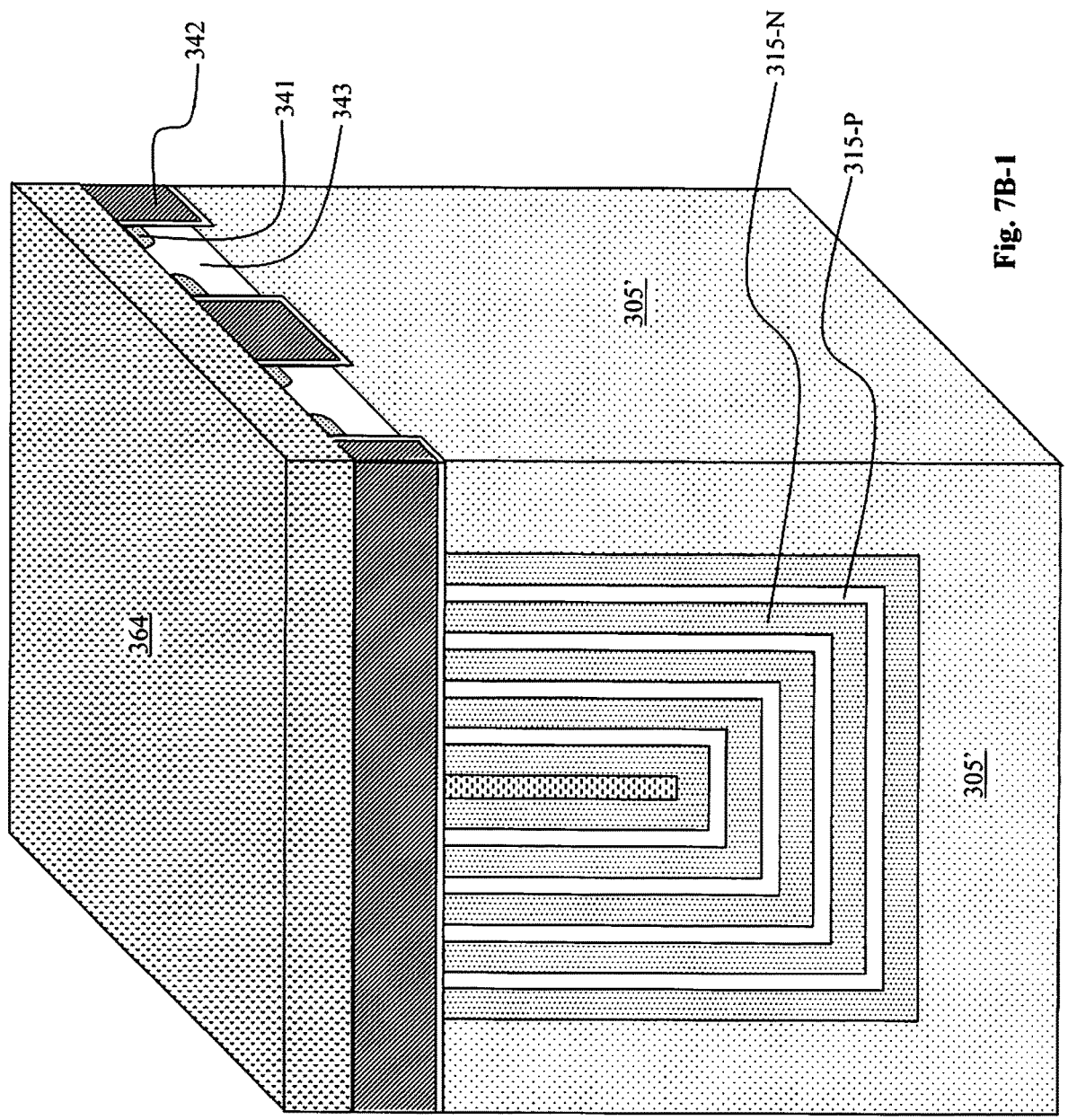
Figure 7C:
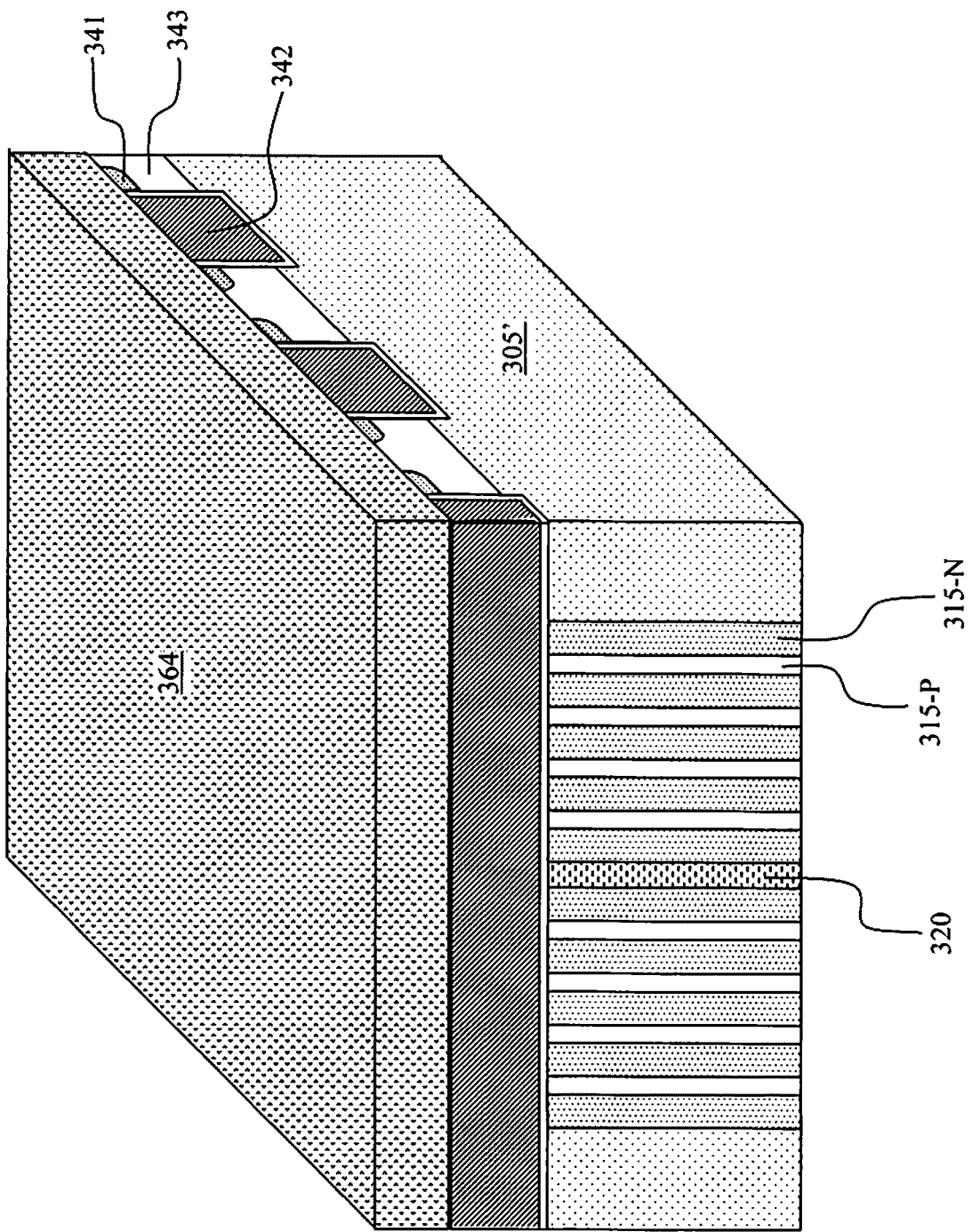
Figure 7D:
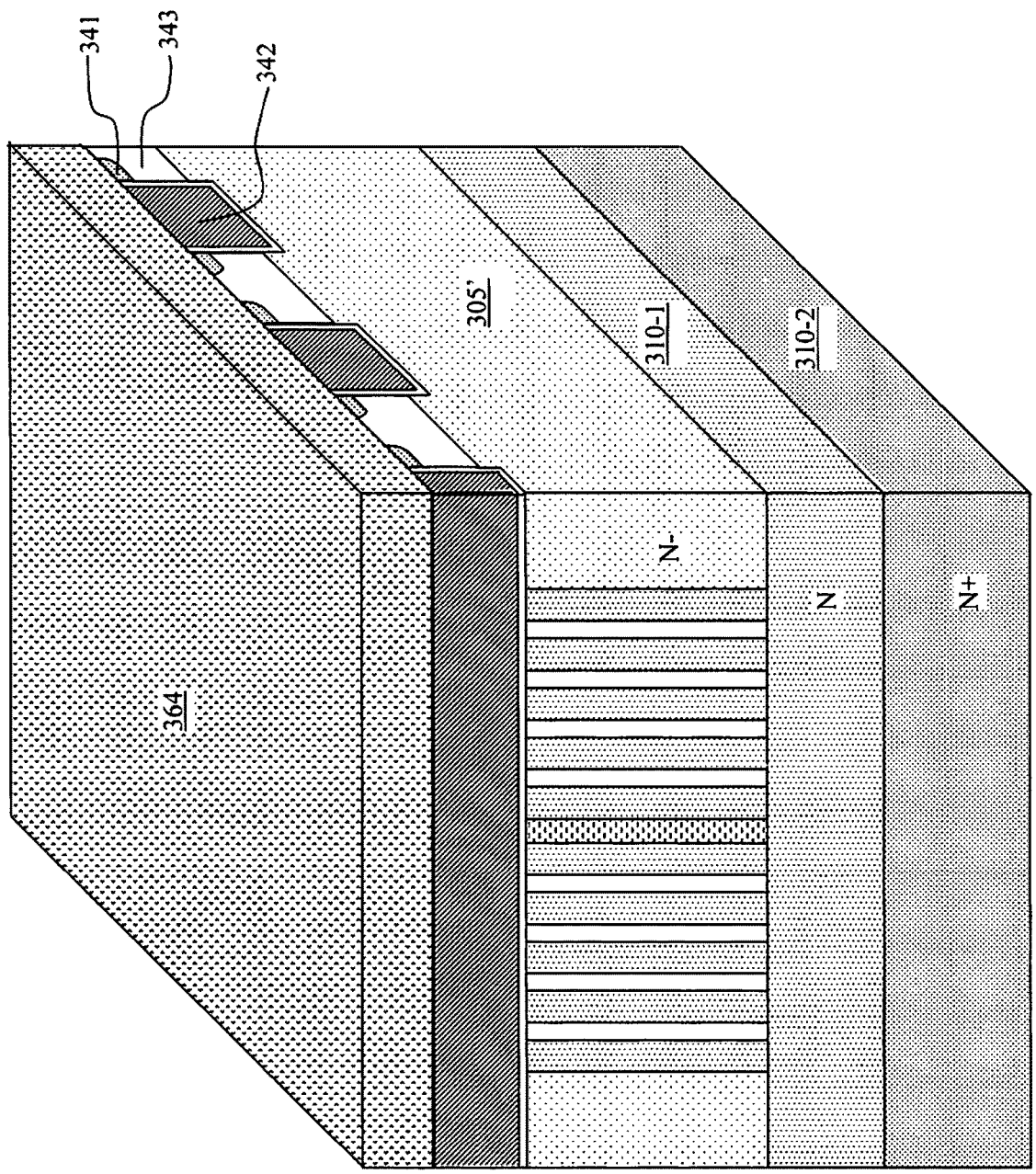
Figure 7E:
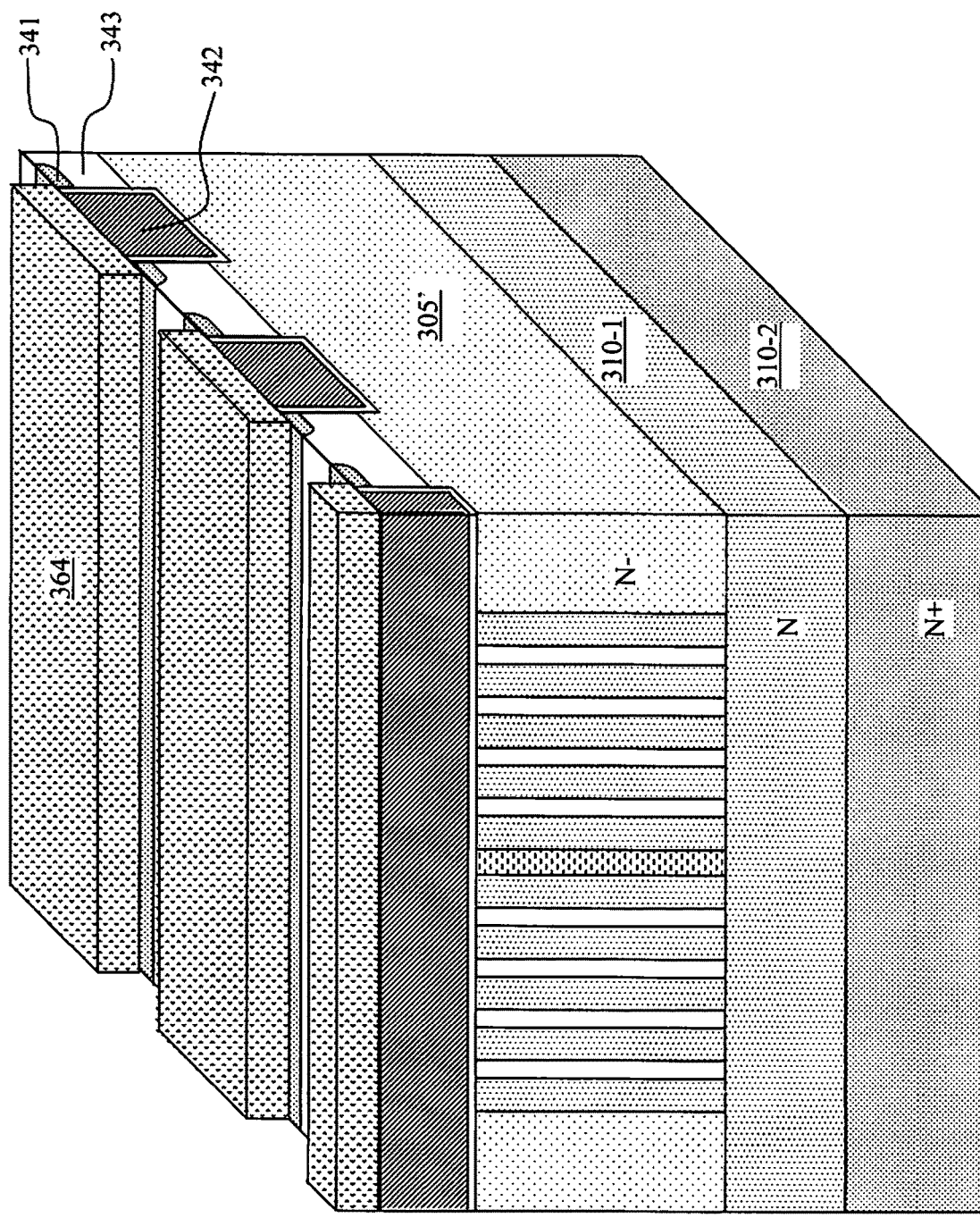

FIGS. 7A to 7D are a serial of cross sectional views for illustrating alternate manufacturing processes for making a semiconductor power device of this invention. The nano-tubes comprising N-columns 315-N and P-columns 315-P are formed in a single, lightly doped N-type silicon substrate 305' without an epitaxial layer. This structure is similar to that seen in FIGS. 2 through 3, but without an initial epitaxial layer to form the pillars. Instead the nano tubes are formed in a lightly doped single crystal substrate. In FIG. 7B, MOSFET cells are formed on the top surface with body regions 343 encompassing source regions 341 surrounding the trench gates 342. In FIG. 7B-1 a dielectric layer 364 (BPSG or TEOS) is deposited to protect the top surface during the subsequent process steps such as backside grinding. In FIG. 7C, the bottom of the substrate 305 is ground off. In FIG. 7D, N and N+ regions 310-1 and 310-2 are implanted, deposited or epitaxially grown at the bottom of the substrate 305. The N region 310-1 merges the bottoms of the nano-tubes and pillars together and is the nano tube merger region. If the layers are not highly doped, growing works better. For supporting an IGBT device as shown in FIG. 2F, the regions 310-1 and 310-2 can be formed as an N-buffer and P+ layer, respectively. After the backside N++ layer for MOSFETs (N-buffer and P+ layers for IGBT), the top surface dielectric layer 364 may be patterned as shown in FIG. 7E, and the rest of the top side processes (e.g., metal, passivation) may be completed. Alternatively, if the backside processes may be performed at a low enough temperature, the top side processes may be completed before performing the backside processes.

Figure 8A:
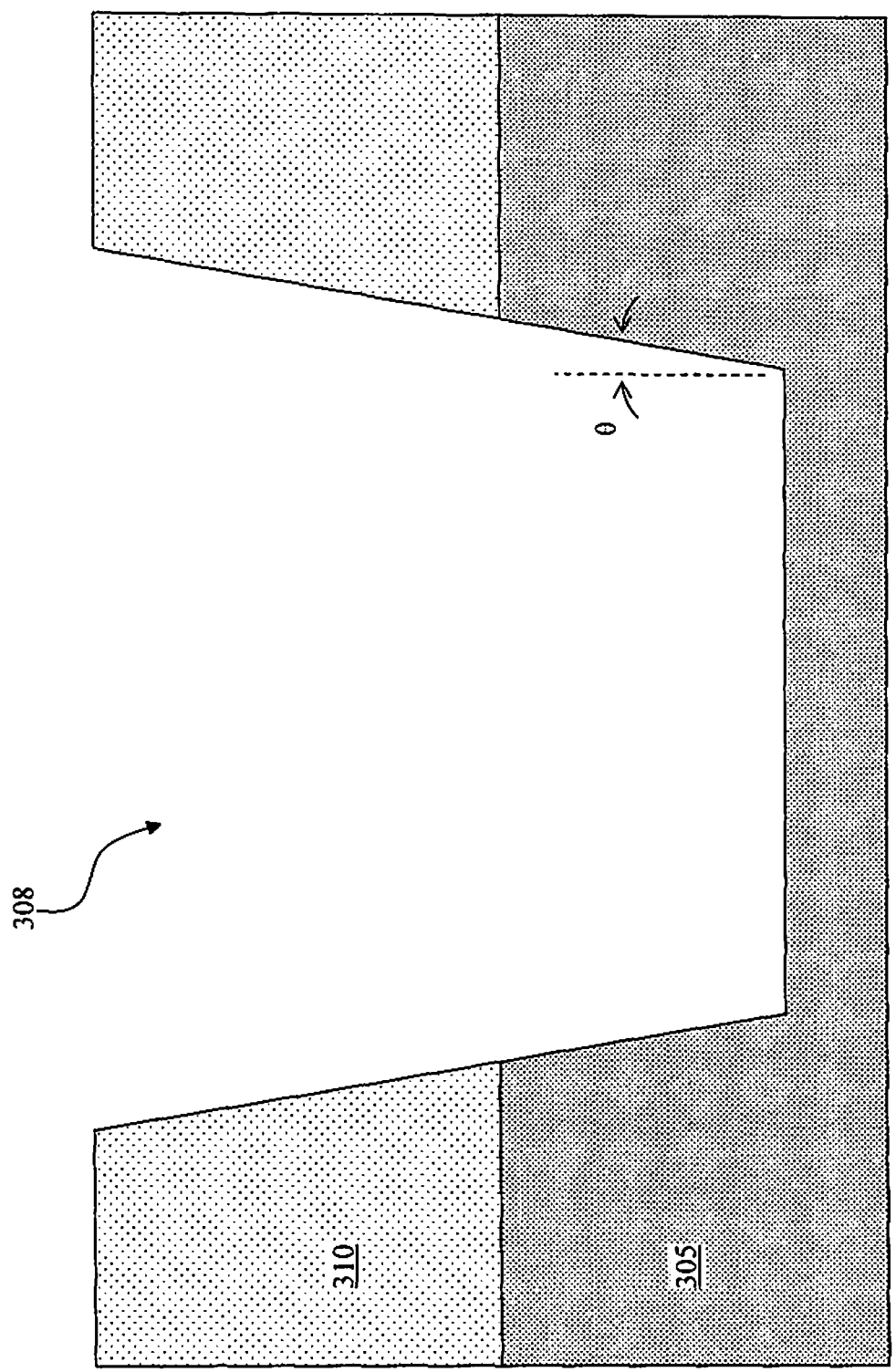
FIGS. 8A to 8G are a serial of cross sectional views for the manufacturing processes to resolve the difficulties of void formation during a gap filling process.
Figure 8B:
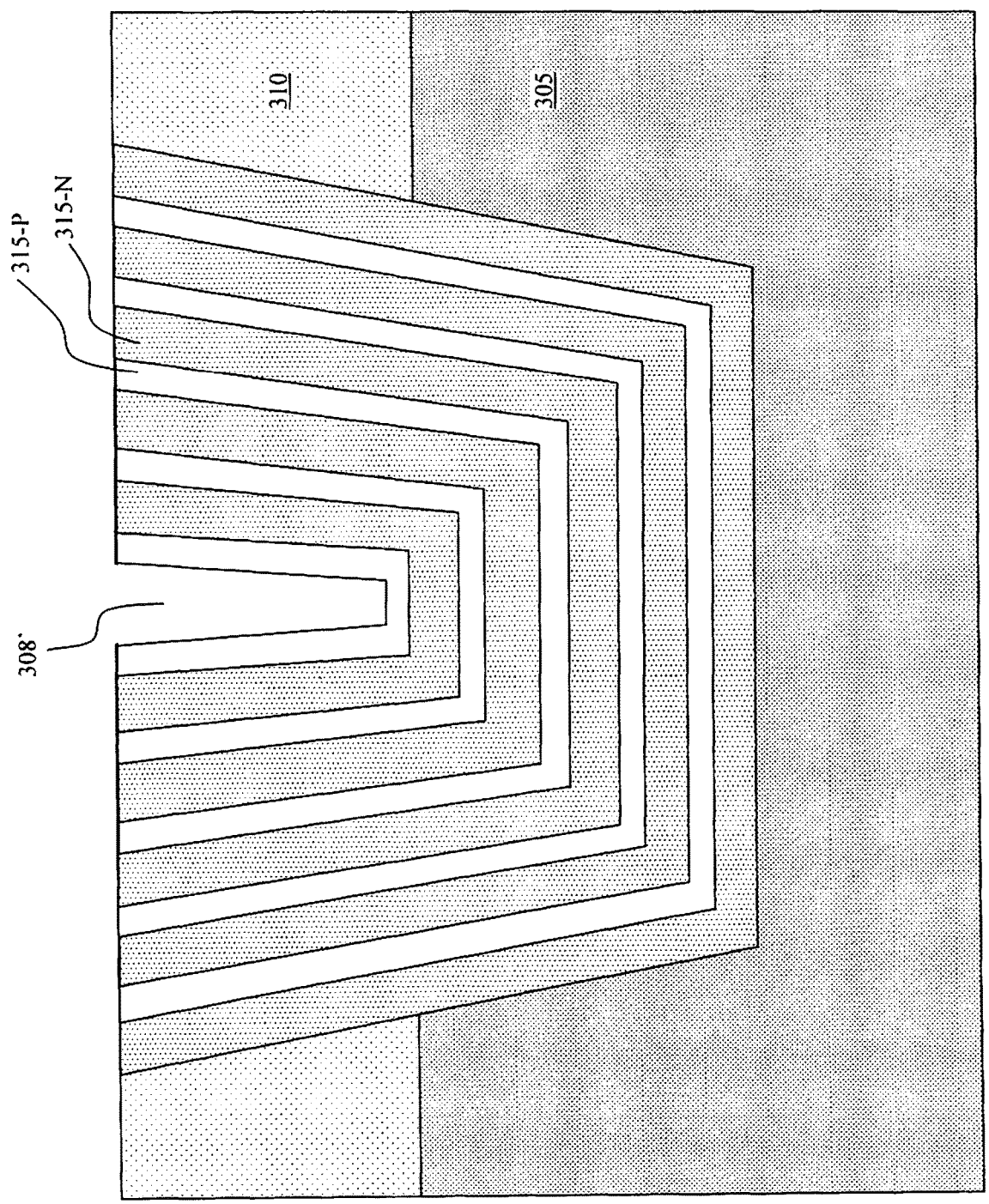
Figure 8C:
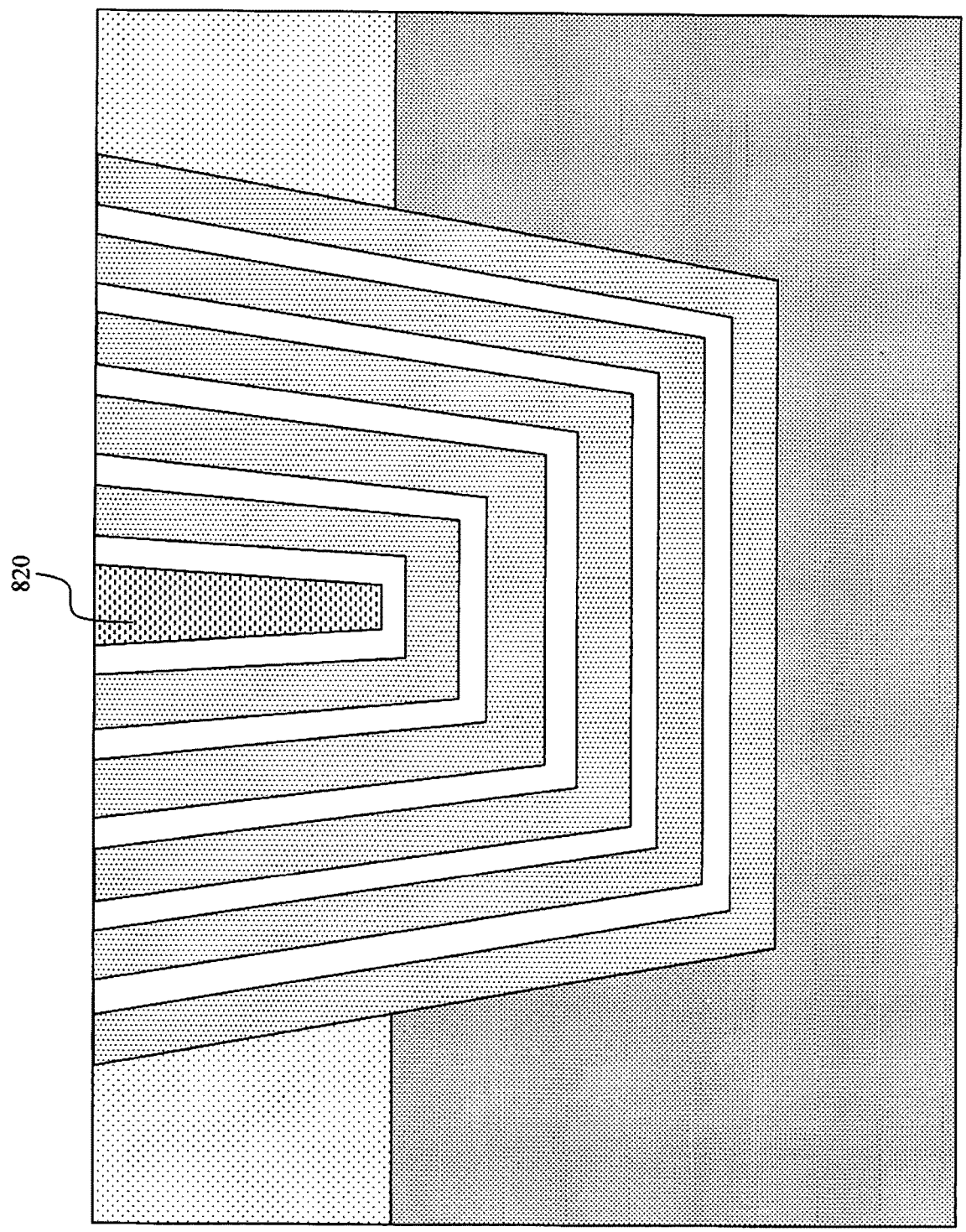
Figure 8D:
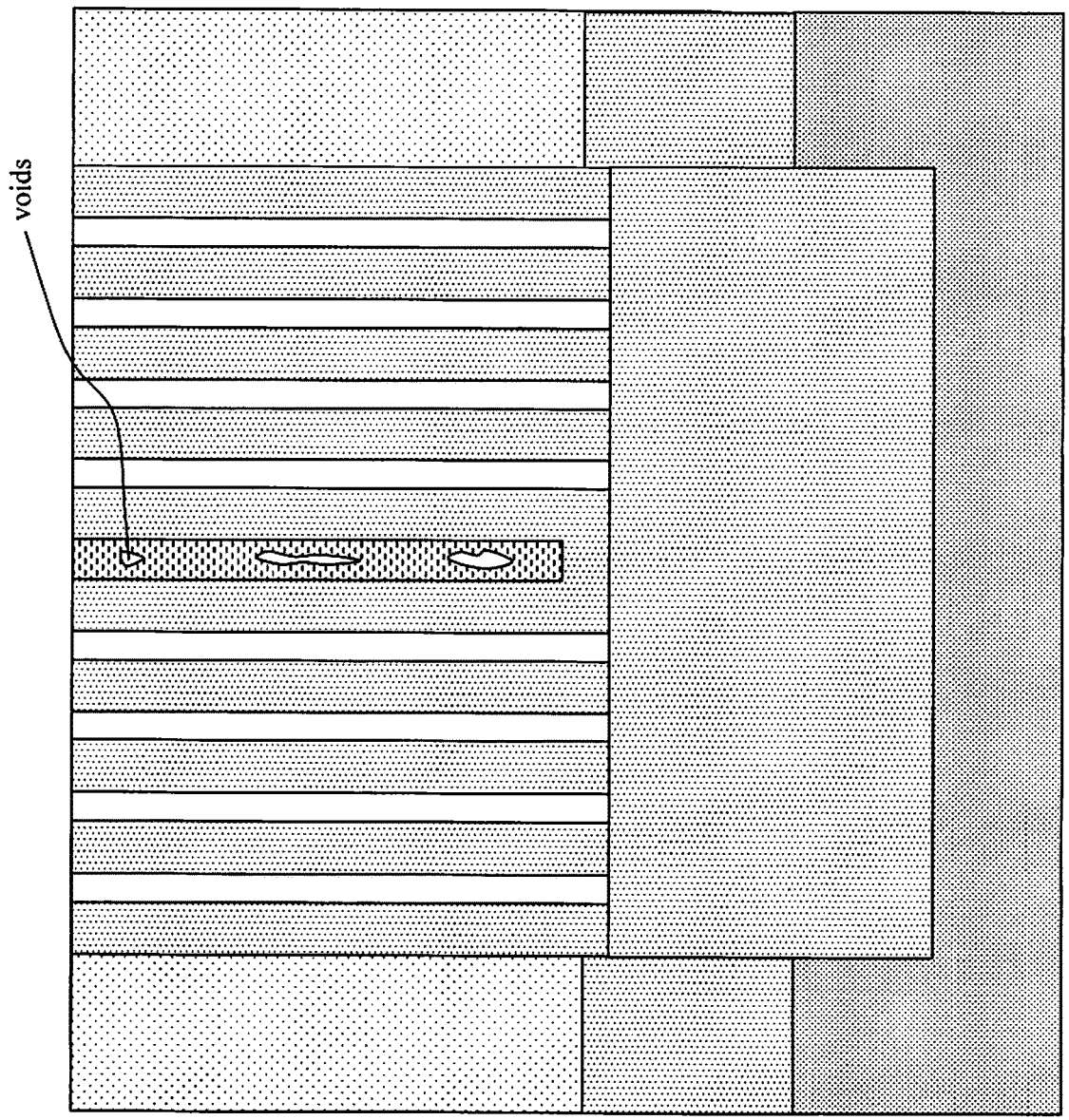

FIGS. 8A to 8C are a serial of cross sectional views for the manufacturing processes to resolve the difficulties of void formation during a gap filling process. In FIG. 8A, the trenches 308 are formed in an N-epitaxial layer 310 over an N++ substrate 305 with a large tilt angle θ with respect to the vertical axis. By way of example the tilt angle θ may be 2-5 degrees (85-88 degrees measured relative to the bottom surface of the trenches 308). In FIG. 8B, a plurality of N-doped epitaxial layers 315-N and P-doped epitaxial layers 315-P are grown covering the sidewalls and bottom surface of the trenches 308. A middle portion remains with angular gap 308'. The top portions of the epitaxial layers, which will soon be removed by CMP process is not shown for simplicity. In FIG. 8C, the middle gap 308' is filled with a gap fill layer 320 which can be oxide or intrinsic silicon or other types of dielectric material. The gap filling process can be more conveniently carried out because of the tilt angular configuration thus resolving the difficulties of void formation when filling the gap between the doped nano-tubes. FIG. 8D illustrates a potential void formation problem for the gap filling process if the sidewalls are too vertical; this problem is compounded when the gap is narrow.

Figure 8E:
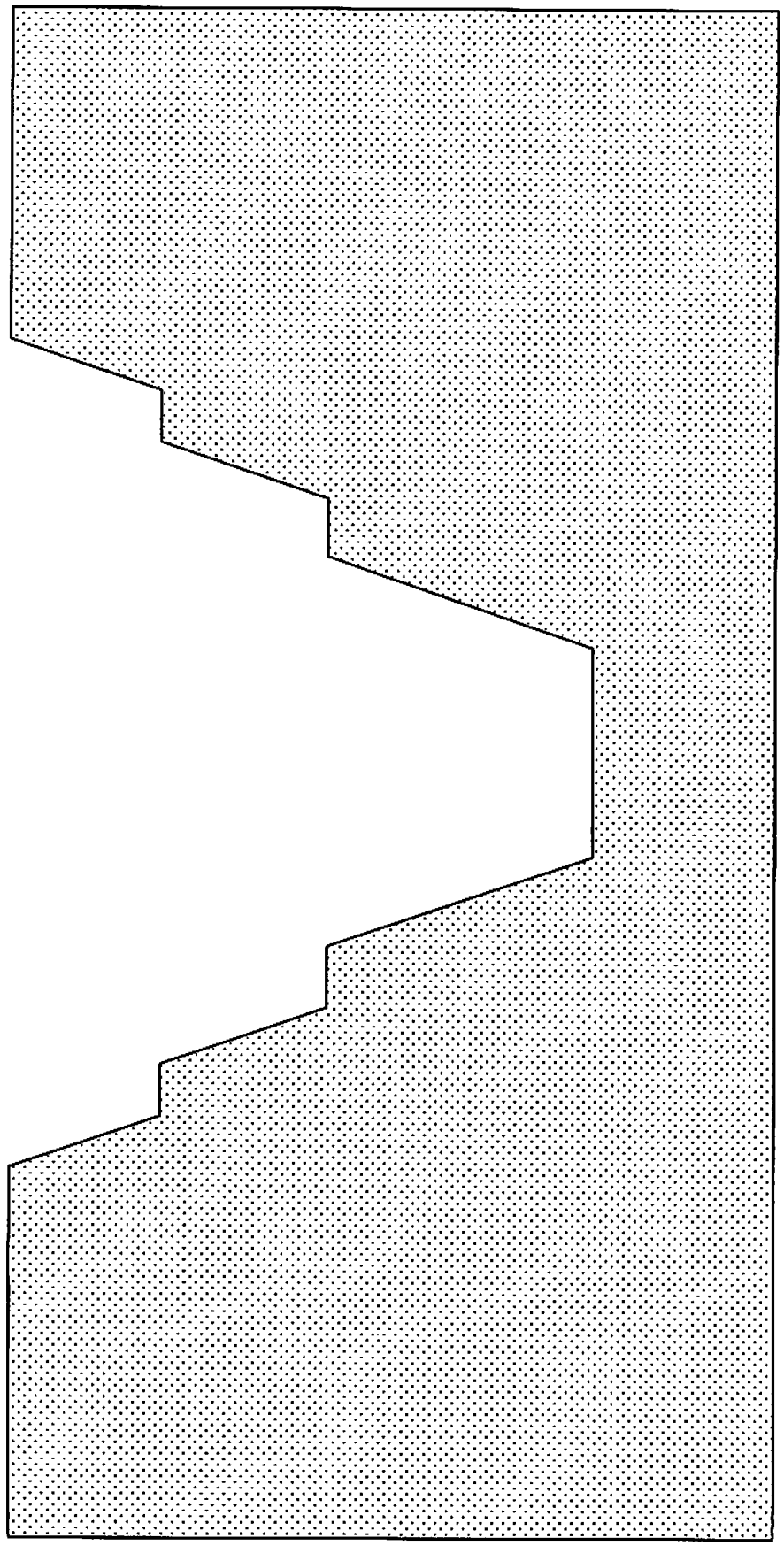
Figure 8F:
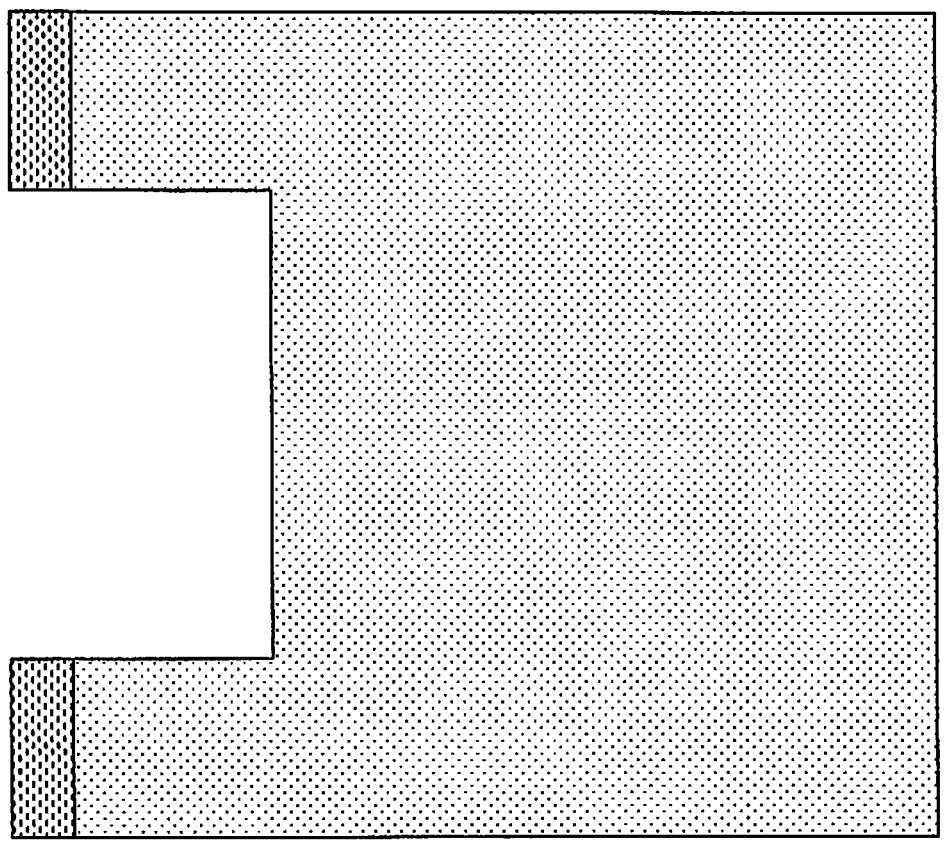
Figure 8G:
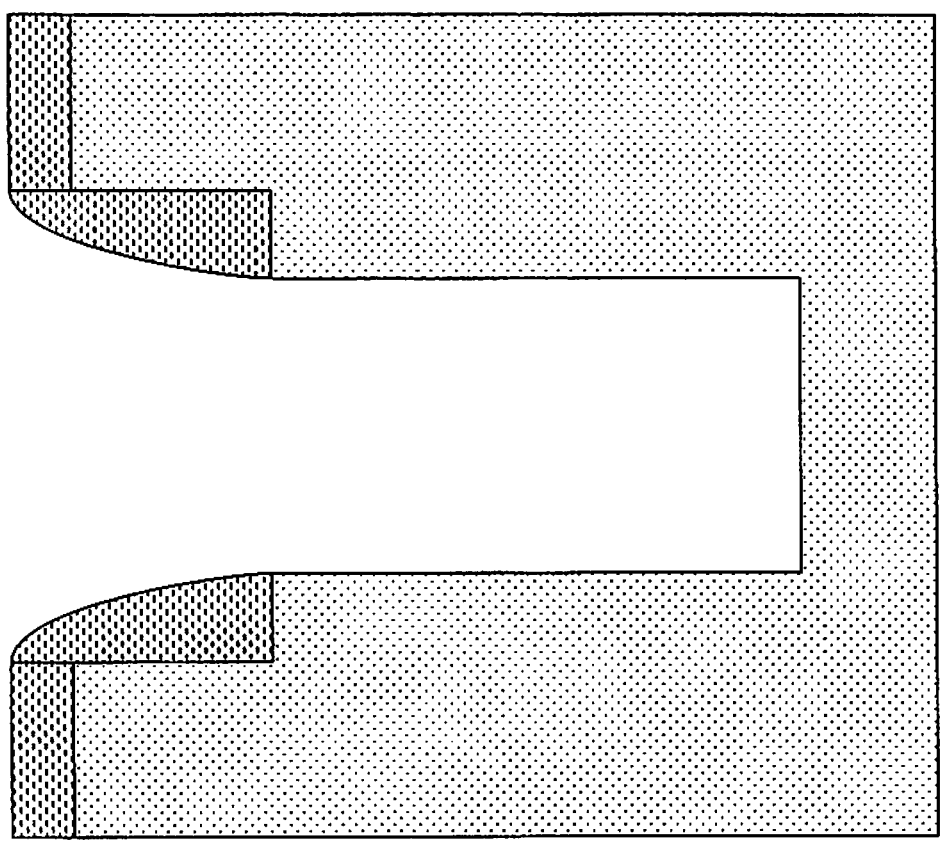

FIGS. 8E-8G show alternative embodiments of the present invention by using trenches and pillars with varying widths to improve the gap filling process after the epi growth. In FIG. 8E, the trench has an angle plus steps to vary the width of the trench. In this case, the tilt angle θ of the trench does not need to be as large. The trench might even be vertical, with steps to change the width of the trench, and ease the gap filling process. Trench width can be modified step by step by using a trench etch step combined with spacer as shown in FIGS. 8F-8G. In FIG. 8F, part of the trench is etched. In FIG. 8G, spacers are formed on the sidewalls and another portion of the trench is etched to form a step in the trench. By way of example, one third of the depth of the trench may be first etched, and then a spacer may be formed in the range of 0.1 to 1 micron thickness. Then using spacer the rest of the trench may be etched to form a two-step pillar (and trench). By adding one more spacer and etch process, a pillar with three different widths may be formed. The spacer may be formed from an oxide, nitride, or a combination of the two (ot an equivalent material).

FIG. 9A is a top view for showing the closed cell configuration that includes a plurality of the nano tube unit cells 401 in an active area 490 disposed substantially in the middle portion of a semiconductor substrate. Each nano tube unit cell 401 comprises concentric alternating rings of N and P type columns 415-N and 415-P surrounded by N-type pillars 410, and with a gap filler 420 in the center. The cross section configuration of the unit cell 401 is similar to that of unit cell 301 in FIG. 4. The substrate is formed with a plurality of nano-tubes filling in a plurality of trenches opened in the substrate/epitaxial layer as shown in FIGS. 2 through 8 above. The unit cells may take various shapes and orientations within a semiconductor die, but the overall width 'w' of the nanotubes portion of each unit cell should remain relatively the same within the same semiconductor die. The width of the pillar regions 410 may be more flexible if it is lowly doped since it will not affect the charge balance very much. The semiconductor power device further includes a termination area 499 (not to scale) that forms a ring around the active area 490 out to the die edge 491 and has a plurality of nano-tube columns to support high voltage applications as that illustrated in FIGS. 4 through 6 above. This figure is not to scale, but only gives an idea as to the relative positions of the various structures. The detailed structure of the termination area is also not shown in FIG. 9A, but may be similar to the termination area 399, 399' in FIGS. 4-6.

FIG. 9B-1 shows a top view for showing a first termination ring 498 of the termination area 499 of a semiconductor device. The termination ring has a similar basic structure as the unit cells 401. The termination ring 498 can be seen circling the active area 490. The rest of the termination rings 498 are out of the boundaries of FIG. 9B-1. FIG. 9B shows an alternative staggered rectangular shape for the unit cells 401 in the active area. FIG. 9C shows an alternative hexagonal shape for the unit cells 401.

Although the present invention has been described in terms of the presently preferred embodiment, it is to be understood that such disclosure is not to be interpreted as limiting. For example, though the above describes an n-channel device, this invention can be applied to p-channel devices as well simply by reversing the conductivity types of the doped regions. For example, the substrate and the nano tube merger regions may be P-type rather than N-type. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A metal oxide semiconductor field effect transistor (MOSFET) comprising:
   a semiconductor substrate having a plurality of trenches opened from a top surface;
   wherein every two adjacent trenches are separated by a volume of said semiconductor substrate constituting a pillar having a pillar conductivity type;
   all sidewalls of each of said trenches are covered by a plurality of epitaxial layers of alternating conductivity types disposed on two opposite sides and substantially symmetrical to a central gap-filler layer disposed between two innermost epitaxial layers is a dielectric layer having a width substantially the same as said plurality of epitaxial layers of alternating conductivity types and significantly smaller than said pillar, and wherein said epitaxial layers of said alternating conductivity types constituting nano tubes functioning as conducting channels extending along a sidewall direction of each of said trenches; and
   a body region encompassing source region surrounding a gate of the MOSFET disposed near a top surface of the pillar comprising the volume of the semiconductor substrate for conducting a current through the nano tubes to a drain region disposed on the bottom of the semiconductor substrate.

2. The MOSFET of claim 1 wherein:
said epitaxial layers of the alternating conductivity types in each of said trenches further include an outermost epitaxial layer covers directly on sidewalls of said trenches wherein said outmost epitaxial layer having an opposite conductivity type from said pillar conductivity type; and wherein the nano tubes, and the pillars are substantially charge balanced.

3. The MOSFET of claim 1 wherein:
said pillars between two adjacent trenches with sidewalls covering by said epitaxial layers of the alternating conductivity types have a width approximately half to one-fourth of a width of said trenches and significantly greater than the width of said epitaxial layer of said alternating conductivity and said central gap-filler layer.

4. The MOSFET of claim 1 wherein:
said plurality of trenches each having a width of about ten microns and said plurality of trenches are separated by a said pillar from adjacent trenches wherein said pillar having a width ranging substantially between two to five microns.

5. The MOSFET of claim 1 wherein:
said plurality of trenches each having a width of about ten microns with the sidewalls covered by the epitaxial layers of alternating conductivity types constituting said nano tubes having a layer thickness ranging substantially between about 0.2 to 2 microns and wherein said central gap-filler layer having a layer thickness substantially in a same range as said epitaxial layers of alternating conductivity types.

6. The MOSFET of claim 1 wherein:
said plurality of trenches each having a trench depth ranging substantially between 5 to 120 micrometers.

7. The MOSFET of claim 1 wherein:
said semiconductor substrate further comprising a nano tube merger region comprises a doped layer is disposed below said trenches having sidewalls covered by said nano tubes and below said pillars between said trenches and extended laterally across the semiconductor substrate.

8. The MOSFET of claim 1 wherein:
the sidewalls of said plurality of trenches having a slightly tilted angle relative to a vertical perpendicular direction relative to a bottom surface of said semiconductor substrate.

9. The MOSFET of claim 1 wherein:
said semiconductor substrate comprising a bottom substrate layer of a first conductivity type and said pillars having a second conductivity type.

10. The MOSFET of claim 1 wherein:
said semiconductor substrate comprising a bottom substrate layer of a first conductivity type and said pillars having a same conductivity type with the conductivity type of said bottom substrate layer.

11. The MOSFET of claim 1 wherein:
the pillars constitute the semiconductor volumes comprising a lightly doped epitaxial layer.

12. The MOSFET of claim 1 wherein:
the pillars constitute the semiconductor volumes comprising volumes of a single crystal semiconductor substrate.

13. A metal oxide semiconductor field effect transistor (MOSFET) comprising:
a semiconductor substrate having a plurality of trenches opened from a top surface having slightly tilt sidewalls having a smaller trench bottom area than a top trench opening area; wherein every two adjacent trenches are separated by a volume of said semiconductor substrate constituting a pillar having a pillar conductivity type;
all sidewalls of each of said trenches are covered by a plurality of epitaxial layers of alternating conductivity types disposed on two opposite sides and substantially symmetrical to a central gap-filler layer disposed between two innermost epitaxial layers of an innermost conductivity type as one of said alternating conductivity types wherein said central gap-filler layer is a dielectric layer having a width substantially the same as said plurality of epitaxial layers of alternating conductivity types and significantly smaller than said pillar, and wherein said epitaxial layers of said alternating conductivity types and said central gap-filler layer constituting nano tubes functioning as conducting channels extending along a sidewall direction of each of said trenches; and a body region encompassing source region surrounding a gate of the MOSFET disposed near a top surface of the pillar comprising the volume of the semiconductor substrate for conducting a current through the nano tubes to a drain region disposed on the bottom of the semiconductor substrate.

14. A metal oxide semiconductor field effect transistor (MOSFET) supported on a semiconductor substrate comprising an active cell area having a plurality of MOSFET transistor cells surrounded by a termination area disposed on a peripheral area of the semiconductor substrate wherein the termination area further comprising:
a plurality of trenches opened from a top surface; wherein every two adjacent trenches are separated by a volume of said semiconductor substrate constituting a pillar having a pillar conductivity type;
all sidewalls of each of said trenches are covered by a plurality of epitaxial layers of alternating conductivity types disposed on two opposite sides and substantially symmetrical to a central gap-filler layer disposed between two innermost epitaxial layers wherein the central gap-filler layer having a width substantially the same as said plurality of epitaxial layers of alternating conductivity types and significantly smaller than said pillar, and wherein said epitaxial layers of said alternating conductivity types constituting nano tubes functioning as conducting channels extending along a sidewall direction of each of said trenches;
a plurality of field plates disposed on top of an insulation layer covering a top surface of the semiconductor substrate wherein each of the field plates is connected a top metal layer segment contacting with the top metal layer segments contact a top surface of a body region through openings of the top insulation wherein the body regions are shorted to the plurality of nano tubes.

15. The MOSFET of claim 14 wherein:
the field plates are conductive polysilicon plates.

16. The MOSFET of claim 14 wherein:
said central gap-filler layer comprises a dielectric layer.

17. The MOSFET of claim 14 wherein:
said central gap-filler layer comprises a lightly doped silicon layer.

18. The MOSFET of claim 14 wherein:
one of the top metal layer segments closest to the active cell area is connected to a source metal of the MOSFET device.

19. The MOSFET of claim 18 wherein:
the top metal layer segments other than the top metal layer segment that is closest to the active cell area are functioning as a floating metal layer.

20. A metal oxide semiconductor field effect transistor (MOSFET) supported on a semiconductor substrate comprising an active cell area having a plurality of MOSFET transistor cells surrounded by a termination area disposed on a peripheral area of the semiconductor substrate wherein:
- a plurality of trenches opened from a top surface in the active cell area and the termination are; wherein every two adjacent trenches are separated by a volume of said semiconductor substrate constituting a pillar having a pillar conductivity type and wherein the trenches opened in the termination area having greater width than the trenches opened in the active cell area;
- all sidewalls of each of said trenches are covered by a plurality of epitaxial layers of alternating conductivity types disposed on two opposite sides and substantially symmetrical to a central gap-filler layer disposed between two innermost epitaxial layers wherein the central gap-filler layer in the active cell area having a width substantially the same as said plurality of epitaxial layers of alternating conductivity types and the central gap-filler layer in the termination area having a width greater than the width of the plurality of epitaxial layers of alternating conductivity types, and wherein the width of the plurality of epitaxial layers of alternating conductivity types is significantly smaller than the pillar, and wherein said epitaxial layers of said alternating conductivity types constituting nano tubes functioning as conducting channels extending along a sidewall direction of each of said trenches; and
- the central gap-filler layer in the termination area is a dielectric layer surrounded body regions and covered by a top passivation layer wherein the body regions surrounding the central gap-filler layer in the termination area are shorted to the plurality of nano tubes and functioning as floating body regions.

* * * * *